US011351503B2

(12) United States Patent
Kamimura et al.

(10) Patent No.: US 11,351,503 B2
(45) **Date of Patent: *Jun. 7, 2022**

(54) CHEMICAL LIQUID PURIFICATION METHOD

(71) Applicant: FUJIFILM Corporation, Tokyo (JP)

(72) Inventors: Tetsuya Kamimura, Haibara-gun (JP); Masahiro Yoshidome, Haibara-gun (JP); Yukihisa Kawada, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 40 days.

This patent is subject to a terminal disclaimer.

(21) Appl. No.: 16/784,976

(22) Filed: Feb. 7, 2020

(65) Prior Publication Data

US 2020/0171434 A1 Jun. 4, 2020

Related U.S. Application Data

(63) Continuation of application No. PCT/JP2018/031868, filed on Aug. 29, 2018.

(30) Foreign Application Priority Data

Aug. 30, 2017 (JP) ............................ JP2017-165637
Aug. 14, 2018 (JP) ............................ JP2018-152638

(51) Int. Cl.
*B01D 61/02* (2006.01)
*B01D 71/32* (2006.01)
*B01D 65/10* (2006.01)

(52) U.S. Cl.
CPC .......... *B01D 61/022* (2013.01); *B01D 65/10* (2013.01); *B01D 71/32* (2013.01);
(Continued)

(58) Field of Classification Search
CPC ........... B01D 2221/14; B01D 2311/14; B01D 2317/02
See application file for complete search history.

(56) References Cited

U.S. PATENT DOCUMENTS

2009/0286178 A1 11/2009 Muroi et al.
2015/0144557 A1 5/2015 Ly et al.

FOREIGN PATENT DOCUMENTS

CN 101223482 A 7/2008
CN 101773786 A 7/2010
(Continued)

OTHER PUBLICATIONS

Hioki Takeshi et al—JP2002099098A Machine Translation—Apr. 5, 2002 (Year: 2002).*
Yamanaka Tsukasa et al—JP 2014-84122 A Machine Translation—Apr. 30, 2015 (Year: 2015).*
Office Action dated Feb. 17, 2021 in Korean Application No. 10-2020-7003706.
(Continued)

*Primary Examiner* — Bradley R Spies
(74) *Attorney, Agent, or Firm* — Sughrue Mion, PLLC

(57) ABSTRACT

An object of the present invention is to provide a chemical liquid purification method which makes it possible to obtain a chemical liquid having excellent defect inhibition performance. The chemical liquid purification method according to an embodiment of the present invention is a chemical liquid purification method including obtaining a chemical liquid by filtering a substance to be purified containing an organic solvent by using two or more kinds of filters having different pore sizes, in which a supply pressure $P_1$ of the substance to be purified supplied to a filter $F_{max}$ having a maximum pore size $X_1$ among the two or more kinds of filters and a supply pressure $P_2$ of the substance to be purified supplied to a filter $F_{min}$ having a minimum pore size $X_2$ among the two or more kinds of filters satisfy $P_1>P_2$.

38 Claims, 9 Drawing Sheets

(52) U.S. Cl.
CPC ...... *B01D 2221/14* (2013.01); *B01D 2311/14* (2013.01); *B01D 2311/2623* (2013.01); *B01D 2317/02* (2013.01); *B01D 2317/04* (2013.01); *B01D 2317/08* (2013.01); *B01D 2325/02* (2013.01); *B01D 2325/42* (2013.01)

(56) References Cited

FOREIGN PATENT DOCUMENTS

| | | | |
|---|---|---|---|
| CN | 106731886 | A | 5/2017 |
| JP | 5-309237 | A | 11/1993 |
| JP | 2002-099098 | A | 4/2002 |
| JP | 2007-025341 | A | 2/2007 |
| JP | 2009-119415 | A | 6/2009 |
| JP | 2013-218308 | A | 10/2013 |
| JP | 2013237040 | A | 11/2013 |
| JP | 2015-084122 | A | 4/2015 |
| KR | 10-2014-0147148 | A | 12/2014 |

OTHER PUBLICATIONS

Notice of Reasons for Refusal dated Jan. 5, 2021 from the Japanese Patent Office in JP Application No. 2019-539558.

International Search Report dated Oct. 16, 2018 from the International Searching Authority in International Application No. PCT/JP2018/031868.

Written Opinion dated Oct. 16, 2018 from the International Bureau in International Application No. PCT/JP2018/031868.

International Preliminary Report on Patentability dated Mar. 3, 2020 from the International Bureau in International Application No. PCT/JP2018/031868.

Communication dated Jul. 13, 2021 from the China National Intellectual Property Administration in Application No. 201880054238.9.

Communication dated Aug. 31, 2021 from the Japanese Patent Office in Application No. 2019-539558.

Office Action dated Mar. 4, 2022 in Chinese Application No. 201880054238.9.

* cited by examiner

CHEMICAL LIQUID PURIFICATION METHOD

CROSS-REFERENCE TO RELATED APPLICATIONS

This application is a Continuation of PCT International Application No. PCT/JP2018/031868 filed on Aug. 29, 2018, which claims priority under 35 U.S.C. § 119(a) to Japanese Patent Application No. 2017-165637 filed on Aug. 30, 2017 and Japanese Patent Application No. 2018-152638 filed on Aug. 14, 2018. Each of the above applications is hereby expressly incorporated by reference, in its entirety, into the present application.

BACKGROUND OF THE INVENTION

1. Field of the Invention

The present invention relates to a chemical liquid purification method.

2. Description of the Related Art

In a case where semiconductor devices are manufactured by a wiring forming process including photolithography, as a prewet solution, a resist solution, a developer, a rinsing solution, a peeling solution, a Chemical Mechanical Polishing (CMP) slurry, a washing solution used after CMP, and the like, a chemical liquid containing a solvent (typically, an organic solvent) is used. In recent years, the manufacturing of semiconductor devices at a node equal to or smaller than 10 nm has been examined, and accordingly, there has been a demand for a chemical liquid which hardly causes defects on a wafer and has further improved defect inhibition performance.

Generally, it has been considered that in order to obtain such a chemical liquid, it is important to perform microfiltration of a substance to be purified so as to reduce the content of impurities in the chemical liquid. For microfiltration, sometimes filters having different pore sizes are used in combination according to the size of the impurities that should be removed. JP2013-218308A describes "a method for purifying a developer which is used for a method for forming a negative pattern by using a chemical amplification-type resist composition and contains an organic solvent as a main component, including circulating the developer in a filtering device having a filter medium (I) with a pore size equal to or smaller than 0.05 m such that the developer passes through the filter medium (I) two or more times", "the filtering device further comprises a filter medium (II) disposed on at least an upstream position or a downstream position of the filter medium (I)", and "the filter medium (II) has a pore size different from the pore size of the filter medium (I)".

SUMMARY OF THE INVENTION

In a case where a substance to be purified is filtered using the filtering device having filters with different pore sizes as described in JP2013-218308A, from the viewpoint of productivity, a constant flow-rate filtration method in which the flow rate of the substance to be purified is kept constant is adopted in many cases. According to the constant flow-rate filtration, the smaller the pore size of the filters is, the pressure of the substance to be purified, that is, the supply pressure of the substance to be purified on a primary side in each filter tends to be higher.

The inventors of the present invention filtered a substance to be purified by the method described in JP2013-218308A while keeping the flow rate of the substance to be purified constant. As a result, the inventors have found that the defect inhibition performance of the obtained chemical liquid is insufficient.

An object of the present invention is to provide a chemical liquid purification method which makes it possible to obtain a chemical liquid having excellent defect inhibition performance.

In order to achieve the aforementioned object, the inventors of the present invention carried out an intensive examination. As a result, the inventors have found that the object can be achieved by the following constitution.

(1) A chemical liquid purification method including obtaining a chemical liquid by filtering a substance to be purified containing an organic solvent by using two or more kinds of filters having different pore sizes, in which a supply pressure $P_1$ of the substance to be purified supplied to a filter $F_{max}$ having a maximum pore size $X_1$ among the two or more kinds of filters and a supply pressure $P_2$ of the substance to be purified supplied to a filter $F_{min}$ having a minimum pore size $X_2$ among the two or more kinds of filters satisfy $P_1 > P_2$.

(2) The chemical liquid purification method described in (1), in which a size relationship among the pore sizes of two or more kinds of filters coincides with a magnitude relationship among the supply pressures of the substance to be purified supplied to each of the two or more kinds of filters.

(3) The chemical liquid purification method described in (1) or (2), in which the pore size $X_1$ is 110% to 20,000% of the pore size $X_2$.

(4) The chemical liquid purification method described in any one of (1) to (3), in which the pore size $X_2$ is 1.0 to 15 nm.

(5) The chemical liquid purification method described in any one of (1) to (4), in which the pore size $X_1$ is 10 to 200 nm.

(6) The chemical liquid purification method described in any one of (1) to (5), in which a pressure ratio of the supply pressure $P_1$ to the supply pressure $P_2$ is 5.0% to 1,000% of a pore size ratio of the pore size $X_1$ to the pore size $X_2$.

(7) The chemical liquid purification method described in any one of (1) to (6), in which the supply pressure $P_2$ is 0.0010 to 0.050 MPa.

(8) The chemical liquid purification method described in any one of (1) to (7), in which among the two or more kinds of filters, the filter $F_{min}$ is finally used.

(9) The chemical liquid purification method described in any one of (1) to (8), in which each of the two or more kinds of filters is used once.

(10) The chemical liquid purification method described in any one of (1) to (9), in which at least one of the two or more kinds of filters contains polyfluorocarbon.

(11) The chemical liquid purification method described in any one of (1) to (10), in which at least one of the two or more kinds of filters is a filter having an ion exchange group.

(12) The chemical liquid purification method described in any one of (1) to (11), in which at least one of the two or more kinds of filters is a filter having a pore size equal to or smaller than 5 nm.

(13) The chemical liquid purification method described in any one of (1) to (12), in which the filter $F_{min}$ contains at least one kind of material selected from the group consisting of a polyolefin, polyamide, polyimide, polyamide imide, polyester, polysulfone, cellulose, polyfluorocarbon, and derivatives of these.

(14) The chemical liquid purification method described in any one of (1) to (12), in which the filter $F_{min}$ contains fluorine atoms.

(15) The chemical liquid purification method described in any one of (1) to (14), in which a primary storage tank is disposed between the filter $F_{min}$ and the filter $F_{max}$.

(16) The chemical liquid purification method described in any one of (1) to (15), in which the substance to be purified is filtered using a filtering device having a pipe line through which the substance to be purified is supplied and the two or more kinds of filters which are disposed in the pipe line and have different pore sizes, and at least one kind of filter among the two or more kinds of filters in the filtering device includes two or more filters that are arranged in parallel.

(17) The chemical liquid purification method described in (16), in which the filtering device includes two or more filters arranged in parallel as the filter $F_{min}$.

(18) The chemical liquid purification method described in any one of (1) to (17), in which at least one of the two or more kinds of filters satisfies a condition 1 or a condition 2 in a test which will be described later.

(19) The chemical liquid purification method described in any one of (1) to (18), in which at least one of the two or more kinds of filters satisfies a condition 3 or a condition 4 in a test which will be described later.

(20) The chemical liquid purification method described in any one of (1) to (19), in which at least one of the two or more kinds of filters satisfies a condition 5 or a condition 6 in a test which will be described later.

(21) The chemical liquid purification method described in any one of (1) to (20), further including washing at least one of the two or more kinds of filters by using a washing solution before the chemical liquid is obtained by filtering the substance to be purified by using the two or more kinds of filters.

According to the present invention, a chemical liquid purification method which makes it possible to obtain a chemical liquid having excellent defect inhibition performance can be provided.

DESCRIPTION OF THE PREFERRED EMBODIMENTS

Figure 1:
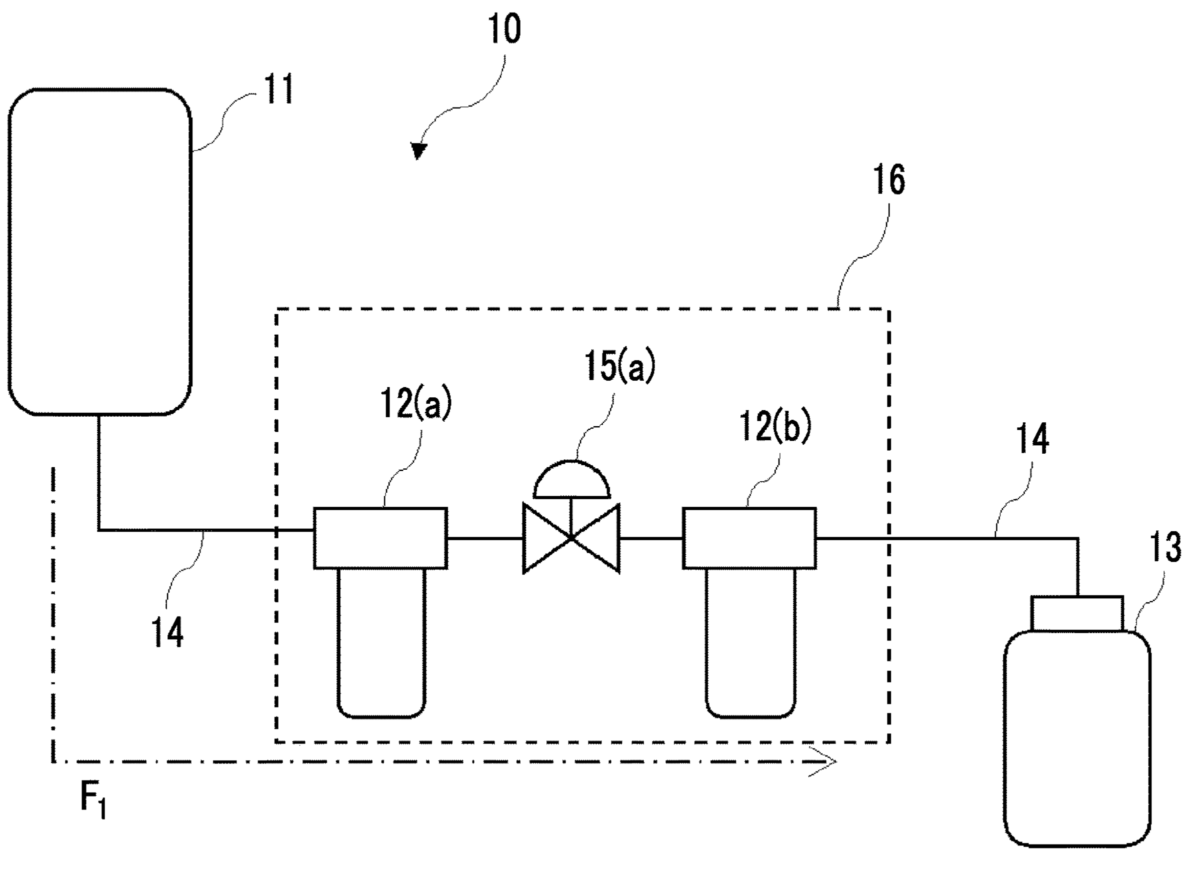
FIG. 1 is a schematic view of a typical purification device that can perform a chemical liquid purification method according to a first embodiment of the present invention.

Hereinafter, the present invention will be specifically described.

The following constituents will be described based on typical embodiments of the present invention in some cases, but the present invention is not limited to the embodiments.

In the present specification, a range of numerical values described using "to" means a range including the numerical values listed before and after "to" as a lower limit and an upper limit respectively.

In the present invention, "preparation" means not only the preparation of a specific material by means of synthesis or mixing but also the preparation of a predetermined substance by means of purchase and the like.

In the present invention, "ppm" means "parts-per-million ($10^{-6}$)", "ppb" means "parts-per-billion ($10^{-9}$)", "ppt" means "parts-per-trillion ($10^{-12}$)", and "ppq" means "parts-per-quadrillion ($10^{-5}$)".

In the present invention, regarding the description of a group (atomic group), in a case where whether the group is substituted or unsubstituted is not described, as long as the effects of the present invention are not impaired, the group includes a group which does not have a substituent and a group which has a substituent. For example, "hydrocarbon group" includes not only a hydrocarbon group which does not have a substituent (unsubstituted hydrocarbon group) but also a hydrocarbon group which has a substituent (substituted hydrocarbon group). The same is true for each compound.

Furthermore, in the present invention, "radiation" means, for example, far ultraviolet rays, extreme ultraviolet (EUV), X-rays, electron beams, and the like. In addition, in the present invention, "light" means actinic rays or radiation. In the present invention, unless otherwise specified, "exposure" includes not only exposure, far ultraviolet rays, X-rays, and EUV, and the like, but also lithography by particle beams such as Electron beams or ion beams.

First Embodiment of Chemical Liquid Purification Method

The chemical liquid purification method according to a first embodiment of the present invention is a chemical liquid purification method including obtaining a chemical liquid by filtering a substance to be purified containing an organic solvent by using two or more kinds of filters having different pore sizes, in which a supply pressure $P_1$ (MPa) of the substance to be purified supplied to a filter $F_{max}$ having a maximum pore size $X_1$ (nm) among the two or more kinds of filters and a supply pressure $P_2$ (MPa) of the substance to be purified supplied to a filter $F_{min}$ having a minimum pore size $X_2$ (nm) among the two or more kinds of filters satisfy $P_1>P_2$. The unit of the pore size of each filter is nm, and the unit of the supply pressure is MPa. Hereinafter, unless otherwise specified, each of the units has the same definition as that described above.

According to the chemical liquid purification method, the supply pressure $P_2$ of the substance to be purified supplied to the filter $F_{min}$ is lower than the supply pressure $P_1$ of the substance to be purified supplied to the filter $F_{max}$. Therefore, in the filter $F_{min}$, impurities having a smaller size are easily removed from the substance to be purified. Presumably, as a result, the content of impurities contained in the obtained chemical liquid may be reduced, and the chemical liquid may have excellent defect inhibition performance.

In the present specification, the defect inhibition performance of a chemical liquid is evaluated by a method using a wafer surface inspection device (SP-5; manufactured by KLA-Tencor Corporation). Details of the procedure of the method are as described in Examples. Defects are detected using this device according to the following principle. First, a wafer is coated with a chemical liquid, and the surface of the wafer coated with the chemical liquid is irradiated with a laser beam. In a case where the laser beam hits foreign substances and/or defects, light is scattered, the scattered light is detected by a detector, and the foreign substances and the defects are detected. Furthermore, in a case where the measurement is performed in a state of rotating the wafer during the irradiation with the laser beam, from the rotation angle of the wafer and the radial position of the laser beam, the coordinate locations of the foreign substances and the defects can be assigned.

In addition to SP-5 described above, an inspection device adopting the same measurement principle as SP-5 can be used for evaluating the defect inhibition performance of a chemical liquid. Examples of the inspection device include a Surfscan series manufactured by KLA-Tencor Corporation, and the like. Particularly, for evaluating the defect inhibition performance of a chemical liquid used for manufacturing micro-semiconductor devices at a node equal to or smaller than 10 nm, it is preferable to use “SP-5” described above or a wafer surface inspection device (typically, devices sequel to SP-5, or the like) having resolution equal to or higher than the resolution of “SP-5”.

[Purification Device]

FIG. 1 is a schematic view of a typical purification device that can perform the chemical liquid purification method according to the present embodiment. A purification device 10 has a manufacturing tank 11, a filtering device 16, and a filling device 13. These units are connected to each other through a pipe line 14.

The filtering device 16 has a filter units 12(*a*) and 12(*b*) connected to each other through the pipe line 14. An adjusting valve 15(*a*) is disposed on the pipe line between the filter units 12(*a*) and 12(*b*).

In FIG. 1, a substance to be purified is stored in the manufacturing tank 11. Then, a pump not shown in the drawing that is disposed in the pipe line 14 is operated, and the substance to be purified is sent to the filtering device 16 from the manufacturing tank 11 through the pipe line 14. The transport direction of the substance to be purified in the purification device 10 is indicated by $F_1$ in FIG. 1.

The filtering device 16 is constituted with the filter units 12(*a*) and 12(*b*) connected to each other through the pipe line 14. The two filter units accommodate filter cartridges respectively that have filters with different pore sizes. The filtering device 16 has a function of filtering the substance to be purified, which is supplied through the pipe line, by using filters. Specifically, the filter unit 12(*a*) accommodates a filter cartridge having a filter $F_{max}$ with a maximum pore size $X_1$ (nm), and the filter unit 12(*b*) accommodates a filter cartridge having a filter $F_{min}$ with a minimum pore size $X_2$ (nm).

“Maximum” and “minimum” mean the maximum filter and the minimum filter among the filters used for purifying the substance to be purified.

In a case where the pump is operated, the substance to be purified is supplied to the filter unit 12(*a*) at a supply pressure $P_1$ (MPa) and filtered through the filter $F_{max}$. After being filtered through the filter $F_{max}$, the substance to be purified is decompressed by the adjusting valve 15(*a*), supplied to the filter unit 12(*b*) at a supply pressure $P_2$ (MPa) less than the supply pressure $P_1$, and filtered through the filter $F_{min}$.

In the filtering device 16, the filter unit 12(*a*) disposed on a primary side accommodates the filter cartridge having the filter $F_{max}$, and the filter unit 12(*b*) disposed on a secondary side accommodates a filter cartridge having the filter $F_{min}$. However, the filtering device that the purification device has is not limited thereto.

For example, the filter unit 12(*a*) may accommodate the filter cartridge having the filter $F_{min}$, and the filter unit 12(*b*) may accommodate the filter cartridge having the filter $F_{max}$. In this case, the substance to be purified is supplied to the filter $F_{min}$ at the supply pressure $P_2$ (MPa) and filtered. Then, the substance to be purified filtered through the filter $F_{min}$ is adjusted in terms of the supply pressure by the adjusting valve 15(*a*), supplied to the filter $F_{min}$ at the supply pressure $P_1$ (MPa) higher than the supply pressure $P_2$, and filtered.

From the viewpoint of obtaining a chemical liquid having further improved defect inhibition performance, it is preferable that the filter $F_{min}$ is a finally used filter. That is, in the purification device 10, it is preferable that the filter unit (filter unit 12(*b*) in the drawing) disposed on the downmost stream side of the pipe line accommodates the filter cartridge having the filter $F_{min}$.

In the filtering device 16, the adjusting valve 15(*a*) is disposed on the primary side of the filter unit 12(*b*). However, the filtering device that the purification device has is not limited thereto, and may be in the form of a device in which the adjusting valve may also be disposed on the primary side of the filter unit 12(*a*).

Furthermore, a device other than the adjusting valve may also be used as long as the device can adjust the supply pressure of the substance to be purified. Examples of such a member include a damper and the like.

In the purification device 10, the supply pressure $P_1$ and the supply pressure $P_2$ are adjusted by the adjusting valve 15(*a*). However, the purification device is not limited thereto, and may be in the form of a device without an adjusting valve in which the supply pressure $P_1$ and the supply pressure $P_2$ are adjusted by the shape and/or the filtration area of the filters such as the filter $F_{min}$ and the filter $F_{max}$. Specifically, for example, a method of pleating the filter $F_{min}$ may be adopted such that the filter has a larger filtration area. In a case where the filtration area of the filter $F_{min}$ is increased, even though the supply pressure $P_2$ is further reduced, the flow rate of the substance to be purified can be increased, and the productivity tends to be further improved.

In the filtering device 16, each filter forms a filter cartridge. However, the filter usable in the purification method according to the present embodiment is not limited thereto. For example, the substance to be purified may be passed through a filter in the form of a flat plate.

The purification device 10 has a constitution in which the substance to be purified filtered through the filter unit 12(*b*) is transported to the filling device 13 and stored in a container. However, the filtering device performing the above purification method is not limited thereto, and may have a constitution in which the substance to be purified filtered through the filter unit 12(*b*) is sent back to the manufacturing tank 11 and passes again through the filter unit 12(*a*) and filter unit 12(*b*). This filtration method is called circulation filtration. In a case where the substance to be purified is purified by circulation filtration, at least one of the two or more kinds of filters is used two or more times.

From the viewpoint of productivity and from the viewpoint of making it difficult for impurities and the like entrapped by each filter to be mixed again into the substance to be purified, it is preferable to use a purification method in which each filter is used once. Typically, examples of the purification method in which each filter is used once include a method in which circulation filtration is not performed.

In the purification device 10, a primary storage tank may be disposed between the filter unit 12(*a*) and the filter unit 12(*b*). In a case where the primary storage tank is disposed in the purification device, it is easy to adjust the supply pressure applied to the filter unit 12(*a*) and the filter unit 12(*b*).

Figure 2:
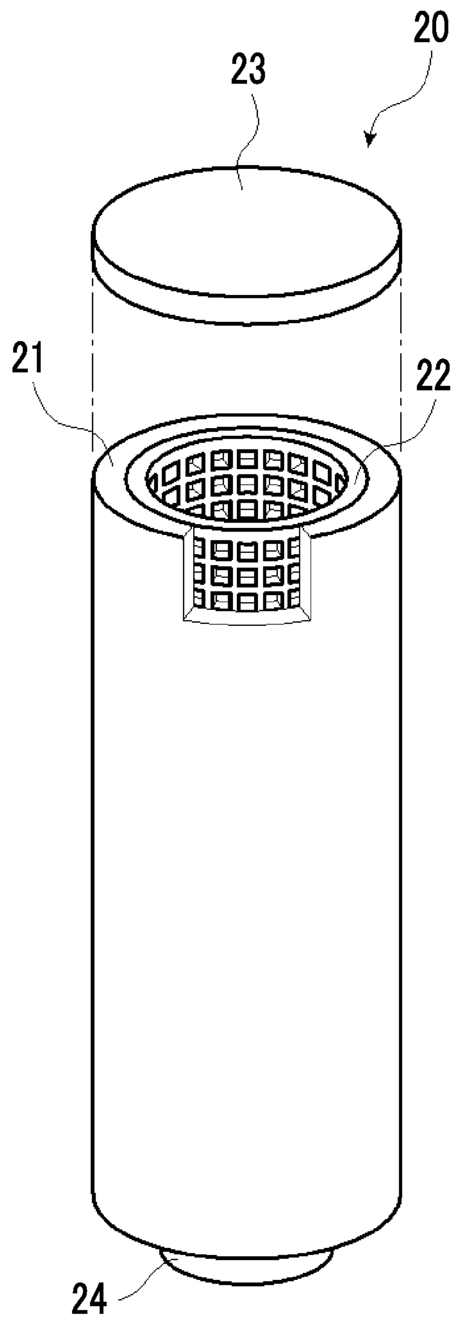
FIG. 2 is a partially exploded perspective view of a typical filter cartridge accommodated in a filter unit.

FIG. 2 is a partially exploded perspective view of a typical filter cartridge accommodated in a filter unit. A filter cartridge 20 has a cylindrical filter 21, and a cylindrical core 22 for supporting the filter 21 so as to contact the inside of the filter 21. The cylindrical core 22 is in the form of a mesh, and a liquid can easily pass through the mesh. On top of the filter 21 and the core 22, a cap 23 is disposed so as to cover the upper end portion of the members. Furthermore, on bottom of the members, a liquid inlet 24 for allowing a substance to be purified to flow into the core 22 is disposed. Furthermore, on the outside of the filter 21, a protector may be disposed which is constituted to enable a liquid to easily pass and protects the filter 21.

The above is a typical example of a filter cartridge, and the filter cartridge usable in the chemical liquid purification method according to the present embodiment is not limited thereto. The filter cartridge may not have a core and may be formed only of a filter, and the filter may have a flat plate shape.

Figure 3:
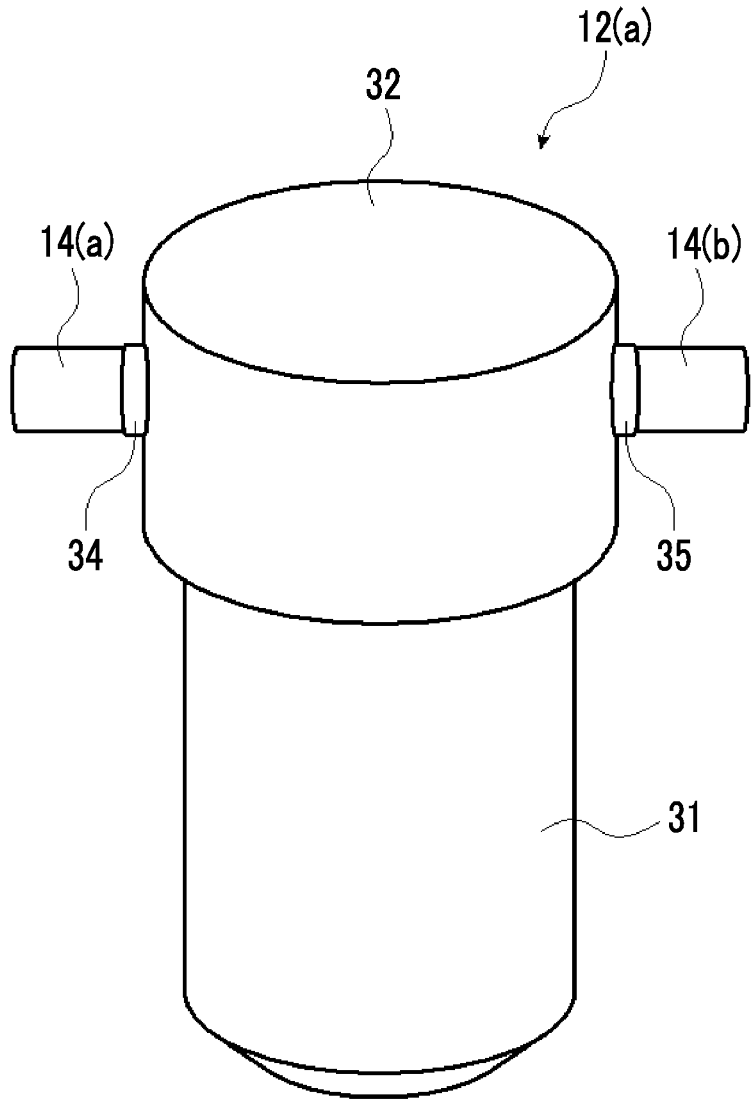
FIG. 3 is a perspective view of a typical filter unit used in a purification device.

FIG. 3 is a perspective view of a typical filter unit used in the purification device described above.

The filter unit 12(*a*) has a housing, which is constituted with a body 31 and a lid 32, and a filter cartridge not shown in the drawing that is accommodated in the housing (the filter unit 12(*b*) has the same constitution). On the lid 32, a liquid inlet 34 to be connected to a pipe line 14(*a*) and a liquid outlet 35 to be connected to the pipe line 14(*b*) are disposed.

The filter unit 30 shown in FIG. 3 has the liquid inlet 34 and the liquid outlet 35 on the lid 32. However, the filter unit is not limited thereto, and the liquid inlet and the liquid outlet can be disposed at any place of the lid 32 and/or the body 31. Furthermore, although the filter unit 12(*a*) shown in FIG. 3 has the body 31 and the lid 32, the body and the lid may be constituted as an integral unit.

Figure 4:
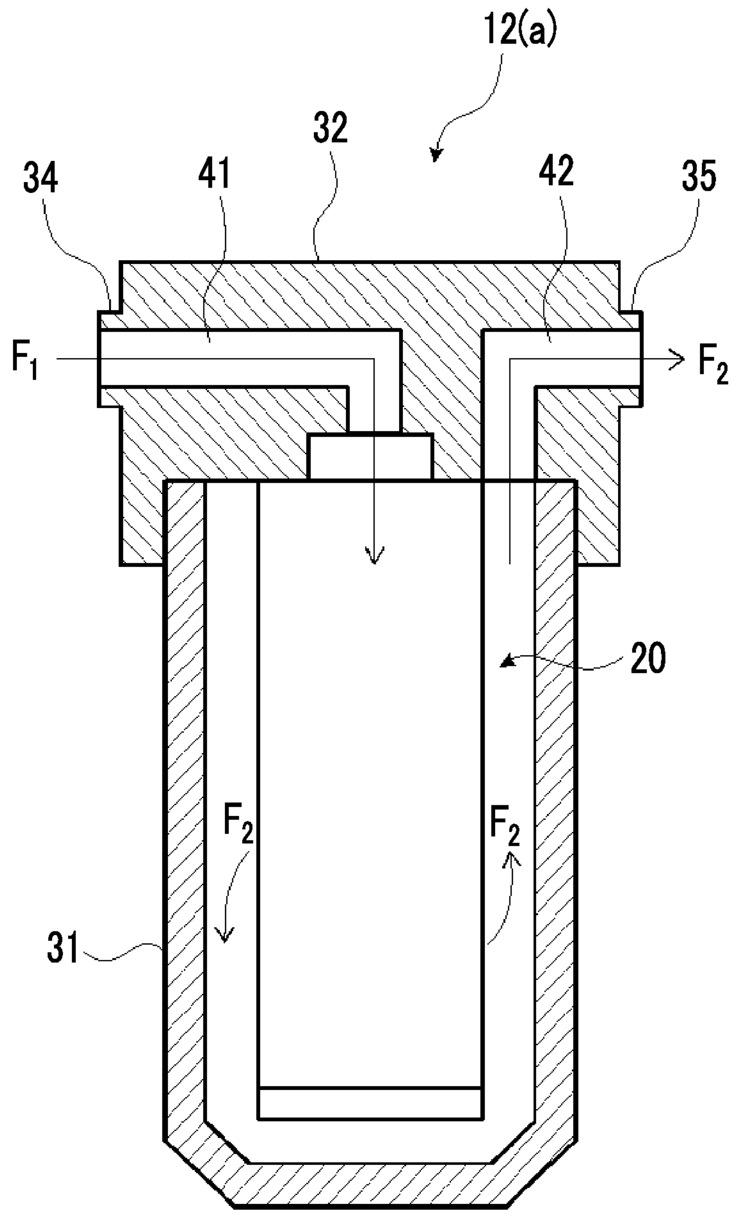
FIG. 4 is a partial cross-sectional view of a filter unit.

FIG. 4 is a partial cross-sectional view of the filter unit described above. The filter unit 12(*a*) comprises the liquid inlet 34 and the liquid outlet 35 on the lid 32. The liquid inlet 34 is connected to an internal pipe line 41, and the liquid outlet 35 is connected to an internal pipe line 42. The flow of a substance to be purified is indicated by $F_1$. The substance to be purified having flown into the filter unit from the liquid inlet 34 flows into the body 31 through the internal pipe line 41 provided in the interior of the lid 32, passes through the filter from the core of the filter cartridge, and flows into the outer surface. In this process, the substance to be purified is purified.

The purified substance to be purified having flown out to the outer surface passes through the internal pipe line 42 and taken out of the liquid outlet 35 (along the flow indicated by $F_2$ in FIG. 4).

<Filter>

(Pore Size)

The pore size of the filters is not particularly limited as long as it is generally used for filtering a substance to be purified. Especially, in view of obtaining a chemical liquid having further improved effects of the present invention, the pore size of the filters is preferably equal to or greater than 1.0 nm and equal to or smaller than 1.0 μm. Particularly, it is preferable that at least one of the two or more kinds of filters is a filter having a pore size equal to or smaller than 5 nm.

In the present specification, the pore size of a filter means a pore size determined by the bubble point of isopropanol (IPA) or HFE-7200 ("NOVEC 7200", manufactured by 3M Company, hydrofluoroether, $C_4F_9OC_2H_5$).

There is no particular limitation of the relationship between a pore size $X_1$ (nm) of the filter $F_{max}$ and a pore size $X_2$ (nm) of the filter $F_{min}$. However, in view of obtaining a chemical liquid having further improved defect inhibition performance, pore size $X_1$ is preferably 110% to 20,000% of the pore size $X_2$. In other words, it is preferable that the following expression is established between the pore size $X_1$ and the pore size $X_2$.

(Expression) $1.1\times X_2 \leq X_1 \leq 200\times X_2$

In view of obtaining a chemical liquid having further improved defect inhibition performance, pore size $X_1$ is preferably equal to or greater than 150% of the pore size $X_2$, and more preferably greater than 150% of the pore size $X_2$. Furthermore, pore size $X_1$ is preferably equal to or smaller than 10,000% of the pore size $X_2$.

In view of obtaining a chemical liquid having further improved defect inhibition performance, pore size $X_1$ is preferably 10 to 200 nm, and more preferably 10 to 100 nm.

In view of obtaining a chemical liquid having further improved defect inhibition performance, the pore size $X_2$ is preferably 1.0 to 15 nm, and more preferably 1.0 to 10 nm.

There is no particular limitation on the relationship between a pore size ratio ($X_1/X_2$) of the pore size $X_1$ to the pore size $X_2$ and a pressure ratio ($P_1/P_2$) of the supply pressure $P_1$ to the supply pressure $P_2$. However, in view of obtaining a chemical liquid having further improved defect inhibition performance, $P_1/P_2$ is preferably 5.0% to 1,000% of $X_1/X_2$. In other words, it is preferable that the following expression is established between $P_1/P_2$ and $X_1/X_2$.

(Expression) $0.050\times X_1/X_2 \leq P_1/P_2 \leq 10\times X_1/X_2$

In view of obtaining a chemical liquid having further improved defect inhibition performance, $P_1/P_2$ is more preferably 10% to 800% of $X_1/X_2$.

In a case where $P_1/P_2$ is equal to or smaller than 1,000% of $X_1/X_2$, the supply pressure of the substance to be purified supplied to the filter $F_{max}$ becomes sufficiently low, and the filtration efficiency by filter $F_{max}$ tends to be sufficiently increased. As a result, a chemical liquid having further improved defect inhibition performance is easily obtained.

In a case where $P_1/P_2$ is equal to or greater than 5.0% of $X_1/X_2$, it is easy to obtain a chemical liquid having excellent defect inhibition performance while maintaining productivity.

(Material)

The material of the filters is not particularly limited. In a case where the material is a polymer, it is preferable that the filters contain a polyolefin (including a high density polyolefin and an ultra-high-molecular-weight polyolefin) such as polyethylene and polypropylene (PP); polyamide such as nylon 6 and nylon 66, polyimide; polyamide imide; polyester such as polyethylene terephthalate; polyether sulfone;

cellulose; polyfluorocarbon such as polytetrafluoroethylene and perfluoroalkoxyalkane; derivatives of the above polymers; and the like. The filters are more preferably formed of at least one kind of material selected from the group consisting of a polyolefin, polyamide, polyimide, polyamide imide, polyester, polysulfone, cellulose, polyfluorocarbon, and derivatives of these.

Furthermore, in addition to a resin, diatomite, glass, and the like may also be used.

As the material of the filters, a polymer derivative may also be used. Typical examples of the derivative include those obtained by introducing ion exchange groups into the aforementioned polymers by a chemical modification treatment. Particularly, it is preferable that at least one of the two or more kinds of filters is a filter having ion exchange groups.

Examples of the ion exchange groups include cation exchange groups such as a sulfonic acid group, a carboxy group, a phosphoric acid group, and the like and anion exchange groups such as secondary, tertiary, quaternary ammonium groups, and the like. The method for introducing ion exchange groups into the polymer is not particularly limited, and examples thereof include a method of reacting a compound, which has ion exchange groups and polymerizable groups, with the polymer such that the compound is grafted on the polymer typically.

For example, in a case where a polyolefin (polyethylene, polypropylene, or the like) is used, the polyolefin is irradiated with ionizing radiation (α-rays, β-rays, γ-rays, X-rays, electron beams, and the like) such that an active portion (radical) is generated in the molecular chain of the polyolefin. After being irradiated, the polyolefin is immersed in a solution containing a monomer such that the monomer is graft-polymerized with the polyolefin. As a result, polyolefin to which the monomer is bonded as a side chain by graft polymerization is generated. The generated polyolefin fiber having the monomer as a side chain is reacted by being brought into contact with the compound having anion exchange groups or cation exchange groups, and as a result, an end product is obtained in which ion exchange groups are introduced into the graft-polymerized side chain monomer. In this product, the ion exchange groups are introduced not into the polyolefin fiber as a main chain but into the side chain monomer that is graft-polymerized with the main chain.

The filters may be constituted with woven cloth or nonwoven cloth, in which ion exchange groups are formed by a radiation graft polymerization method, combined with glass wool, woven cloth, or nonwoven cloth that is conventionally used.

A surface treatment other than chemical modification may be performed on the filters. As the surface treatment method, known methods can be used without particular limitation. Examples of the surface treatment method include a plasma treatment, a hydrophobization treatment, coating, a gas treatment, sintering, and the like.

The plasma treatment is preferable because the surface of the filters is hydrophilized by this treatment. Although the water contact angle on the surface of each filter hydrophilized by the plasma treatment is not particularly limited, a static contact angle measured at 25° C. by using a contact angle meter is preferably equal to or smaller than 60°, more preferably equal to or smaller than 50°, and even more preferably equal to or smaller than 30°.

Particularly, in view of obtaining a chemical liquid having further improved defect inhibition performance, it is preferable that the filter $F_{max}$ contains polyfluorocarbon.

The filter $F_{min}$ may or may not contain fluorine atoms. It is preferable that the filter $F_{min}$ does not contain fluorine atoms.

In a case where the filter $F_{min}$ contains fluorine atoms, it is preferable that the filter $F_{min}$ contains polytetrafluoroethylene.

In a case where the filter $F_{min}$ does not contain fluorine atoms, it is more preferable that the filter $F_{min}$ does not contain polyfluorocarbon. The filter $F_{min}$ even more preferably contains at least one kind of material selected from the group consisting of a polyolefin, polyamide, and derivatives of these, and is particularly formed of at least one kind of material selected from the group consisting of a polyolefin, polyamide, and derivatives of these.

The polyolefin is not particularly limited, but is preferably polyethylene. As the polyethylene, high density polyethylene (HDPE) or ultra-high-molecular-weight polyethylene (UPE) is more preferable.

The polyamide is not particularly limited, but is preferably nylon. Examples of the nylon include nylon 6, nylon 66, and the like.

The pore structure of the filters is not particularly limited, and may be appropriately selected according to the form of impurities contained in a substance to be purified. The pore structure of the filters means the pore size distribution, the positional distribution of pores in the filters, the shape of pores, and the like. Typically, the pore structure varies with the method for manufacturing the filters.

For example, the pore structure varies between a porous membrane formed by sintering powder of a resin or the like and a fibrous membrane formed by methods such as electrospinning, electroblowing, and melt blowing.

The critical surface tension of the filter is not particularly limited, and can be appropriately selected according to the impurities that should be removed. For example, in view of efficiently removing impurities with high polarity and metal impurities, the critical surface tension is preferably equal to or higher than 70 mN/m and equal to or lower than 95 mN/m. The critical surface tension of the filters is more preferably 75 to 85 mN/m. The value of the critical surface tension is a nominal value from the manufacturer.

The temperature at which a substance to be purified passes through the filters is not particularly limited, but is preferably less than room temperature in general.

There is no particular limitation on the value of a distance (Ra) between a substance to be purified and the material of each filter in the Hansen space and on the value of a radius of an interaction sphere, that is, the value of an interaction radius (R0) of the material of each filter. However, in view of reducing the amount of impurities derived from each filter that are eluted into the substance to be purified, it is preferable to control Ra and R0. That is, in a relationship among Hansen solubility parameters $\delta_{Dp}$, $\delta_{Pp}$, and $\delta_{Hp}$ and an interaction radius R0 of each filter and Hansen solubility parameters $\delta_{Ds}$, $\delta_{Ps}$, and $\delta_{Hs}$ of the substance to be purified, provided that Ra is represented by an equation of $Ra^2=4(\delta_{Ds}-\delta_{Dp})^2+(\delta_{Ps}-\delta_{Pp})^2+(\delta_{Hs}-\delta_{Hp})^2$, a ratio of Ra to R0 is preferably equal to or lower than 1.0.

The filtering speed is not particularly limited. However, in view of obtaining a chemical liquid having further improved effects of the present invention, the filtering speed is preferably equal to or higher than 1.0 L/min/m$^2$, more preferably equal to or higher than 0.75 L/min/m$^2$, and even more preferably equal to or higher than 0.6 L/min/m$^2$.

For the filter, an endurable differential pressure for assuring the filter performance (assuring that the filter will not be broken) is set. In a case where the endurable differential pressure is high, by increasing the filtering pressure, the filtering speed can be increased. That is, it is preferable that the upper limit of the filtering speed is generally equal to or lower than 10.0 L/min/$m^2$ although the upper limit usually depends on the endurable differential pressure of the filter.

(Supply Pressure)

The supply pressure of a substance to be purified supplied to each filter is not particularly limited, but is preferably 0.00010 to 1.0 MPa in general.

Particularly, in view of a chemical liquid having further improved defect inhibition performance, the supply pressure $P_2$ is preferably 0.00050 to 0.090 MPa, more preferably 0.0010 to 0.050 MPa, and even more preferably 0.0050 to 0.040 MPa.

The supply pressure $P_1$ is not particularly limited as long as it is higher than the supply pressure $P_2$. Supply pressure $P_1$ is preferably 0.010 to 0.5 MPa, more preferably 0.003 to 0.50 MPa, and even more preferably 0.005 to 0.30 MPa.

The filtering pressure affects the filtering accuracy. Therefore, it is preferable that the pulsation of pressure at the time of filtering is as low as possible.

The filter $F_{max}$ and the filter $F_{min}$ may have different pore sizes. In view of obtaining a chemical liquid having further improved defect inhibition performance, it is preferable that either or both of the material and pore structure vary between the filter $F_{max}$ and the filter $F_{min}$.

(Elution Test)

In the purification device 10, at least one of the filter $F_{max}$ or the filter $F_{min}$ satisfies a condition 1 or 2 in the following test (hereinafter, referred to as "elution test" as well). It is preferable that both the filter $F_{max}$ and filter $F_{min}$ satisfy the condition 1 or 2. In a case where the purification device further has another filter, it is preferable that another filter also satisfies the condition 1 or 2. It is more preferable that all the filters that the purification device has satisfy the condition 1 or 2.

In a case where the filter forms a filter cartridge, the amount of a test solvent is adjusted such that the mass of the filter and the mass of the test solvent satisfy the relationship described above, and then the test is performed by immersing each filter cartridge in the test solvent. It is more preferable that all the filters that the purification device has satisfy the condition 1 or 2.

Test: under a condition that a ratio of the mass of the filter to the mass of the test solvent containing an organic solvent in an amount equal to or greater than 99.9% by mass (preferably equal to or greater than 99.99% by mass) becomes 1.0 in a case where a liquid temperature of the test solvent is 25° C., the filter is immersed for 48 hours in the test solvent having a liquid temperature of 25° C.

Condition 1: in a case where the test solvent having been used for immersion contains one kind of organic impurities selected from the group consisting of the following Formulae (1) to (7), an increase in a content of one kind of the organic impurities before and after the immersion is equal to or smaller than 400 mass ppm.

Condition 2: in a case where the test solvent having been used for immersion contains two or more kinds of organic impurities selected from the group consisting of the following Formulae (1) to (7), an increase in a content of each of two or more kinds of the organic impurities before and after the immersion is equal to or smaller than 400 mass ppm.

(1)

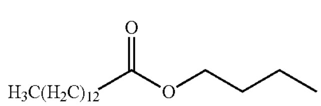

-continued (2)

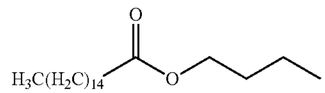

(3)

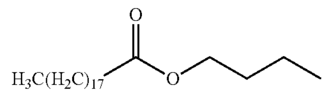

(4)

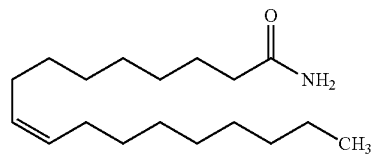

(5)

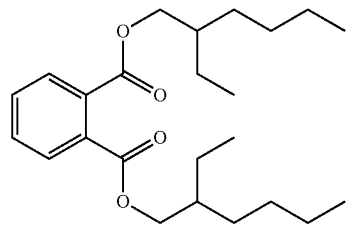

(6)

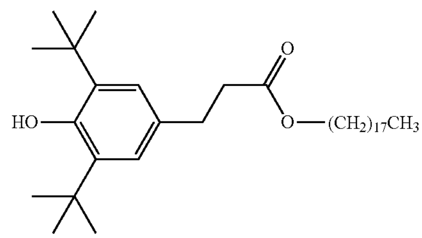

(7)

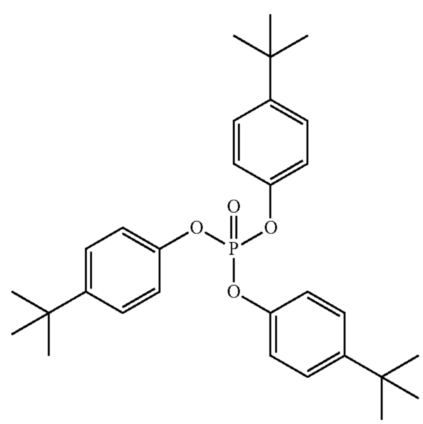

The lower limit of the increase in the content of the organic impurities in the test solvent is not particularly limited. From the viewpoint of quantitative lower limit, the lower limit of the increase is preferably equal to or greater than 0.01 mass ppt.

The type and the content of the organic impurities in the test solvent can be measured by the method described in Examples by using a gas chromatography mass spectrometer.

In the purification device 10, it is preferable that at least one of the filter $F_{max}$ or the filter $F_{min}$ satisfies a condition 3 or 4 in the elution test. It is preferable that both the filter $F_{max}$ and filter $F_{min}$ satisfy the condition 3 or 4. In a case where the purification device further has another filter, it is preferable that another filter also satisfies the condition 3 or 4.

It is more preferable that all the filters that the purification device has satisfy the condition 3 or 4.

In a case where the filter forms a filter cartridge, the amount of a test solvent is adjusted such that the mass of the filter and the mass of the test solvent satisfy the relationship described above, and then the test is performed by immersing each filter cartridge in the test solvent. It is more preferable that the above condition is satisfies as a result of performing the test in the manner described above.

Condition 3: in a case where the test solvent having been used for immersion contains metal ions (hereinafter, referred to as "specific metal ions" as well) of at least one kind of metal selected from the group consisting of Fe, Na, Ca, Al, and K, an increase in a content of one kind of the specific metal ions before and after the immersion is equal to or smaller than 10 mass ppb (preferably equal to or smaller than 100 mass ppt).

Condition 4: in a case where the test solvent having been used for immersion contains two or more kinds of specific metal ions, an increase in a content of each of two or more kinds of the specific metal ions before and after the immersion is equal to or smaller than 10 mass ppb (preferably equal to or smaller than 100 mass ppt).

The lower limit of the increase in the content of the specific metal ions in the test solvent is not particularly limited. From the viewpoint of quantitative lower limit, the lower limit of the increase is preferably equal to or greater than 0.001 mass ppt.

In the test solvent having been used for immersion, the total increase in the content of the specific metal ions before and after the immersion is not particularly limited. However, in view of obtaining a chemical liquid having further improved defect inhibition performance, the total increase is preferably equal to or smaller than 110 mass ppb, more preferably equal to or smaller than 50 mass ppb, even more preferably equal to or smaller than 20 mass ppb, and particularly preferably equal to or smaller than 12 mass ppb.

The type and the content of the specific metal ions in the test solvent can be measured by Single Nano Particle Inductively Coupled Plasma Mass Spectrometry (SP-ICP-MS).

The device used in SP-ICP-MS is the same as the device used in general inductively coupled mass spectrometry (ICP-MS). The only difference between SP-ICP-MS and ICP-MS is how to analyze data. With SP-ICP-MS, data can be analyzed using commercial software.

With ICP-MS, the content of metal components as a measurement target is measured regardless of the way the metal components are present. Accordingly, the total mass of metal particles and metal ions as a measurement target is quantified as the content of metal components.

With SP-ICP-MS, the content of metal particles is measured. Accordingly, by subtracting the content of metal particles from the content of metal components in a sample, the content of metal ions in the sample can be calculated.

Examples of the device for SP-ICP-MS include Agilent 8800 triple quadrupole inductively coupled plasma mass spectrometry (ICP-MS, for semiconductor analysis, option #200) manufactured by Agilent Technologies, Inc. By using this device, the content of metal particles can be measured by the method described in Examples. In addition to the device described above, it is possible to use NexION350S manufactured by PerkinElmer Inc. and Agilent 8900 manufactured by Agilent Technologies, Inc.

In the present specification, metal ions mean ions of a single metal or complex ions (for example, an ammine complex, a cyano complex, a halogeno complex, a hydroxy complex, and the like).

In the purification device 10, it is preferable that at least one of the filter $F_{max}$ or the filter $F_{min}$ satisfies a condition 5 or 6 in the elution test. It is preferable that both the filter $F_{max}$ and filter $F_{min}$ satisfy the condition 5 or 6. In a case where the purification device further has another filter, it is preferable that another filter also satisfies the condition 5 or 6. It is more preferable all the filters that the purification device has satisfy the condition 5 or 6.

In a case where the filter forms a filter cartridge, the amount of a test solvent is adjusted such that the mass of the filter and the mass of the test solvent satisfy the relationship described above, and then the test is performed by immersing each filter cartridge in the test solvent. It is more preferable that the above condition is satisfies as a result of performing the test in the manner described above.

Condition 5: in a case where the test solvent having been used for immersion contains metal particles (hereinafter, referred to as "specific metal particles" as well) of at least one kind of metal selected from the group consisting of Fe, Cr, Pb, and Ni, an increase in a content of one kind of the specific metal particles before and after the immersion is equal to or smaller than 10 mass ppb (preferably equal to or smaller than 100 mass ppt).

Condition 6: in a case where the test solvent having been used for immersion contains two or more kinds of specific metal particles, an increase in a content of each of two or more kinds of the specific metal particles before and after the immersion is equal to or smaller than 10 mass ppb (preferably equal to or smaller than 100 mass ppt).

The lower limit of the increase in the content of the specific metal particles in the test solvent is not particularly limited. From the viewpoint of quantitative lower limit, the lower limit of the increase is preferably equal to or greater than 0.001 mass ppt.

In the test solvent having been used for immersion, the total increase in the content of the specific metal particles before and after the immersion is not particularly limited. However, in view of obtaining a chemical liquid having further improved defect inhibition performance, the total increase is preferably equal to or smaller than 110 mass ppb, more preferably equal to or smaller than 50 mass ppb, even more preferably equal to or smaller than 20 mass ppb, and particularly preferably equal to or smaller than 12 mass ppb.

The content of the specific metal particles in the test solvent can be measured by SP-ICP-MS described above.

[Substance to be Purified]

The substance to be purified usable in the chemical liquid purification method according to the present embodiment is not particularly limited as long as it contains an organic solvent.

<Organic Solvent>

The substance to be purified contains an organic solvent. The content of the organic solvent in the substance to be purified is not particularly limited, but is preferably equal to or greater than 99.0% by mass in general with respect to the total mass of the chemical liquid. The upper limit thereof is not particularly limited, but is preferably equal to or smaller than 99.99999% by mass in general.

One kind of organic solvent may be used singly, or two or more kinds of organic solvents may be used in combination. In a case where two or more kinds of organic solvents are used in combination, the total content thereof is preferably within the above range.

In the present specification, an organic solvent means one liquid organic compound which is contained in the chemical liquid in an amount greater than 10,000 mass ppm with respect to the total mass of the chemical liquid. That is, in the present specification, a liquid organic compound contained in the chemical liquid in an amount greater than 10,000 mass ppm with respect to the total mass of the chemical liquid corresponds to an organic solvent.

In the present specification, "liquid" means that the compound stays in liquid form at 25° C. under atmospheric pressure.

The type of the organic solvents is not particularly limited, and known organic solvents can be used. Examples of the organic solvents include alkylene glycol monoalkyl ether carboxylate, alkylene glycol monoalkyl ether, a lactic acid alkyl ester, alkoxyalkyl propionate, cyclic lactone (preferably having 4 to 10 carbon atoms), a monoketone compound which may have a ring (preferably having 4 to 10 carbon atoms), alkylene carbonate, alkoxyalkyl acetate, alkyl pyruvate, and the like.

Furthermore, as the organic solvents, those described in JP2016-057614A, JP2014-219664A, JP2016-138219A, and JP2015-135379A may be used.

The organic solvent is preferably at least one kind of compound selected from the group consisting of propylene glycol monomethyl ether (PGMM), propylene glycol monoethyl ether (PGME), propylene glycol monopropyl ether (PGMP), propylene glycol monomethyl ether acetate (PGMEA), ethyl lactate (EL), methyl methoxypropionate (MPM), cyclopentanone (CyPn), cyclohexanone (CyHe), γ-butyrolactone (γBL), diisoamyl ether (DIAE), butyl acetate (nBA), isoamyl acetate (iAA), isopropanol (IPA), and 4-methyl-2-pentanol (MIBC), dimethylsulfoxide (DMSO), n-methyl-2-pyrrolidone (NMP), diethylene glycol (DEG), ethylene glycol (EG), dipropylene glycol (DPG), propylene glycol (PG), ethylene carbonate (EC), propylene carbonate (PC), sulfolane, cycloheptanone, and 2-heptanone (MAK).

The type and the content of the organic solvent in the substance to be purified can be measured using a gas chromatography mass spectrometer. The measurement condition is as described in Examples.

<Other Components>

The substance to be purified may contain other components in addition to the above components. Examples of those other components include metal impurities (metal ions and metal particles), water, and the like.

[Purification Step]

The chemical liquid purification step according to the present embodiment includes a step of filtering a substance to be purified by using two or more kinds of filters having different pore sizes (purification step). The aspect of the purification step is as described above. Furthermore, the chemical liquid purification method may further have a step of distilling the substance to be purified before or after the purification step.

[Other Steps]

The chemical liquid purification method according to the present embodiment may further have other steps in addition to the above steps. Examples of those other steps include an ion exchange step, an ion adsorption step, a washing step, a moisture content-adjusting step, and an electricity removing step. Hereinafter, each of the steps will be specifically described.

<Ion Exchange Step>

In the present specification, the ion exchange step means a method for removing metal ions and the like contained in a substance to be purified without using a filter.

Typical examples of the ion exchange step include a step of passing the substance to be purified through an ion exchange unit. The method for passing the substance to be purified through the ion exchange unit is not particularly limited, and examples thereof include a method of disposing an ion exchange unit in the pipe line on the primary side or the secondary side of the filter unit in the filtering device described above and passing the substance to be purified through the ion exchange unit under pressure or without applying pressure.

As the ion exchange unit, known ion exchange units can be used without particular limitation. Examples of the ion exchange unit include a tower-like container (resin tower) storing an ion exchange resin, an electrodialysis device using an ion exchange membrane, and the like.

In a case where an ion exchange resin is used, a cation exchange resin or an anion exchange resin may be used as a single bed, a cation exchange resin and an anion exchange resin may be used as a dual bed, or a cation exchange resin and an anion exchange resin may be used as a mixed bed.

In order to reduce the amount of moisture eluted from the ion exchange resin, as the ion exchange resin, it is preferable to use a dry resin which does not contain moisture as far as possible. As the dry resin, commercial products can be used, and examples thereof include 15JS-HG-DRY (trade name, dry cation exchange resin, moisture content: equal to or smaller than 2%) and MSPS2-1-DRY (trade name, mixed bed resin, moisture content: equal to or smaller than 10%) manufactured by ORGANO CORPORATION, and the like.

In a case where an electrodialysis device using an ion exchange membrane is used, the substance to be purified can be treated at a high flow rate. The ion exchange membrane is not particularly limited, and examples thereof include NEOSEPTA (trade name, manufactured by ASTOM Corporation), and the like.

<Ion Adsorption Step>

In the present specification, the ion adsorption step is a method for removing metal ions and the like contained in a substance to be purified without using a filter.

Typically, examples of the ion adsorption step include a method of using, instead of the ion exchange resin described above, an ion adsoprtion resin and/or a chelating agent having a function of entrapping metal ions in a substance to be purified. As the chelating agent, for example, it is possible to use the chelating agents described in JP2016-028021A, JP2000-169828A, and the like. Furthermore, as the ion adsorption resin, for example, it is possible to use the resins described in JP2001-123381A, JP2000-328449A, and the like.

<Washing Step>

The washing step is a step of washing a filter by using a washing solution. By washing the filter, it is possible to inhibit organic impurities and the like from being eluted to a substance to be purified from the filter. The method for washing the filter is not particularly limited, and examples thereof include a method of immersing the filter in the washing solution, a method of causing the washing solution to flow through the filter, and a method of using the above methods in combination.

In a case where the filter forms a filter cartridge, it is preferable to wash each filter cartridge because then the elution of impurities from the entirety of the filter cartridge can be inhibited.

The washing solution is not particularly limited, and examples thereof include water, an acid, an alkali, and the like. The washing solution may be an organic solvent. The organic solvent may be organic solvents that the substance to be purified and the chemical liquid can contain, such as alkylene glycol monoalkyl ether carboxylate, alkylene glycol monoalkyl ether, lactic acid alkyl ester, alkoxyalkyl propionate, cyclic lactone (preferably having 4 to 10 carbon atoms), a ketone compound which may have a ring (preferably having 4 to 10 carbon atoms), alkylene carbonate, alkoxyalkyl acetate, and alkyl pyruvate.

More specifically, examples of the washing solution include propylene glycol monomethyl ether, propylene glycol monomethyl ether acetate, dimethyl sulfoxide, n-methyl pyrrolidone, diethylene glycol, ethylene glycol, dipropylene glycol, propylene glycol, ethylene carbonate, propylene carbonate, sulfolane, cyclohexane, cyclohexanone, cycloheptanone, cyclopentanone, 2-heptanone, γ-butyrolactone, a mixture of these, and the like.

<Moisture Content-Adjusting Step>

The moisture content-adjusting step is a step of adjusting the content of water in a substance to be purified. The method for adjusting the content of water is not particularly limited, and examples thereof include a method of adding water to the substance to be purified and a method of removing water in the substance to be purified.

As the method for removing water, known dehydration methods can be used without particular limitation.

Examples of the method for removing water include a dehydration membrane, a water adsorbent insoluble in an organic solvent, an aeration purge device using a dry inert gas, a heating or vacuum heating device, and the like.

In a case where the dehydration membrane is used, dehydration is performed using the membrane by means of pervaporation (PV) or vapor permeation (VP). The dehydration membrane is constituted, for example, as a permeable membrane module. As the dehydration membrane, it is possible to use membranes formed of a polymer-based material such as polyimide-based material, a cellulose-based material, or a polyvinyl alcohol-based material or an inorganic material such as zeolite.

The water adsorbent is used by being added to a substance to be purified. Examples of the water adsorbent include zeolite, diphosphorus pentoxide, silica gel, calcium chloride, sodium sulfate, magnesium sulfate, anhydrous zinc chloride, fuming sulfuric acid, soda lime, and the like.

In a case where zeolite (particularly, MOLECULAR SIEVE (trade name) manufactured by Union Showa K.K.) is used for the dehydration treatment, olefins can also be removed.

<Electricity Removing Step>

The electricity removing step is a step of removing electricity from a substance to be purified such that the charge potential thereof is reduced.

As the electricity removing method, known electricity removing methods can be used without particular limitation. Examples of the electricity removing method include a method of bringing the substance to be purified into contact with a conductive material.

The contact time for which the substance to be purified is brought into contact with a conductive material is preferably 0.001 to 60 seconds, more preferably 0.001 to 1 second, and even more preferably 0.01 to 0.1 seconds. Examples of the conductive material include stainless steel, gold, platinum, diamond, glassy carbon, and the like.

Examples of the method for bringing the substance to be purified into contact with a conductive material include a method of disposing a grounded mesh formed of a conductive material in the interior of a pipe line and passing the substance to be purified through the mesh, and the like.

Each of the steps described above is preferably performed under a sealed condition in an inert gas atmosphere in which water is less likely to be mixed into the substance to be purified.

Furthermore, in order to inhibit the intermixing of moisture as much as possible, each of the steps is preferably performed in an inert gas atmosphere in which a dew-point temperature is equal to or lower than −70° C. This is because in the inert gas atmosphere at a temperature equal to or lower than −70° C., the concentration of moisture in a gas phase is equal to or lower than 2 mass ppm, and hence the likelihood that moisture will be mixed into the substance to be purified is reduced.

The chemical liquid purification method may have, for example, a step of performing an adsorption and purification treatment on metal components by using silicon carbide described in WO2012/043496A, in addition to the steps described above.

During the purification of a chemical liquid, it is preferable that all of the opening of a container, washing of a container and a device, storage of a solution, analysis, and the like that are included in the purification are performed in a clean room. It is preferable that the clean room meets the 14644-1 clean room standard. The clean room preferably meets any of International Organization for Standardization (ISO) class 1, ISO class 2, ISO class 3, or ISO class 4, more preferably meets ISO class 1 or ISO class 2, and even more preferably meets ISO class 1.

First Modification Example of First Embodiment of Chemical Liquid Purification Method A first modification example of the chemical liquid purification method according to the first embodiment of the present invention is a chemical liquid purification method of using a filtering device in which at least one kind of filter among two or more kinds of filters is constituted with two or more filters arranged in parallel. Hereinafter, the same items as those in the first embodiment will not be described.

Figure 5:
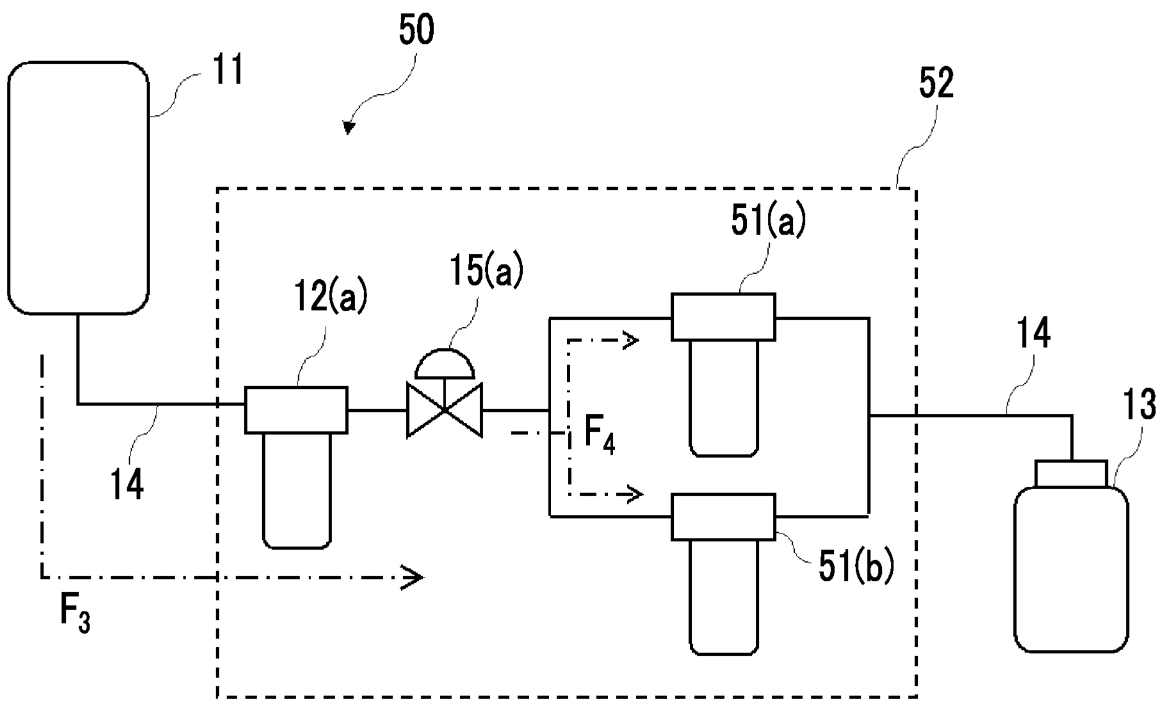
FIG. 5 is a schematic view of a typical purification device that can perform a first modification example of the chemical liquid purification method according to the first embodiment of the present invention.

FIG. 5 is a schematic view of a typical purification device that can perform the chemical liquid purification method according to the present embodiment. A purification device 50 has a manufacturing tank 11, a filtering device 52, and a filling device 13. These units are connected to each other through a pipe line 14.

The filtering device 52 has filter units 12(*a*), 51(*a*), and 51(*b*) connected to each other through the pipe line 14. An adjusting valve 15(*a*) is disposed on a secondary side of the filter unit 12(*a*).

In the filtering device 52, the filter units 51(*a*) and 51(*b*) are arranged in parallel. Accordingly, filters accommodated in the filter units are also arranged in parallel. Generally, the filter units 51(*a*) and 51(*b*) accommodate filter cartridges having filters of the same type, and more preferably accommodate filter cartridges of the same type.

In other words, because filters are accommodated in two filter units having liquid outlets and liquid inlets that are connected to each other respectively through the pipe line, the two filters accommodated in the filter units are arranged in parallel.

In the filtering device 52, the filter unit 12(*a*) accommodates a filter cartridge having a filter $F_{max}$, and the filter units 51(*a*) and 51(*b*) accommodate filter cartridges of the same type that each have a filter $F_{min}$.

The purification device 50 has a pump, which is not shown in the drawing, in the pipe line. In a case where the pump is operated, a substance to be purified is supplied to the filter unit 12(*a*) at a supply pressure $P_1$ (MPa) and filtered through the filter $F_{max}$. The substance to be purified filtered through the filter unit 12(*a*) is decompressed by the adjusting valve 15(*a*), supplied to the filter units 51(*a*) and 52(*b*) at a supply pressure $P_2$ (MPa) less than the supply pressure $P_1$, and filtered through any one of the two filters $F_{min}$. The flow of the substance to be purified in the pipe line is indicated by $F_3$ in the drawing.

In a case where the supply pressure $P_1$ of the substance to be purified is reduced to the supply pressure $P_2$ by the adjusting valve 15(*a*), generally, the flow rate of the substance to be purified tends to be reduced. According to the filtering device 52 and the purification device 50 having the filtering device 52, two filters $F_{min}$ are arranged in parallel. Therefore, in a case where the filtration areas of the two filters $F_{min}$ are added up, the filtration area becomes larger than in a case where one filter $F_{min}$ is used, and the flow rate of the substance to be purified can be further increased. Consequently, with this purification device, the extent of reduction in flow rate of the substance to be purified that occurs in some cases due to pressure reduction can be further decreased. As a result, the purification efficiency of the substance to be purified is further improved.

In the filtering device 52, the filter unit 12(*a*) accommodates the filter cartridge having the filter $F_{max}$, and the filter units 51(*a*) and 51(*b*) accommodate filter cartridges each having the filter $F_{min}$. However, the filtering device is not limited thereto. The filter unit 12(*a*) may accommodate a filter cartridge having the filter $F_{min}$, and the filter units 51(*a*) and 51(*b*) may accommodate filter cartridges each having the filter $F_{max}$. In this case, a substance to be purified is supplied to the filter $F_{min}$ at the supply pressure $P_2$ (MPa) and filtered. Then, the substance to be purified filtered through the filter $F_{min}$ is adjusted by the adjusting valve 15(*a*) in terms of the supply pressure, then supplied to the filter $F_{min}$ at the supply pressure $P_1$ (MPa) higher than the supply pressure $P_2$, and filtered.

Second Modification Example of First Embodiment of Chemical Liquid Purification Method A second modification example of the chemical liquid manufacturing method according to the first embodiment of the present invention is a modification example of the chemical liquid purification method of filtering a purified substance by using a filtering device in which at least one kind of filter among two or more kinds of filters is constituted with two filters arranged in parallel. Hereinafter, the same items as those in the first embodiment or the first modification example of the first embodiment will not be described.

Figure 6:
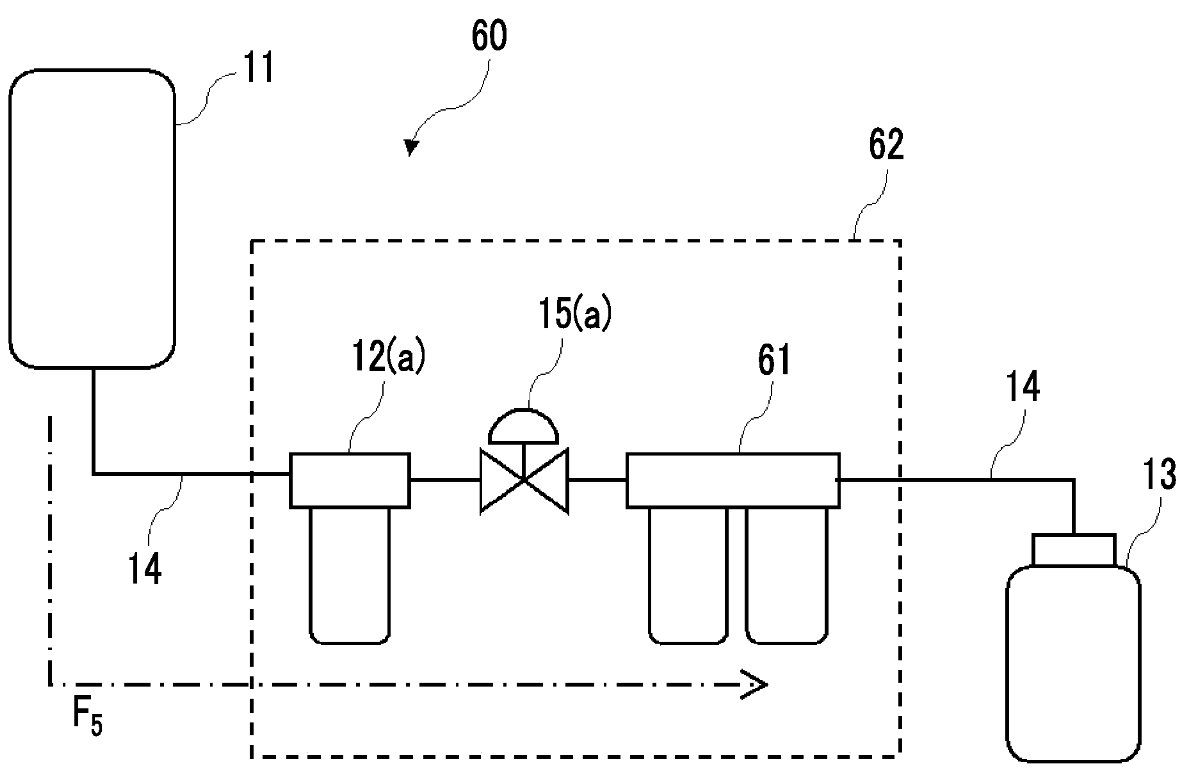
FIG. 6 is a schematic view of a typical purification device that can perform a second modification example of the chemical liquid purification method according to the first embodiment of the present invention.

FIG. 6 is a schematic view of a typical purification device that can perform the chemical liquid purification method according to the present embodiment. A purification device 60 has a manufacturing tank 11, a filtering device 62, and a filling device 13. These units are connected to each other through a pipe line 14.

The filtering device 62 has filter units 12(*a*) and 61 that are connected to each other through the pipe line 14. An adjusting valve 15(*a*) is disposed on a secondary side of the filter unit 12(*a*).

In the filtering device 62, the filter unit 61 is formed such that it can accommodate two filters. The filter unit 61 accommodates two filters $F_{min}$. Furthermore, the filter unit 12(*a*) accommodates a filter $F_{max}$.

Figure 7:
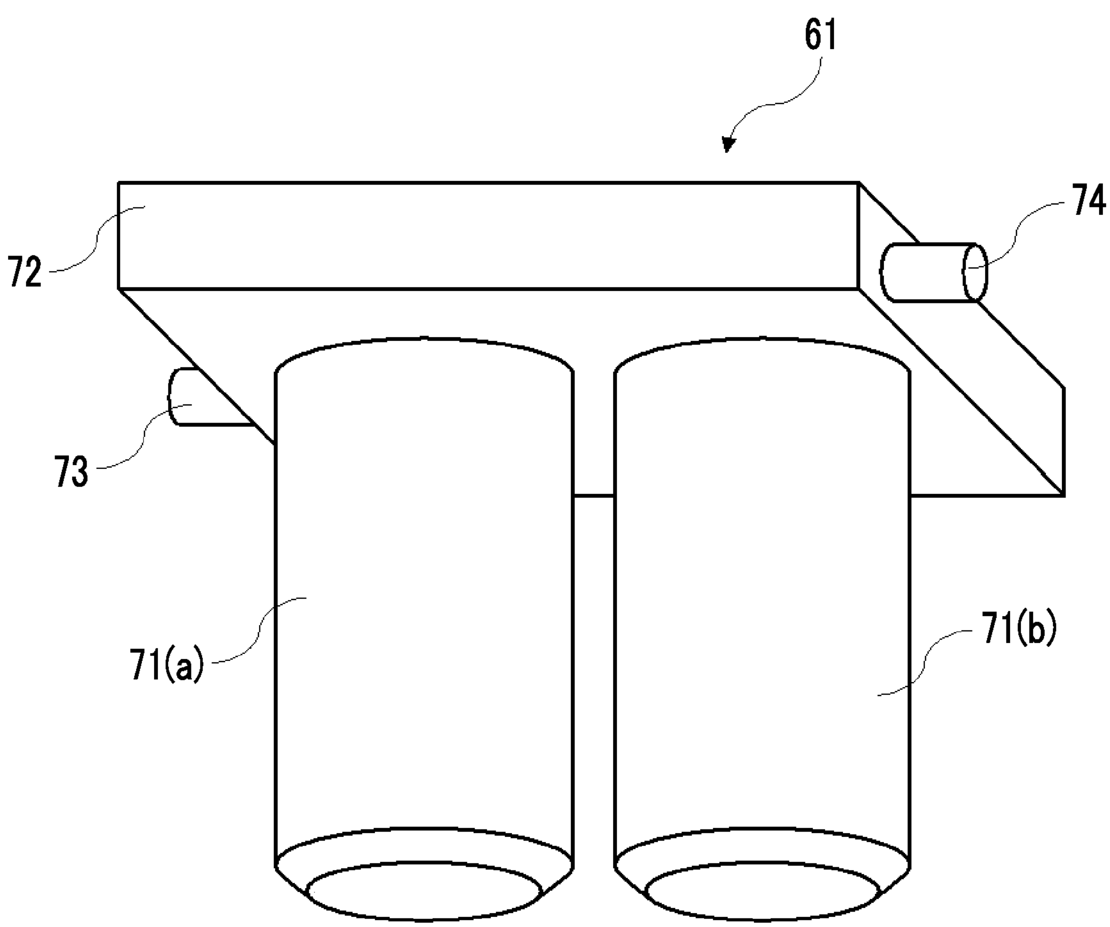
FIG. 7 is a perspective view of a filter unit.

FIG. 7 is a perspective view of the filter unit 61. The filter unit 61 has a housing constituted with bodies 71(*a*) and 71(*b*) and a lid 72 and a filter accommodated in the housing that is not shown in the drawing. A liquid inlet 73 and a liquid outlet 74 are disposed on the lid 72.

Although the filter unit 61 shown in FIG. 7 has the bodies 71(*a*) and 71(*b*) and the lid 72, the bodies and the lid may be constituted as an integral unit.

Figure 8:
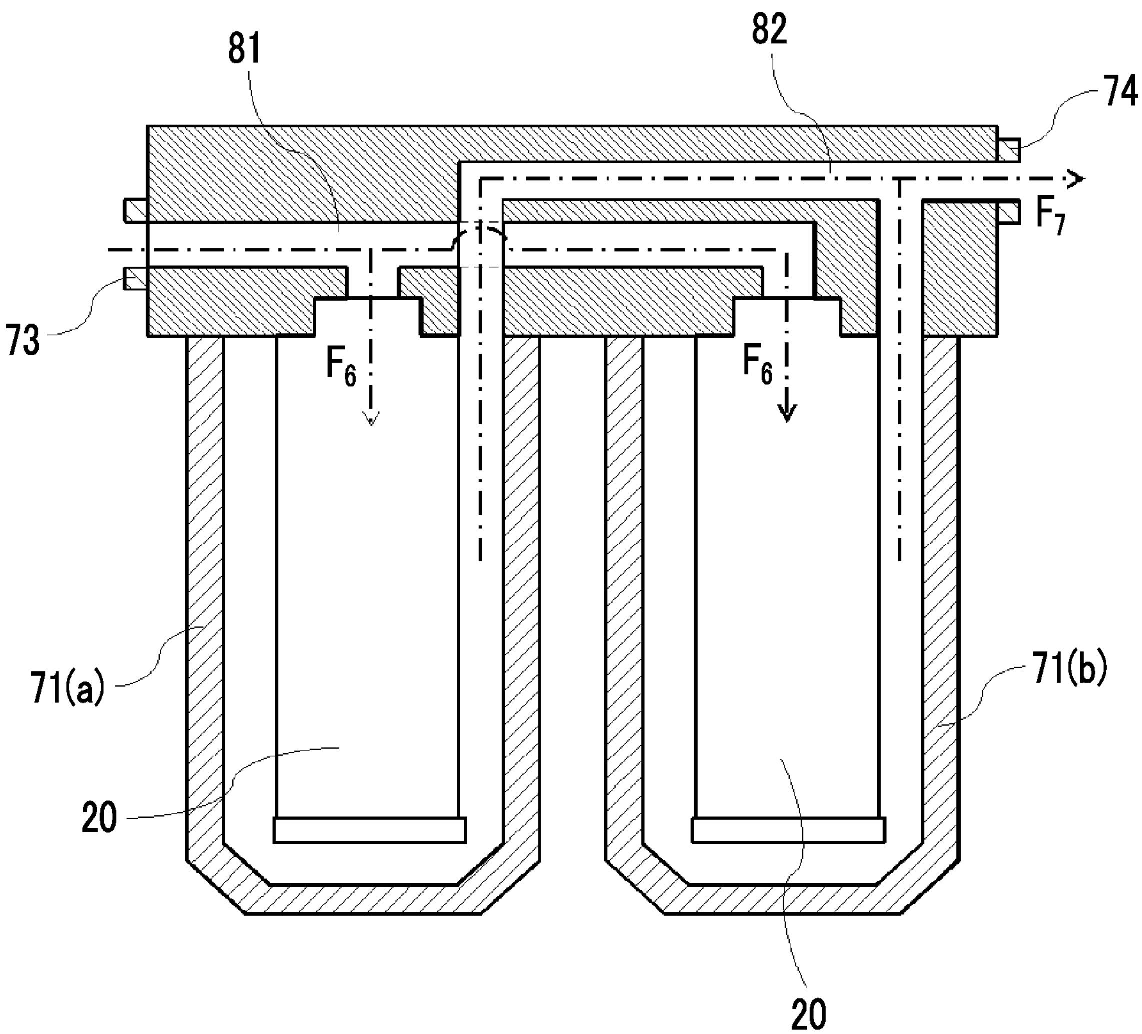
FIG. 8 is a partial cross-sectional view of the filter unit.

FIG. 8 is a partial cross-sectional view of the filter unit 61. The filter unit 61 comprises the liquid inlet 73 and the liquid outlet 74 on the lid 72. The liquid inlet 73 is connected to an internal pipe line 81, and the liquid outlet 74 is connected to an internal pipe line 82. The flow of a substance to be purified is indicated by $F_6$ and $F_7$. The substance to be purified having flown into the filter unit from the liquid inlet 73 flows into the interior of the body 71(*a*) or 71 (*b*) through the internal pipe line 81 provided in the interior of the lid 72, passes through the filter from the core of the filter, and flows into the outer surface. In this process, the substance to be purified is purified (along the flow indicated by $F_6$ in the drawing).

The purified substance to be purified having flown out to the outer surface passes through the internal pipe line 82 and taken out of the liquid outlet 74 (along the flow indicated by $F_7$ in the drawing).

Examples of the filter unit described above include "FHA-02" and "FHA-04" manufactured by White Knight Fluid Handling, Inc., and the like.

In the filtering device 62, the filter unit 12(*a*) accommodates the filter $F_{max}$, and the filter unit 61 accommodates two filters $F_{min}$. However, the filtering device is not limited thereto. The filter unit 12(*a*) may accommodate the filter $F_{min}$, and the filter unit 61 may accommodate two filters $F_{max}$.

Particularly, in view of more efficiently obtaining a chemical liquid having further improved effects of the present invention, it is preferable that at least two filters $F_{min}$ are arranged in parallel. A substance to be purified is supplied to the filter $F_{min}$ at a lower supply pressure $P_2$. In a case where two filters $F_{min}$ are arranged in parallel, the filtering speed can be increased, and the substance to be purified can be more efficiently purified.

In the filtering device 62, the filter unit 61 accommodates two filters. However, the filtering device is not limited thereto, and the filter unit may accommodates three or more filters. In this case, it is preferable that all the filters accommodated in the filter unit 61 are the same type of filters.

Furthermore, in the filtering device 62, instead of the filter unit 12(*a*), the same filter unit as the filter unit 61 may be used.

Second Embodiment of Chemical Liquid Purification Method

The chemical liquid purification method according to a second embodiment of the present invention is a chemical liquid purification method for obtaining a chemical liquid by filtering a substance to be purified containing an organic solvent by using three or more kinds of filters having different pore sizes. In the description of the chemical liquid purification method according to the present embodiment, the matters that are not specifically described are the same as those in the first embodiment.

[Purification Device]

Figure 9:
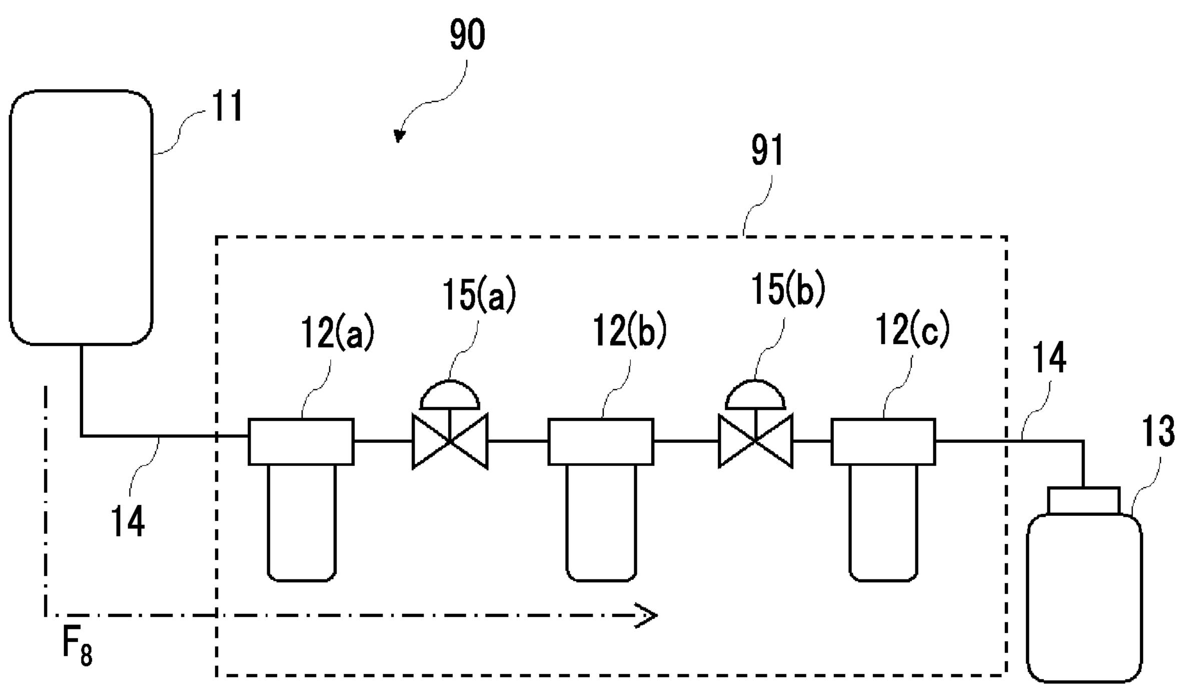
FIG. 9 is a schematic view of a typical purification device that can perform the chemical liquid purification method according to a second embodiment of the present invention.

FIG. 9 is a schematic view of a typical purification device that can perform the chemical liquid purification method according to the present embodiment. A purification device 90 has a manufacturing tank 11, a filtering device 91, and a filling device 13. These units are connected to each other through a pipe line 14.

The filtering device 91 includes filter units 12(*a*), 12(*b*), and 12(*c*) that are connected to each other through the pipe line 14. An adjusting valve 15(*a*) is disposed between the filter units 12(*a*) and 12(*b*), and an adjusting valve 15(*b*) is disposed between the filter units 12(*b*) and 12(*c*).

In FIG. 9, a substance to be purified is stored in the manufacturing tank 11. Then, a pump not shown in the drawing that is disposed in the pipe line is operated, and the substance to be purified is sent to the filtering device 91 from the manufacturing tank 11 through the pipe line 14. The transport direction of the substance to be purified is indicated by $F_8$ in FIG. 9.

Each of the filter units 12(*a*), 12(*b*), and 12(*c*) accommodates a filter in the interior thereof, and has a function of filtering the substance to be purified supplied through the pipe line. In the filtering device 91, the filter unit 12(*a*) accommodates a filter $F_{max}$ having a maximum pore size $X_1$ (nm), the filter unit 12(*c*) accommodates a filter $F_{min}$ having a minimum pore size $X_2$ (nm), and the filter unit 12(*b*) accommodates a filter $F_m$id having a pore size $X_3$ (nm). $X_1$, $X_2$, and $X_3$ satisfy $X_2<X_3<X_1$.

In a case where the pump is operated, the substance to be purified is supplied to the filter unit 12(*a*) at a supply pressure $P_1$ (MPa) and filtered. The substance to be purified filtered through the filter unit 12(*a*) is decompressed by the adjusting valve 15(*a*) and supplied to the filter unit 12(*b*) at a supply pressure $P_3$ (MPa) less than the supply pressure $P_1$. The substance to be purified filtered through the filter unit 12(*b*) is decompressed by the adjusting valve 15(*b*) and supplied to the filter unit 12(*c*) at a supply pressure $P_2$ (MPa) less than the supply pressure $P_3$. The chemical liquid filtered through the filter unit 12(*c*) is transported through the pipe line 14 and fills up a container by the filling device 13.

In view of obtaining a chemical liquid having further improved defect inhibition performance, it is preferable that the size relationship among the pore sizes of the filters coincides with a magnitude relationship among the supply pressures of the substance to be purified supplied to the filters. In other words, in a case where $X_1$, $X_2$, and $X_3$ satisfy $X_2<X_3<X_1$ as the size relationship among the pore sizes of the filters, it is preferable that $P_1$, $P_2$, and $P_3$ satisfy $P_2<P_3$ and $P_3<P_1$.

The filtering device 91 includes three filter units that each accommodate a filter cartridge, and each of the filter cartridges has three filters with different pore sizes. However, the filtering device is not limited thereto. The filtering device may include four or more filter units that each accommodate a filter cartridge, and each of the filter cartridges may have filters with different pore sizes. In this case, it is preferable that the relationship described above is satisfied.

Specifically, the filtering device has i pieces of filter unit (i represents an integer equal to or greater than 4), and each of the filter units accommodates a filter cartridge having filters with pore sizes of $X_1$ (maximum pore size), $X_2$ (minimum pore size), $X_3$, . . . , $X_i$(nm) (the order of filters accommodated and the pore size may not be the same as those described above), and a substance to be purified is supplied to each of the filters at a supply pressure of $P_1$, $P_2$, $P_3$, . . . , $P_i$(MPa). At this time, in a case where the pore sizes satisfy $X_2< \ldots <X_{i-1}<X_i<X_1$ (i represents an integer equal to or greater than 4), it is preferable that the supply pressures satisfy $P_2< \ldots <P_{i-1}<P_i<P_1$ (i represents an integer equal to or greater than 4).

In this case, there is no particular limitation on the order of the filter cartridges accommodated in the filter units in the filtering device. In other words, in the purification device, it is not necessary for the filter cartridges are accommodated such that the pore size of the filters decreases from or toward the primary side.

In view of obtaining a chemical liquid having further improved defect inhibition performance, it is preferable that a filter included in a filter cartridge accommodated in a filter unit on the downmost stream side, that is, a finally used filter has the minimum pore size ($X_2$).

In the purification device 90, by the adjusting valves 15(*a*) and 15(*b*), the supply pressure $P_1$, the supply pressure $P_2$, and the supply pressure $P_3$ are adjusted. However, the filtering device is not limited thereto. The filtering device may be in the form of a device without an adjusting valve in which the supply pressures $P_1$ to $P_3$ are adjusted by the shape and the filtration area of each filter, in the form of a device having a damper instead of the adjusting valves, or in the form of a device obtained by combining the above devices.

The purification device 90 has a constitution in which the substance to be purified filtered through the filter unit 12(*c*) is transported to the filling device 13 and stored in a container. However, the filtering device performing the above purification method is not limited thereto, and may have a constitution in which the substance to be purified filtered through the filter unit 12(*c*) is transported to the manufacturing tank 11 and then passed again through the filter units 12(*a*) to 12(*c*).

From the viewpoint of productivity and from the viewpoint of making it difficult for the impurities and the like entrapped by each filter to be mixed again into the substance to be purified, it is preferable to use a purification method in which each filter is used once. Typically, examples of the purification method in which each filter is used once include a method in which circulation filtration is not performed.

[Chemical Liquid]

It is preferable that the chemical liquid purified by the above purification method is used for manufacturing semiconductor devices. Specifically, it is preferable that the chemical liquid is used for treating organic substances and the like in a wiring forming process (including a lithography step, an etching step, an ion implantation step, a peeling step, and the like) including photolithography. More specifically, the chemical liquid is preferably used as a prewet solution, a developer, a rinsing solution, a peeling solution, a CMP slurry, a rinsing solution used after CMP (p-CMP rinsing solution), and the like.

The rinsing solution can be used for rinsing the edge line of a wafer before and after being coated with a resist solution.

Furthermore, the chemical liquid can be used as a diluent for a resin contained in a composition for forming a resist film (resist composition) used for manufacturing semiconductor devices. That is, the chemical liquid can be used as a solvent for the composition for forming a resist film.

In addition, the chemical liquid may be used by being diluted with another organic solvent and/or water, and the like.

In a case where the chemical liquid is used as a CMP slurry, for example, abrasive grains, an oxidant, and the like may be added to the chemical liquid. Moreover, the chemical liquid can also be used as a solvent for diluting a CMP slurry.

The chemical liquid can be suitably used for other purposes in addition to the manufacturing of semiconductor devices. The chemical liquid can be used as a developer for polyimide, a resist for sensor, and a resist for lens, a rinsing solution, and the like.

In addition, the chemical liquid can also be used as a solvent for medical uses or for washing. Particularly, the chemical liquid can be suitably used for washing containers, piping, substrates (for example, a wafer and glass), and the like.

[Suitable Aspects of Chemical Liquid]

Hereinafter, a suitable aspect of the chemical liquid according to the embodiment of the present invention will be described, but the chemical liquid according to the embodiment of the present invention is not limited thereto.

The suitable aspect of the chemical liquid according to the embodiment of the present invention is a chemical liquid containing an organic solvent, organic impurities, specific metal ions, and specific metal particles.

The chemical liquid contains an organic solvent. The content of the organic solvent in the chemical liquid is not particularly limited. Generally, the content of the organic solvent with respect to the total mass of the chemical liquid is preferably equal to or greater than 99.0% by mass, more preferably equal to or greater than 99.9% by mass, even more preferably equal to or greater than 99.99% by mass, particularly preferably equal to or greater than 99.999% by mass, and most preferably equal to or greater than 99.9998% by mass. One kind of organic solvent may be used singly, or two or more kinds of organic solvents may be used in combination. In a case where two or more kinds of organic solvents are used in combination, the total content thereof is preferably within the above range.

The aspect of the organic solvent is the same as that described above as the organic solvent contained in a substance to be purified.

The chemical liquid may contain metal impurities. The total content of the metal impurities in the chemical liquid is not particularly limited. However, in view of obtaining a chemical liquid having further improved effects of the present invention, the total content of the metal impurities is preferably 0.01 to 100 mass ppt.

The total content described above means the total content of metal ions and metal particles.

Particularly, in view of obtaining a chemical liquid having further improved effects of the present invention, the total content of the specific metal is preferably 0.01 to 100 mass ppt.

The chemical liquid may contain specific metal ions. In a case where the chemical liquid contains one kind of specific metal ions, the content of one kind of the specific metal ions in the chemical liquid with respect to the total mass of the chemical liquid is preferably 1.0 to 100 mass ppt. In a case where the chemical liquid contains two or more kinds of specific metal ions, the content of each of two or more kinds of the specific metal ions in the chemical liquid with respect to the total mass of the chemical liquid is preferably 1.0 to 100 mass ppt.

The chemical liquid may contain specific metal particles. In a case where the chemical liquid contains one kind of specific metal particles, the content of one kind of the specific metal particles in the chemical liquid with respect to the total mass of the chemical liquid is preferably 1.0 to 100 mass ppt. In a case where the chemical liquid contains two or more kinds of specific metal particles, the content of each of two or more kinds of the specific metal particles in the chemical liquid with respect to the total mass of the chemical liquid is preferably 1.0 to 100 mass ppt.

The chemical liquid may contain organic impurities. In a case where the chemical liquid contains one kind of organic impurities, the content of one kind of the organic impurities in the chemical liquid with respect to the total mass of the chemical liquid is preferably 1.0 to 100 mass ppt. In a case where the chemical liquid contains two or more kinds of organic impurities, the content of each of two or more kinds of the organic impurities in the chemical liquid with respect to the total mass of the chemical liquid is preferably 1.0 to 100 mass ppt.

<Container>

The chemical liquid may be temporarily stored in a container until the chemical liquid is used. As the container for storing the chemical liquid, known containers can be used without particular limitation.

As the container storing the chemical liquid, a container for manufacturing semiconductor devices is preferable which has high internal cleanliness and hardly causes elution of impurities.

Examples of the usable container specifically include a "CLEAN BOTTLE" series manufactured by AICELLO CORPORATION, "PURE BOTTLE" manufactured by KODAMA PLASTICS Co., Ltd., and the like, but the container is not limited to these.

As the container, for the purpose of preventing mixing of impurities into the chemical liquid (contamination), it is also preferable to use a multilayer bottle in which the inner wall of the container has a 6-layer structure formed of 6 kinds of resins or a multilayer bottle having a 7-layer structure formed of 6 kinds of resins. Examples of these containers include the containers described in JP2015-123351A.

It is preferable that a liquid contact portion of the container is formed of a nonmetallic material or an elecltropolished metallic material.

As the nonmetallic material, for example, a polyethylene resin, a polypropylene resin, a polyethylene-polypropylene resin, or a fluorine-containing resin such as a perfluororesin is preferable, and a fluorine-containing resin is more preferable because few metal atoms are eluted from this material.

Examples of the fluorine-containing resin include polytetrafluoroethylene (PTFE), a tetrafluoroethylene-perfluoroalkyl vinyl ether copolymer (PFA), a polytetrafluoroethylene-hexafluoropropylene copolymer resin (FEP), a polytetrafluoroethylene-ethylene copolymer resin (ETFE), a chlorotrifluoroethylene-ethylene copolymer resin (ECTFE), a vinylidene fluoride resin (PVDF), a chlorotrifluoroethylene copolymer resin (PCTFE), a vinyl fluoride resin (PVF), and the like.

As the fluorine-containing resin, polytetrafluoroethylene, a tetrafluoroethylene.perfluoroalkyl vinyl ether copolymer, or a polytetrafluoroethylene-hexafluoropropylene copolymer resin is preferable.

In a case where a container in which the liquid contact portion is formed of polyfluorocarbon is used, the occurrence of a problem such as elution of an ethylene or propylene oligomer can be further inhibited than in a case where a container, in which the liquid contact portion is formed of a polyethylene resin, a polypropylene resin, or a polyethylene-polypropylene resin, is used.

Specific examples of the container in which the liquid contact portion is formed of polyfluorocarbon include FluoroPure PFA composite drum manufactured by Entegris, Inc., and the like. Furthermore, it is possible to use the containers described on p. 4 in JP1991-502677A (JP-H03-502677A), p.

3 in WO2004/016526A, p. 9 and p. 16 in WO99/046309A, and the like. In a case where the nonmetallic material is used for the liquid contact portion, it is preferable to inhibit the elution of the nonmetallic material into the chemical liquid.

As the metallic material, known materials can be used without particular limitation.

Examples of the metallic material include a metallic material in which the total content of chromium and nickel with respect to the total mass of the metallic material is greater than 25% by mass. The total content of chromium and nickel is more preferably equal to or greater than 30% by mass. The upper limit of the total content of chromium and nickel in the metallic material is not particularly limited, but is preferably equal to or smaller than 90% by mass in general.

Examples of the metallic material include stainless steel, carbon steel, alloy steel, nickel-chromium-molybdenum steel, chromium steel, chromium-molybdenum steel, manganese steel, a nickel-chromium alloy, and the like.

As the stainless steel, known stainless steel can be used without particular limitation. Among these, an alloy with a nickel content equal to or higher than 8% by mass is preferable, and austenite-based stainless steel with a nickel content equal to or higher than 8% by mass is more preferable. Examples of the austenite-based stainless steel include Steel Use Stainless (SUS) 304 (Ni content: 8% by mass, Cr content: 18% by mass), SUS304L (Ni content: 9% by mass, Cr content: 18% by mass), SUS316 (Ni content: 10% by mass, Cr content: 16% by mass), SUS316L (Ni content: 12% by mass, Cr content: 16% by mass), and the like.

As the nickel-chromium alloy, known nickel-chromium alloys can be used without particular limitation. Among these, a nickel-chromium alloy is preferable in which the nickel content is 40% to 75% by mass and the chromium content is 1% to 30% by mass with respect to the total mass of the metallic material.

Examples of the nickel-chromium alloy include HASTELLOY (trade name, the same is true for the following description), MONEL (trade name, the same is true for the following description), INCONEL (trade name, the same is true for the following description), and the like. More specifically, examples thereof include HASTELLOY C-276 (Ni content: 63% by mass, Cr content: 16% by mass), HASTELLOY C (Ni content: 60% by mass, Cr content: 17% by mass), HASTELLOY C-22 (Ni content: 61% by mass, Cr content: 22% by mass), and the like.

Furthermore, if necessary, the nickel-chromium alloy may further contain boron, silicon, tungsten, molybdenum, copper, cobalt, and the like in addition to the aforementioned alloy.

As the method for electropolishing the metallic material, known methods can be used without particular limitation. For example, it is possible to use the methods described in paragraphs "0011" to "0014" in JP2015-227501A, paragraphs "0036" to "0042" in JP2008-264929A, and the like.

Presumably, in a case where the metallic material is electropolished, the chromium content in a passive layer on the surface thereof may become higher than the chromium content in the parent phase. Presumably, for this reason, from the distillation column in which the liquid contact portion is formed of an electropolished metallic material, the metal impurity containing metal atoms may not easily flow into the organic solvent, and hence an organic solvent having undergone distillation with a reduced impurity content can be obtained.

The metallic material may have undergone buffing. As the buffing method, known methods can be used without particular limitation. The size of abrasive grains used for finishing the buffing is not particularly limited, but is preferably equal to or smaller than #400 because such grains make it easy to further reduce the surface asperity of the metallic material. The buffing is preferably performed before the electropolishing.

The content mass ratio of a content of Cr to a content of Fe (hereinafter, referred to as "Cr/Fe" as well) in the stainless steel forming the liquid contact portion of the container is not particularly limited. Generally, Cr/Fe is preferably 0.5 to 4. Particularly, in view of making it more difficult for the impurity metals and/or the organic impurities to be eluted into the chemical liquid that will be stored in the container, Cr/Fe is more preferably higher than 0.5 and lower than 3.5. In a case where Cr/Fe is higher than 0.5, the elution of a metal from the interior of the container can be inhibited. In a case where Cr/Fe is lower than 3.5, the exfoliation of the inner container that causes particles and the like do not easily occur.

The method for adjusting Cr/Fe in the stainless steel is not particularly limited, and examples thereof include a method of adjusting the content of Cr atoms in the stainless steel, a method of performing electropolishing such that the content of chromium in a passive layer on a polished surface becomes greater than the content of chromium in the parent phase, and the like.

It is preferable that the interior of the aforementioned container is washed before the solution is stored into the container. As a liquid used for washing, the washing solution described above, the chemical liquid itself, or a liquid obtained by diluting the chemical liquid is preferable. After being manufactured, the chemical liquid may be bottled using a container such as a gallon bottle or a quart bottle, transported, and stored. The gallon bottle may be formed of a glass material or other materials.

In order to prevent the change of the components in the solution during storage, purging may be performed in the interior of the container by using an inert gas (nitrogen, argon, or the like) having a purity equal to or higher than 99.99995% by volume. Particularly, a gas with small moisture content is preferable. The temperature at the time of transport and storage may be room temperature. However, in order to prevent alteration, the temperature may be controlled within a range of −20° C. to 30° C.

EXAMPLES

Hereinafter, the present invention will be more specifically described based on examples. The materials, the amount and proportion of the materials used, the details of treatments, the procedure of treatments, and the like shown in the following examples can be appropriately modified as long as the gist of the present invention is maintained. Accordingly, the scope of the present invention is not limited to the following examples.

Regarding the measurement of various components, in a case where the amount of a component as a measurement target is outside the range that can be measured using each measurement device (for example, in a case where the amount of a component is equal to or smaller than the measurement limit), the measurement target is measured after being concentrated or diluted using a glass tool thoroughly washed with the measurement target (a substance to be purified or a chemical liquid).

Example 1

The filtering device shown in FIG. 1 was prepared. A filter cartridge having a filter with a pore size of 15 nm formed of polytetrafluoroethylene was accommodated in a filter unit on a primary side (described as first filter unit in Table 1). Furthermore, a filter cartridge having a filter with a pore size of 3.0 nm formed of ultra-high-molecular-weight polyethylene was accommodated in a filter unit on a secondary side (described as second filter unit in Table 1).

Then, 100 L of commercial PGMEA (corresponding to a substance to be purified) was prepared and stored in a manufacturing tank. Thereafter, a pump was operated such that the substance to be purified was transported to the filter unit on the primary side from the manufacturing tank. At this time, the supply pressure of the substance to be purified supplied to the filter unit on the primary side was adjusted to 0.1 MPa. In addition, the supply pressure applied to the filter unit on the secondary side was adjusted to 0.015 MPa.

Table 1 shows the material and the pore size of the filters included in the filter cartridges accommodated in the respective filter units. Table 1 also shows the supply pressure of the substance to be purified supplied to each filter and shows whether or not circulation filtration was performed (column of "Circulation" in Table 1).

The above filter was washed by being immersed in PGMEA (purity: 99.9% by mass) for each filter cartridge.

The filter was taken out of each filter cartridge having been washed, and an elution test was performed using PGMEA (purity: 99.9% by mass) as a test solvent. During the elution test, first, under the condition that the mass ratio of test solvent (unit:g)/filter (unit:g) becomes 1.0 at a liquid temperature of 25° C., the filter taken out of the filter cartridge was immersed for 48 hours in the test solvent at a liquid temperature of 25° C.

Then, the filter was pulled out of the test solvent. Subsequently, the content of organic impurities, specific metal ions, and specific metal particles contained in the test solvent before and after the immersion were measured by type, and the total increase thereof was calculated.

The type and the content of the organic solvent, the organic impurities, the specific metal ions, and the specific metal particles were measured by the following method.

[Type and Content of Organic Solvent and Organic Impurities]

The type and the content of the organic solvent and the organic impurities in the test solvent were measured using a gas chromatography mass spectrometer (trade name: "GCMS-2020", Shimadzu Corporation) under the following conditions.

Capillary column: InertCap 5MS/NP 0.25 mmI.D.×30 m df=0.25 μm

Sample introduction method: split 75 kPa constant pressure

Vaporizing chamber temperature: 230° C.

Column oven temperature: 80° C. (2 min)-500° C. (13 min) heating rate 15° C./min Carrier gas: helium Septum purge flow rate: 5 mL/min Split ratio: 25:1

Interface temperature: 250° C.

Ion source temperature: 200° C.

Measurement mode: Scan m/z=85~1,000

Amount of sample introduced: 1 μL

[Content of Metal Impurities by Type]

The content of metal impurities (metal ions and metal particles) in the test solvent was measured by type by using ICP-MS ("Agilent 8800 triple quadrupole ICP-MS (for semiconductor analysis, option #200)") under the following conditions.

As a sample introduction system, a quartz torch, a coaxial perfluoroalkoxyalkane (PFA) nebulizer (for self-suction), and a platinum interface cone were used. The measurement parameters of cool plasma conditions are as below.

Output of Radio Frequency (RF) (W): 600

Flow rate of carrier gas (L/min): 0.7

Flow rate of makeup gas (L/min): 1

Sampling depth (mm): 18

Table 1 shows the results of the elution test for the filter accommodated in each filter unit (an increase of each component in the test solvent before and after the immersion). The column of "Type" of organic impurities shows the type (corresponding to any of Formula (1) to Formula (7)) of organic impurities detected and the increase of the organic impurities. Table 1 also shows the increase of the metal ions and the metal particles by type and the total increase thereof.

Examples 2 to 81 (Except for Examples 37, 53, and 75) and Comparative Examples 1 to 6

Chemical liquids were obtained in the same manner as in Example 1, except that the filters described in the columns in Table 1 were used as a first filter and a second filter, the supply pressure applied to each filter was set as described in Table 1, and the substance to be purified described in 1 was used.

Examples 37, 52, and 75

Chemical liquids of Examples 37, 52, and 75 were obtained in the same manner as in Example 1, except that in the filtering device shown in Table 1, the pipe line of the downstream of the filter unit accommodating the second filter was branched such that the substance to be purified could be sent back to the manufacturing tank and subjected to circulation filtration, and the type of the filters, the conditions, and the like were set as described in Table 1.

Examples 82 to 126

Chemical liquids were obtained in the same manner as in Example 1, except that by using the filtering device shown in FIG. 5, the first filter, the second filter, and the third filter were accommodated in each filter unit such that the filters are arranged in this order from the primary side, the supply pressure of the substance to be purified supplied to each filter was set as described in Table 1, and the substance to be purified containing the organic solvent described in Table 1 was used. The elution test was performed for each filter. The results are shown in Table 1.

Description of Abbreviations in Table 1

The abbreviations in Table 1 mean the following.

(Material of Filter)

PTFE: polytetrafluoroethylene

PTFE (with modified surface): polytetrafluoroethylene with surface having undergone hydrophilization treatment UPE: ultra-high-molecular-weight polyethylene HDPE: high density polyethylene PP: polypropylene
Nylon: nylon
UPE (with modified surface): polyethylene with surface having undergone hydrophilization treatment
PTFE (IEX): polytetrafluoroethylene filter with surface into which sulfonic acid group is introduced by surface treatment
(Type of Washing Solution and Organic Solvent)
PGMEA: propylene glycol monomethyl ether acetate
nBA: butyl acetate
CyHe: cyclohexanone
MIBC: 4-methyl-2-pentanol
iAA: isoamyl acetate
PGME: propylene glycol monoethyl ether
IPA: isopropanol

[Evaluation of Defect Inhibition Performance of Chemical Liquid]

The defect inhibition performance of each of the chemical liquids was evaluated by the following method. The results are shown in Table 1.

First, a silicon oxide film substrate having a diameter of 300 mm was prepared.

Then, by using a wafer surface inspection device (SP-5; manufactured by KLA-Tencor Corporation), the number of particles having a diameter equal to or greater than 19 nm that were present on the substrate was counted (the counted number was adopted as an initial value). Thereafter, the substrate was set in a spin jetting device, and while the substrate was being rotated, each of the chemical liquids was jetted to the surface of the substrate at a flow rate of 1.5 L/min. Subsequently, the substrate was spin-dried.

Then, by using the device (SP-5), the number of particles present on the substrate after being coated with the chemical liquid was counted (the counted number was adopted as a counted value). Thereafter, a difference between the initial value and the counted value (counted value−initial value) was calculated. Based on the following standards, the obtained results were evaluated. The results are shown in the column of "Defect inhibition performance" in Table 1.

"AAA": The difference between the initial value of the number of particles and the counted value of the number of particles was less than 50.

"AA": The difference between the initial value of the number of particles and the counted value of the number of particles was greater than 50 and equal to or smaller than 100.

"A": The difference between the initial value of the number of particles and the counted value of the number of particles was greater than 100 and equal to or smaller than 200.

"B": The difference between the initial value of the number of particles and the counted value of the number of particles was greater than 200 and equal to or smaller than 300.

"C": The difference between the initial value of the number of particles and the counted value of the number of particles was greater than 300 and equal to or smaller than 400.

"D": The difference between the initial value of the number of particles and the counted value of the number of particles was greater than 400 and equal to or smaller than 500.

"E": The difference between the initial value of the number of particles and the counted value of the number of particles was greater than 500.

The filter unit included in the purification device used for purifying each of the chemical liquids according to examples and comparative examples, whether or not circulation filtration was performed, the washing solution used for washing the filter cartridge, the result of the elution test for each filter, the type of the organic solvent contained in the substance to be purified used, and the obtained results of the evaluation of the defect inhibition performance of the chemical liquid are described in the corresponding lines in 6 tables including Table 1-1-1 to Table 1-1-6, the corresponding lines in 6 tables including Table 1-2-1 to Table 1-2-6, the corresponding lines in 6 tables including Table 1-3-1 to Table 1-3-6, and the corresponding lines in 6 tables including Table 1-4-1 to Table 1-4-6.

How to read the tables will be described below. For example, in the case of the chemical liquid purification method of Example 1, from the primary side, the first filter having a pore size of 15 nm made of PTFE was accommodated in the first filter unit in the purification device used. To the first filter, the substance to be purified, which will be described later, was supplied at a pressure of 0.1 MPa. Then, the second filter having a pore size of 3 nm made of UPE was accommodated in the second filter unit. To the second filter, the substance to be purified, which will be described later, was supplied at a pressure of 0.015 MPa. In the chemical liquid purification method of Example 1, circulation filtration was not performed, and the filters were washed with PGMEA in advance. Regarding the results of the elution test for each filter, the increase of components in the test solvent before and after immersion is as below. By the first filter, the organic impurities represented by Formula (1) increased by 186 mass ppm, Fe ions increased by 1.2 mass ppb, Na ions increased by 1.6 mass ppb, Ca ions increased by 1.0 mass ppb, Al ions increased by 0.6 mass ppb, K ions increased by 0.9 mass ppb, the total increase of the specific metal ions was 6.2 mass ppb, Fe-containing metal particles increased by 0.6 mass ppb, Na-containing metal particles increased by 0.8 mass ppb, Ca-containing metal particles increased by 0.9 mass ppb, Al-containing metal particles increased by 0.3 mass ppb, K-containing metal particles increased by 0.5 mass ppb, and the total increase of the specific metal particles was 3.1 mass ppb. By the second filter, the organic impurities represented by Formula (1) increased by 177 mass ppm, Fe ions increased by 1.0 mass ppb, Na ions increased by 1.3 mass ppb, Ca ions increased by 1.5 mass ppb, Al ions increased by 0.5 mass ppb, K ions increased by 0.8 mass ppb, the total increase of the specific metal ions was 5.1 mass ppb, Fe-containing metal particles increased by 0.5 mass ppb, Na-containing metal particles increased by 0.6 mass ppb, Ca-containing metal particles increased by 0.7 mass ppb, Al-containing metal particles increased by 0.2 mass ppb, K-containing metal particles increased by 0.4 mass ppb, and the total increase of the specific metal particles was 2.4 mass ppb. The substance to be purified that was purified using the purification device described above contained PGMEA as an organic solvent, and the result of the evaluation of the defect inhibition performance of the obtained chemical liquid was "A".

For other examples and comparative examples, the tables can be read as described above.

TABLE 1

| Table 1-1-1 | Filter unit (first to third filter units are arranged in this order from primary side) | | | | | |
|---|---|---|---|---|---|---|
| | First filter unit (accommodating first filter) | | | Second filter unit (accommodating second filter) | | |
| | Material of filter | Supply pressure (MPa) | Pore size (nm) | Material of filter | Supply pressure (MPa) | Pore size (nm) |
| Example 1 | PTFE | 0.1 | 15 | UPE | 0.015 | 3 |
| Example 2 | PTFE | 0.1 | 15 | UPE | 0.015 | 3 |
| Example 3 | PTFE | 0.1 | 15 | UPE | 0.015 | 3 |
| Example 4 | PTFE | 0.1 | 15 | UPE | 0.015 | 3 |
| Example 5 | PTFE | 0.1 | 15 | UPE | 0.015 | 3 |
| Example 6 | PTFE | 0.1 | 15 | UPE | 0.015 | 3 |
| Example 7 | PTFE | 0.1 | 15 | UPE | 0.015 | 3 |
| Example 8 | PTFE | 0.1 | 10 | UPE | 0.015 | 9.5 |
| Example 9 | PTFE | 10 | 405 | UPE | 0.015 | 2 |
| Example 10 | PTFE | 0.1 | 15 | UPE | 0.015 | 3 |
| Example 11 | PTFE | 0.1 | 15 | UPE | 0.015 | 3 |
| Example 12 | PTFE | 0.1 | 15 | UPE | 0.015 | 3 |
| Example 13 | PTFE | 0.1 | 15 | UPE | 0.015 | 3 |
| Example 14 | PTFE | 0.1 | 15 | UPE | 0.015 | 3 |
| Example 15 | PTFE | 0.1 | 15 | UPE | 0.015 | 3 |
| Example 16 | PTFE | 0.1 | 220 | UPE | 0.015 | 2 |
| Example 17 | PTFE | 0.1 | 15 | UPE | 0.015 | 3 |
| Example 18 | PTFE | 0.1 | 15 | UPE | 0.015 | 0.9 |
| Example 19 | PTFE | 0.1 | 40 | UPE | 0.015 | 18 |
| Example 20 | PTFE | 0.1 | 9 | UPE | 0.015 | 3 |
| Example 21 | PTFE | 0.15 | 205 | UPE | 0.015 | 3 |
| Example 22 | PTFE | 10 | 25 | UPE | 0.04 | 2 |
| Example 23 | PTFE | 1 | 15 | UPE | 0.04 | 10 |
| Example 24 | PTFE | 0.1 | 17 | UPE | 0.015 | 11 |
| Example 25 | PTFE | 0.03 | 15 | UPE | 0.0008 | 3 |
| Example 26 | PTFE | 0.03 | 15 | UPE | 0.002 | 3 |
| Example 27 | UPE | 0.015 | 3 | PTFE | 0.1 | 15 |
| Example 28 | PTFE | 0.1 | 15 | PTFE | 0.015 | 3 |
| Example 29 | PTFE | 0.1 | 15 | PESU | 0.015 | 3 |
| Example 30 | PTFE | 0.3 | 15 | UPE | 0.015 | 3 |
| Example 31 | PTFE | 0.3 | 10 | UPE | 0.015 | 5 |
| Example 32 | PTFE | 0.02 | 15 | UPE | 0.015 | 3 |
| Examnle 33 | PTFE | 0.05 | 15 | UPE | 0.015 | 3 |

TABLE 2

| Table 1-1-2 | Filter unit (first to third filter units are arranged in this order from primary side) Third filter unit (accommodating third filter) | | | | | Elution test (increase in each component in test solvent before and after immersion) Result of elution test for first filter Organic impurities | |
|---|---|---|---|---|---|---|---|
| | Material of filter | Supply pressure (MPa) | Pore size (nm) | Circulation | Washing solution | Type | Content (mass ppm) |
| Example 1 | | | | N/A | PGMEA | 1 | 186 |
| Example 2 | | | | N/A | PGMEA | 1 | 9 |
| Example 3 | | | | N/A | PGMEA | 1 | 7 |
| Example 4 | | | | N/A | PGMEA | 1 | 9 |
| Example 5 | | | | N/A | PGMEA | 1 | 9 |
| Example 6 | | | | N/A | PGMEA | 1 | 7 |
| Example 7 | | | | N/A | PGMEA | 1 | 8 |
| Example 8 | | | | N/A | PGMEA | 1 | 10 |
| Example 9 | | | | N/A | PGMEA | 1 | 8 |
| Example 10 | | | | N/A | PGMEA | 1 | 178 |
| Example 11 | | | | N/A | PGMEA | 1 | 196 |
| Example 12 | | | | N/A | PGMEA | 1 | 187 |
| Example 13 | | | | N/A | PGMEA | 1 | 214 |
| Example 14 | | | | N/A | PGMEA | 1 | 174 |
| Example 15 | | | | N/A | PGMEA | 1 | 192 |
| Example 16 | | | | N/A | PGMEA | 1 | 10 |
| Example 17 | | | | N/A | PGMEA | 1 | 520 |
| Example 18 | | | | N/A | PGMEA | 1 | 10 |
| Example 19 | | | | N/A | PGMEA | 1 | 10 |
| Example 20 | | | | N/A | PGMEA | 1 | 8 |
| Example 21 | | | | N/A | PGMEA | 1 | 9 |

TABLE 2-continued

| Table 1-1-2 | Filter unit (first to third filter units are arranged in this order from primary side) Third filter unit (accommodating third filter) Material of filter | Supply pressure (MPa) | Pore size (nm) | Circulation | Washing solution | Elution test (increase in each component in test solvent before and after immersion) Result of elution test for first filter Organic impurities Type | Content (mass ppm) |
|---|---|---|---|---|---|---|---|
| Example 22 | | | | N/A | PGMEA | 1 | 11 |
| Example 23 | | | | N/A | PGMEA | 1 | 9 |
| Example 24 | | | | N/A | PGMEA | 1 | 11 |
| Example 25 | | | | N/A | PGMEA | 1 | 11 |
| Example 26 | | | | N/A | PGMEA | 1 | 11 |
| Example 27 | | | | N/A | PGMEA | 1 | 11 |
| Example 28 | | | | N/A | PGMEA | 1 | 9 |
| Example 29 | | | | N/A | PGMEA | 1 | 10 |
| Example 30 | | | | N/A | PGMEA | 1 | 279 |
| Example 31 | | | | N/A | PGMEA | 1 | 240 |
| Example 32 | | | | N/A | PGMEA | 1 | 248 |
| Example 33 | | | | N/A | PGMEA | 1 | 217 |

TABLE 3

| | Elution test (increase in each component in test solvent before and after immersion) Result of elution test for first filter | | | | | | | | | | | |
|---|---|---|---|---|---|---|---|---|---|---|---|---|
| | Metal ions (mass ppb) | | | | | | Metal particles (mass ppb) | | | | | |
| Table 1-1-3 | Fe | Na | Ca | Al | K | Total | Fe | Na | Ca | Al | K | Total |
| Example 1 | 1.2 | 1.6 | 1.9 | 0.6 | 0.9 | 6.2 | 0.6 | 0.8 | 0.9 | 0.3 | 0.5 | 3.1 |
| Example 2 | 5.0 | 6.3 | 7.5 | 2.5 | 3.8 | 25.1 | 1.6 | 2.0 | 2.4 | 0.8 | 1.2 | 8.0 |
| Example 3 | 1.4 | 1.8 | 2.1 | 0.7 | 1.1 | 7.1 | 1.0 | 1.3 | 1.5 | 0.5 | 0.8 | 5.1 |
| Example 4 | 1.2 | 1.5 | 1.8 | 0.6 | 0.9 | 6.0 | 3.0 | 3.8 | 4.5 | 1.5 | 2.3 | 15.1 |
| Example 5 | 1.8 | 2.3 | 2.7 | 0.9 | 1.4 | 9.1 | 0.6 | 0.8 | 0.9 | 0.3 | 0.5 | 3.1 |
| Example 6 | 2.6 | 3.3 | 3.9 | 1.3 | 2.0 | 13.1 | 0.4 | 0.5 | 0.6 | 0.2 | 0.3 | 2.0 |
| Example 7 | 1.8 | 2.3 | 2.7 | 0.9 | 1.4 | 9.1 | 2.8 | 3.5 | 4.2 | 1.4 | 2.1 | 14.0 |
| Example 8 | 1.6 | 2.0 | 2.4 | 0.8 | 1.2 | 8.0 | 0.8 | 1.0 | 1.2 | 0.4 | 0.6 | 4.0 |
| Example 9 | 0.5 | 0.6 | 0.7 | 0.2 | 0.4 | 2.4 | 0.2 | 0.3 | 0.4 | 0.1 | 0.2 | 1.2 |
| Example 10 | 12.2 | 9.5 | 4.3 | 3.4 | 4.8 | 34.2 | 1.9 | 2.4 | 2.9 | 1.0 | 1.4 | 9.6 |
| Example 11 | 4.6 | 7.3 | 5.4 | 7.8 | 6.8 | 31.9 | 3.9 | 4.9 | 10.8 | 2.0 | 2.9 | 24.5 |
| Example 12 | 2.0 | 2.5 | 2.9 | 1.0 | 1.5 | 9.9 | 3.1 | 3.9 | 4.6 | 1.5 | 2.3 | 15.4 |
| Example 13 | 1.7 | 2.1 | 2.5 | 0.8 | 1.3 | 8.4 | 0.9 | 1.1 | 1.3 | 0.4 | 0.7 | 4.4 |
| Example 14 | 12.3 | 19.5 | 22.0 | 17.3 | 15.6 | 86.7 | 0.3 | 0.3 | 0.4 | 0.1 | 0.2 | 1.3 |
| Example 15 | 3.6 | 4.6 | 5.5 | 1.8 | 2.7 | 18.2 | 10.2 | 11.4 | 19.2 | 20.5 | 21.2 | 82.5 |
| Example 16 | 1.4 | 1.8 | 2.1 | 0.7 | 1.1 | 7.1 | 0.7 | 0.9 | 1.1 | 0.4 | 0.5 | 3.6 |
| Example 17 | 2.0 | 2.5 | 2.9 | 1.0 | 1.5 | 9.9 | 1.0 | 1.2 | 1.5 | 0.5 | 0.7 | 4.9 |
| Example 18 | 1.9 | 2.4 | 2.9 | 1.0 | 1.4 | 9.6 | 1.0 | 1.2 | 1.4 | 0.5 | 0.7 | 4.8 |
| Example 19 | 1.6 | 2.0 | 2.4 | 0.8 | 1.2 | 8.0 | 0.8 | 1.0 | 1.2 | 0.4 | 0.6 | 4.0 |
| Example 20 | 1.2 | 1.5 | 1.8 | 0.6 | 0.9 | 6.0 | 0.6 | 0.8 | 0.9 | 0.3 | 0.5 | 3.1 |
| Example 21 | 0.6 | 0.8 | 0.9 | 0.3 | 0.5 | 3.1 | 0.3 | 0.4 | 0.5 | 0.2 | 0.2 | 1.6 |
| Example 22 | 0.6 | 0.8 | 0.9 | 0.3 | 0.5 | 3.1 | 0.3 | 0.4 | 0.5 | 0.2 | 0.2 | 1.6 |
| Example 23 | 2.0 | 2.5 | 2.9 | 1.0 | 1.5 | 9.9 | 1.0 | 1.2 | 1.5 | 0.5 | 0.7 | 4.9 |
| Example 24 | 2.0 | 2.5 | 2.9 | 1.0 | 1.5 | 9.9 | 1.0 | 1.2 | 1.5 | 0.5 | 0.7 | 4.9 |
| Example 25 | 1.0 | 1.3 | 1.6 | 0.5 | 0.8 | 5.2 | 0.5 | 0.7 | 0.8 | 0.3 | 0.4 | 2.7 |
| Example 26 | 1.0 | 1.3 | 1.6 | 0.5 | 0.8 | 5.2 | 0.5 | 0.7 | 0.8 | 0.3 | 0.4 | 2.7 |
| Example 27 | 1.6 | 2.0 | 2.3 | 0.8 | 1.2 | 7.9 | 0.8 | 1.0 | 1.2 | 0.4 | 0.6 | 4.0 |
| Example 28 | 1.2 | 1.6 | 1.9 | 0.6 | 0.9 | 6.2 | 0.6 | 0.8 | 0.9 | 0.3 | 0.5 | 3.1 |
| Example 29 | 1.2 | 1.6 | 1.9 | 0.6 | 0.9 | 6.2 | 0.6 | 0.8 | 0.9 | 0.3 | 0.5 | 3.1 |
| Example 30 | 1.9 | 2.3 | 2.8 | 0.9 | 1.4 | 9.3 | 0.9 | 1.2 | 1.4 | 0.5 | 0.7 | 4.7 |
| Example 31 | 1.6 | 2.0 | 2.4 | 0.8 | 1.2 | 8.0 | 0.8 | 1.0 | 1.2 | 0.4 | 0.6 | 4.0 |
| Example 32 | 1.7 | 2.1 | 2.5 | 0.8 | 1.2 | 8.3 | 0.8 | 1.0 | 1.2 | 0.4 | 0.6 | 4.0 |
| Example 33 | 1.4 | 1.8 | 2.2 | 0.7 | 1.1 | 7.2 | 0.7 | 0.9 | 1.1 | 0.4 | 0.5 | 3.6 |

TABLE 4

| Table 1-1-4 | Elution test (increase in each component in test solvent before and after immersion) Result of elution test for second filter | | | | | | | |
|---|---|---|---|---|---|---|---|---|
| | Organic impurities | | | | | | | |
| | | Content | Metal ions (mass ppb) | | | | | |
| | Type | (mass ppm) | Fe | Na | Ga | Al | K | Total |
| Example 1 | 1 | 177 | 1.0 | 1.3 | 1.5 | 0.5 | 0.8 | 5.1 |
| Example 2 | 1 | 15 | 1.2 | 1.5 | 1.8 | 0.6 | 0.9 | 6.0 |
| Example 3 | 1 | 9 | 3.6 | 4.5 | 5.4 | 1.8 | 2.7 | 18.0 |
| Example 4 | 1 | 6 | 1.6 | 2.0 | 2.4 | 0.8 | 1.2 | 8.0 |
| Example 5 | 1 | 7 | 1.8 | 2.3 | 2.7 | 0.9 | 1.4 | 9.1 |
| Example 6 | 1 | 6 | 3.6 | 4.5 | 5.4 | 1.8 | 2.7 | 18.0 |
| Example 7 | 1 | 7 | 1.8 | 2.3 | 2.7 | 0.9 | 1.4 | 9.1 |
| Example 8 | 1 | 16 | 2.0 | 2.5 | 2.9 | 1.0 | 1.5 | 9.9 |
| Example 9 | 1 | 10 | 0.7 | 0.9 | 1.1 | 0.4 | 0.5 | 3.6 |
| Example 10 | 1 | 173 | 1.0 | 1.3 | 1.5 | 0.5 | 0.8 | 5.1 |
| Example 11 | 1 | 165 | 1.2 | 1.5 | 1.8 | 0.6 | 0.9 | 6.0 |
| Example 12 | 1 | 163 | 3.5 | 4.4 | 5.3 | 13.4 | 2.6 | 29.2 |
| Example 13 | 1 | 184 | 1.6 | 2.0 | 2.4 | 3.5 | 1.2 | 10.7 |
| Example 14 | 2 | 192 | 15.1 | 24.0 | 27.1 | 21.3 | 19.2 | 106.7 |
| Example 15 | 3 | 127 | 3.5 | 4.4 | 5.3 | 3.5 | 2.6 | 19.3 |
| Example 16 | 4 | 7 | 0.7 | 0.9 | 1.1 | 0.4 | 0.5 | 3.6 |
| Example 17 | 1 | 494 | 1.6 | 2.0 | 2.4 | 0.8 | 1.2 | 8.0 |
| Example 18 | 1 | 7 | 0.4 | 0.5 | 0.6 | 0.2 | 0.3 | 2.0 |
| Example 19 | 1 | 8 | 1.2 | 1.5 | 1.7 | 0.6 | 0.9 | 5.9 |
| Example 20 | 1 | 7 | 1.0 | 1.3 | 1.6 | 0.5 | 0.8 | 5.2 |
| Example 21 | 1 | 8 | 1.9 | 2.4 | 2.8 | 0.9 | 1.4 | 9.4 |
| Example 22 | 1 | 17 | 0.8 | 1.0 | 1.2 | 0.4 | 0.6 | 4.0 |
| Example 23 | 1 | 11 | 1.7 | 2.1 | 2.6 | 0.9 | 1.3 | 8.6 |
| Example 24 | 1 | 8 | 1.7 | 2.1 | 2.6 | 0.9 | 1.3 | 8.6 |
| Example 25 | 1 | 8 | 0.5 | 0.7 | 0.8 | 0.3 | 0.4 | 2.7 |
| Example 26 | 1 | 9 | 0.5 | 0.7 | 0.8 | 0.3 | 0.4 | 2.7 |
| Example 27 | 1 | 9 | 1.9 | 2.4 | 2.9 | 1.0 | 1.4 | 9.6 |
| Example 28 | 1 | 8 | 1.3 | 1.7 | 2.0 | 0.7 | 1.0 | 6.7 |
| Example 29 | 1 | 9 | 1.5 | 1.9 | 2.3 | 0.8 | 1.1 | 7.6 |
| Example 30 | 1 | 265 | 1.5 | 1.9 | 2.3 | 0.8 | 1.2 | 7.7 |
| Example 31 | 1 | 228 | 1.3 | 1.7 | 2.0 | 0.7 | 1.0 | 6.7 |
| Example 32 | 1 | 236 | 1.4 | 1.7 | 2.1 | 0.7 | 1.0 | 6.9 |
| Example 33 | 1 | 206 | 1.2 | 1.5 | 1.8 | 0.6 | 0.9 | 6.0 |

TABLE 5

| Table 1-1-5 | Elution test (increase in each component in test solvent before and after immersion) | | | | | | | | | | | | | | |
|---|---|---|---|---|---|---|---|---|---|---|---|---|---|---|---|
| | | | | | | | Result of elution test for second filter | | | | | | | | |
| | Result of elution test for second filter | | | | | | Organic impurities | | | | | | | | |
| | Metal particles (mass ppb) | | | | | | | Content | Metal ions (mass ppb) | | | | | | |
| | Fe | Na | Ca | Al | K | Total | Type | (ppm) | Fe | Na | Ca | Al | K | Total |
| Example 1 | 0.5 | 0.6 | 0.7 | 0.2 | 0.4 | 2.4 | | | | | | | | |
| zExample 2 | 1.0 | 1.3 | 1.5 | 0.5 | 0.8 | 5.1 | | | | | | | | |
| Example 3 | 1.6 | 2.0 | 2.4 | 0.8 | 1.2 | 8.0 | | | | | | | | |
| Example 4 | 0.8 | 1.0 | 1.2 | 0.4 | 0.6 | 4.0 | | | | | | | | |
| Example 5 | 2.4 | 3.0 | 3.6 | 1.2 | 1.8 | 12.0 | | | | | | | | |
| Example 6 | 1.0 | 1.3 | 1.5 | 0.5 | 0.8 | 5.1 | | | | | | | | |
| Example 7 | 4.4 | 5.5 | 6.6 | 2.2 | 3.3 | 22.0 | | | | | | | | |
| Example 8 | 1.0 | 1.2 | 1.5 | 0.5 | 0.7 | 4.9 | | | | | | | | |
| Example 9 | 0.4 | 0.4 | 0.5 | 0.2 | 0.3 | 1.8 | | | | | | | | |
| Example 10 | 0.7 | 0.9 | 1.0 | 0.3 | 0.5 | 3.4 | | | | | | | | |
| Example 11 | 1.4 | 1.8 | 2.1 | 0.7 | 1.1 | 7.1 | | | | | | | | |
| Example 12 | 2.2 | 2.8 | 3.4 | 1.1 | 1.7 | 11.2 | | | | | | | | |
| Example 13 | 1.1 | 1.4 | 10.3 | 0.6 | 0.8 | 14.2 | | | | | | | | |
| Example 14 | 3.4 | 4.2 | 1.2 | 1.7 | 2.5 | 13.0 | | | | | | | | |
| Example 15 | 12.3 | 13.8 | 17.3 | 16.4 | 25.7 | 85.5 | | | | | | | | |
| Example 16 | 0.4 | 0.4 | 0.5 | 0.2 | 0.3 | 1.8 | | | | | | | | |
| Example 17 | 0.8 | 1.0 | 1.2 | 0.4 | 0.6 | 4.0 | | | | | | | | |
| Example 18 | 0.2 | 0.3 | 0.3 | 0.1 | 0.2 | 1.1 | | | | | | | | |
| Example 19 | 0.6 | 0.7 | 0.9 | 0.3 | 0.4 | 2.9 | | | | | | | | |
| Example 20 | 0.5 | 0.7 | 0.8 | 0.3 | 0.4 | 2.7 | | | | | | | | |
| Example 21 | 0.9 | 1.2 | 1.4 | 0.5 | 0.7 | 4.7 | | | | | | | | |

TABLE 5-continued

| Table 1-1-5 | Elution test (increase in each component in test solvent before and after immersion) Result of elution test for second filter Metal particles (mass ppb) Fe | Na | Ca | Al | K | Total | Result of elution test for second filter Organic impurities Type | Content (ppm) | Metal ions (mass ppb) Fe | Na | Ca | Al | K | Total |
|---|---|---|---|---|---|---|---|---|---|---|---|---|---|---|
| Example 22 | 0.4 | 0.5 | 0.6 | 0.2 | 0.3 | 2.0 | | | | | | | | |
| Example 23 | 0.9 | 1.1 | 1.3 | 0.4 | 0.6 | 4.3 | | | | | | | | |
| Example 24 | 0.9 | 1.1 | 1.3 | 0.4 | 0.6 | 4.3 | | | | | | | | |
| Example 25 | 0.3 | 0.3 | 0.4 | 0.1 | 0.2 | 1.3 | | | | | | | | |
| Example 26 | 0.3 | 0.3 | 0.4 | 0.1 | 0.2 | 1.3 | | | | | | | | |
| Example 27 | 1.0 | 1.2 | 1.4 | 0.5 | 0.7 | 4.8 | | | | | | | | |
| Example 28 | 0.7 | 0.8 | 1.0 | 0.3 | 0.5 | 3.3 | | | | | | | | |
| Example 29 | 0.8 | 0.9 | 1.1 | 0.4 | 0.6 | 3.8 | | | | | | | | |
| Example 30 | 0.7 | 0.9 | 1.1 | 0.4 | 0.6 | 3.7 | | | | | | | | |
| Example 31 | 0.6 | 0.8 | 0.9 | 0.3 | 0.5 | 3.1 | | | | | | | | |
| Example 32 | 0.7 | 0.8 | 1.0 | 0.3 | 0.5 | 3.3 | | | | | | | | |
| Example 33 | 0.6 | 0.7 | 0.9 | 0.3 | 0.4 | 2.9 | | | | | | | | |

TABLE 6

| Table 1-1-6 | Elution test (increase in each component in test solvent before and after immersion) Result of elution test for third filter Metal particles (mass ppb) Fe | Na | Ca | Al | K | Total | Substance to be purified Organic solvent | Defect inhibition performance |
|---|---|---|---|---|---|---|---|---|
| Example 1 | | | | | | | PGMEA | A |
| Example 2 | | | | | | | PGMEA | B |
| Example 3 | | | | | | | PGMEA | B |
| Example 4 | | | | | | | PGMEA | B |
| Example 5 | | | | | | | PGMEA | B |
| Example 6 | | | | | | | PGMEA | B |
| Example 7 | | | | | | | PGMEA | B |
| Example 8 | | | | | | | PGMEA | C |
| Example 9 | | | | | | | PGMEA | C |
| Example 10 | | | | | | | PGMEA | B |
| Example 11 | | | | | | | PGMEA | B |
| Example 12 | | | | | | | PGMEA | B |
| Example 13 | | | | | | | PGMEA | B |
| Example 14 | | | | | | | PGMEA | C |
| Example 15 | | | | | | | PGMEA | C |
| Example 16 | | | | | | | PGMEA | B |
| Example 17 | | | | | | | PGMEA | B |
| Example 18 | | | | | | | PGMEA | C |
| Example 19 | | | | | | | PGMEA | C |
| Example 20 | | | | | | | PGMEA | C |
| Example 21 | | | | | | | PGMEA | C |
| Example 22 | | | | | | | PGMEA | C |
| Example 23 | | | | | | | PGMEA | C |
| Example 24 | | | | | | | PGMEA | B |
| Example 25 | | | | | | | PGMEA | C |
| Example 26 | | | | | | | PGMEA | B |
| Example 27 | | | | | | | PGMEA | B |
| Example 28 | | | | | | | PGMEA | C |
| Example 29 | | | | | | | PGMEA | B |
| Example 30 | | | | | | | PGMEA | A |
| Example 31 | | | | | | | PGMEA | B |
| Example 32 | | | | | | | PGMEA | A |
| Example 33 | | | | | | | PGMEA | A |

TABLE 7

| Table 1-2-1 | Filter unit (first to third filter units are arranged in this order from primary side) First filter unit (accommodating first filter) Material of filter | Supply pressure (MPa) | Pore size (nm) | Second filter unit (accommodating second filter) Material of filter | Supply pressure (MPa) | Pore size (nm) |
|---|---|---|---|---|---|---|
| Example 34 | PTFE | 0.1 | 15 | UPE | 0.03 | 3 |
| Example 35 | PTFE | 0.1 | 15 | UPE | 0.05 | 3 |
| Example 36 | PTFE | 0.1 | 15 | UPE | 0.08 | 3 |
| Example 37 | PTFE | 0.1 | 15 | UPE | 0.015 | 3 |
| Example 38 | PTFE | 0.1 | 15 | UPE | 0.015 | 3 |
| Example 39 | PTFE | 0.1 | 15 | UPE | 0.015 | 3 |
| Example 40 | PTFE | 0.1 | 15 | UPE | 0.015 | 3 |
| Example 41 | PTFE | 0.1 | 15 | UPE | 0.015 | 3 |
| Example 42 | PTFE | 0.1 | 15 | UPE | 0.015 | 3 |
| Example 43 | PTFE | 0.1 | 15 | UPE | 0.015 | 3 |
| Example 44 | PTFE | 0.1 | 15 | UPE | 0.015 | 1 |
| Example 45 | PTFE | 0.1 | 15 | UPE (with modified surface) | 0.015 | 3 |
| Example 46 | PTFE | 0.3 | 15 | UPE (with modified surface) | 0.015 | 3 |
| Example 47 | PTFE | 0.02 | 15 | UPE (with modified surface) | 0.015 | 3 |
| Example 48 | PTFE | 0.05 | 15 | UPE (with modified surface) | 0.015 | 3 |
| Example 49 | PTFE | 0.1 | 15 | UPE (with modified surface) | 0.03 | 3 |
| Example 50 | PTFE | 0.1 | 15 | UPE (with modified surface) | 0.05 | 3 |
| Example 51 | PTFE | 0.1 | 15 | UPE (with modified surface) | 0.08 | 3 |
| Example 52 | PTFE | 0.1 | 15 | UPE (with modified surface) | 0.015 | 3 |
| Example 53 | PTFE | 0.1 | 15 | UPE (with modified surface) | 0.015 | 3 |
| Example 54 | PTFE | 0.1 | 15 | UPE (with modified surface) | 0.015 | 3 |
| Example 55 | PTFE | 0.1 | 15 | UPE (with modified surface) | 0.015 | 3 |
| Example 56 | PTFE | 0.1 | 15 | UPE (with modified surface) | 0.015 | 3 |
| Example 57 | PTFE | 0.1 | 15 | UPE (with modified surface) | 0.015 | 3 |
| Example 58 | PTFE | 0.1 | 15 | UPE (with modified surface) | 0.015 | 3 |
| Example 59 | PTFE | 0.1 | 15 | UPE (with modified surface) | 0.015 | 1 |
| Example 60 | PTFE (with modified surface) | 0.1 | 15 | UPE | 0.015 | 3 |
| Example 61 | PTFE (with modified surface) | 0.1 | 15 | UPE (with modified surface) | 0.015 | 3 |
| Example 62 | UPE | 0.1 | 10 | Nylon | 0.015 | 5 |
| Example 63 | UPE | 0.3 | 10 | Nylon | 0.015 | 5 |
| Example 64 | UPE | 0.4 | 10 | Nylon | 0.015 | 5 |
| Example 65 | UPE | 0.02 | 10 | Nylon | 0.015 | 5 |
| Example 66 | UPE | 0.05 | 10 | Nylon | 0.015 | 5 |

TABLE 8

| Table 1-2-2 | Filter unit (first to third filter units are arranged in this order from primary side) Third filter unit (accommodating third filter) Material of filter | Supply pressure (MPa) | Pore size (nm) | Circulation | Washing solution | Elution test (increase in each component in test solvent before and after immersion) Result of elution test for first filter Organic impurities Type | Content (mass ppm) |
|---|---|---|---|---|---|---|---|
| Example 34 | | | | N/A | PGMEA | 1 | 186 |
| Example 35 | | | | N/A | PGMEA | 1 | 248 |
| Example 36 | | | | N/A | PGMEA | 1 | 311 |
| Example 37 | | | | Performed | PGMEA | 1 | 279 |
| Example 38 | | | | N/A | nBA | 2 | 217 |
| Example 39 | | | | N/A | CyHe | 3 | 279 |
| Example 40 | | | | N/A | MIBC | 4 | 186 |
| Example 41 | | | | N/A | iAA | 5 | 248 |
| Example 42 | | | | N/A | PGME | 6 | 217 |
| Example 43 | | | | N/A | IPA | 7 | 279 |
| Example 44 | | | | N/A | IPA | 1 | 279 |
| Example 45 | | | | N/A | PGMEA | 1 | 166 |
| Example 46 | | | | N/A | PGMEA | 1 | 259 |
| Example 47 | | | | N/A | PGMEA | 1 | 228 |
| Example 48 | | | | N/A | PGMEA | 1 | 197 |
| Example 49 | | | | N/A | PGMEA | 1 | 166 |
| Example 50 | | | | N/A | PGMEA | 1 | 228 |
| Example 51 | | | | N/A | PGMEA | 1 | 291 |
| Example 52 | | | | Performed | PGMEA | 1 | 259 |

TABLE 8-continued

| Table 1-2-2 | Filter unit (first to third filter units are arranged in this order from primary side) Third filter unit (accommodating third filter): Material of filter | Supply pressure (MPa) | Pore size (nm) | Circulation | Washing solution | Elution test (increase in each component in test solvent before and after immersion) Result of elution test for first filter — Organic impurities: Type | Content (mass ppm) |
|---|---|---|---|---|---|---|---|
| Example 53 | | | | N/A | nBA | 1 | 197 |
| Example 54 | | | | N/A | CyHe | 1 | 259 |
| Example 55 | | | | N/A | MIBC | 1 | 166 |
| Example 56 | | | | N/A | iAA | 1 | 228 |
| Example 57 | | | | N/A | PGME | 1 | 197 |
| Example 58 | | | | N/A | IPA | 1 | 259 |
| Example 59 | | | | N/A | IPA | 1 | 259 |
| Example 60 | | | | N/A | PGMEA | 1 | 186 |
| Example 61 | | | | N/A | PGMEA | 1 | 239 |
| Example 62 | | | | N/A | PGMEA | 1 | 331 |
| Example 63 | | | | N/A | PGMEA | 1 | 323 |
| Example 64 | | | | N/A | PGMEA | 1 | 363 |
| Example 65 | | | | N/A | PGMEA | 1 | 363 |
| Example 66 | | | | N/A | PGMEA | 1 | 241 |

TABLE 9

| | Elution test (increase in each component in test solvent before and after immersion) Result of elution test for first filter | | | | | | | | | | | |
|---|---|---|---|---|---|---|---|---|---|---|---|---|
| | Metal ions (mass ppb) | | | | | | Metal particles (mass ppb) | | | | | |
| Table 1-2-3 | Fe | Na | Ca | Al | K | Total | Fe | Na | Ca | Al | K | Total |
| Example 34 | 1.2 | 1.6 | 1.9 | 0.6 | 0.9 | 6.2 | 0.6 | 0.8 | 0.9 | 0.3 | 0.5 | 3.1 |
| Example 35 | 1.7 | 2.1 | 2.5 | 0.8 | 1.2 | 8.3 | 0.8 | 1.0 | 1.2 | 0.4 | 0.6 | 4.0 |
| Example 36 | 2.1 | 2.6 | 3.1 | 1.0 | 1.6 | 10.4 | 1.0 | 1.3 | 1.6 | 0.5 | 0.8 | 5.2 |
| Example 37 | 1.9 | 2.3 | 2.8 | 0.9 | 1.4 | 9.3 | 0.9 | 1.2 | 1.4 | 0.5 | 0.7 | 4.7 |
| Example 38 | 1.4 | 1.8 | 2.2 | 0.7 | 1.1 | 7.2 | 0.7 | 0.9 | 1.1 | 0.4 | 0.5 | 3.6 |
| Example 39 | 1.9 | 2.3 | 2.8 | 0.9 | 1.4 | 9.3 | 0.9 | 1.2 | 1.4 | 0.5 | 0.7 | 4.7 |
| Example 40 | 1.2 | 1.6 | 1.9 | 0.6 | 0.9 | 6.2 | 0.6 | 0.8 | 0.9 | 0.3 | 0.5 | 3.1 |
| Example 41 | 1.7 | 2.1 | 2.5 | 0.8 | 1.2 | 8.3 | 0.8 | 1.0 | 1.2 | 0.4 | 0.6 | 4.0 |
| Example 42 | 1.4 | 1.8 | 2.2 | 0.7 | 1.1 | 7.2 | 0.7 | 0.9 | 1.1 | 0.4 | 0.5 | 3.6 |
| Example 43 | 1.9 | 2.3 | 2.8 | 0.9 | 1.4 | 9.3 | 0.9 | 1.2 | 1.4 | 0.5 | 0.7 | 4.7 |
| Example 44 | 1.9 | 2.3 | 2.8 | 0.9 | 1.4 | 9.3 | 0.9 | 1.2 | 1.4 | 0.5 | 0.7 | 4.7 |
| Example 45 | 1.1 | 1.4 | 1.7 | 0.6 | 0.8 | 5.6 | 0.6 | 0.7 | 0.8 | 0.3 | 0.4 | 2.8 |
| Example 46 | 1.7 | 2.2 | 2.6 | 0.9 | 1.3 | 8.7 | 0.9 | 1.1 | 1.3 | 0.4 | 0.6 | 4.3 |
| Example 47 | 1.5 | 1.9 | 2.3 | 0.8 | 1.1 | 7.6 | 0.8 | 1.0 | 1.1 | 0.4 | 0.6 | 3.9 |
| Example 48 | 1.3 | 1.6 | 2.0 | 0.7 | 1.0 | 6.6 | 0.7 | 0.8 | 1.0 | 0.3 | 0.5 | 3.3 |
| Example 49 | 1.1 | 1.4 | 1.7 | 0.6 | 0.8 | 5.6 | 0.6 | 0.7 | 0.8 | 0.3 | 0.4 | 2.8 |
| Example 50 | 1.5 | 1.9 | 2.3 | 0.8 | 1.1 | 7.6 | 0.8 | 1.0 | 1.1 | 0.4 | 0.6 | 3.9 |
| Example 51 | 1.9 | 2.4 | 2.9 | 1.0 | 1.5 | 9.7 | 1.0 | 1.2 | 1.5 | 0.5 | 0.7 | 4.9 |
| Example 52 | 1.7 | 2.2 | 2.6 | 0.9 | 1.3 | 8.7 | 0.9 | 1.1 | 1.3 | 0.4 | 0.6 | 4.3 |
| Example 53 | 1.3 | 1.6 | 2.0 | 0.7 | 1.0 | 6.6 | 0.7 | 0.8 | 1.0 | 0.3 | 0.5 | 3.3 |
| Example 54 | 1.7 | 2.2 | 2.6 | 0.9 | 1.3 | 8.7 | 0.9 | 1.1 | 1.3 | 0.4 | 0.6 | 4.3 |
| Example 55 | 1.1 | 1.4 | 1.7 | 0.6 | 0.8 | 5.6 | 0.6 | 0.7 | 0.8 | 0.3 | 0.4 | 2.8 |
| Example 56 | 1.5 | 1.9 | 2.3 | 0.8 | 1.1 | 7.6 | 0.8 | 1.0 | 1.1 | 0.4 | 0.6 | 3.9 |
| Example 57 | 1.3 | 1.6 | 2.0 | 0.7 | 1.0 | 6.6 | 0.7 | 0.8 | 1.0 | 0.3 | 0.5 | 3.3 |
| Example 58 | 1.7 | 2.2 | 2.6 | 0.9 | 1.3 | 8.7 | 0.9 | 1.1 | 1.3 | 0.4 | 0.6 | 4.3 |
| Example 59 | 1.7 | 2.2 | 2.6 | 0.9 | 1.3 | 8.7 | 0.9 | 1.1 | 1.3 | 0.4 | 0.6 | 4.3 |
| Example 60 | 1.2 | 1.6 | 1.9 | 0.6 | 0.9 | 6.2 | 0.6 | 0.8 | 0.9 | 0.3 | 0.5 | 3.1 |
| Example 61 | 1.6 | 2.0 | 2.4 | 0.8 | 1.2 | 8.0 | 0.8 | 1.0 | 1.2 | 0.4 | 0.6 | 4.0 |
| Example 62 | 2.2 | 2.8 | 3.3 | 1.1 | 1.7 | 11.1 | 1.1 | 1.4 | 1.7 | 0.6 | 0.8 | 5.6 |
| Example 63 | 2.2 | 2.7 | 3.2 | 1.1 | 1.6 | 10.8 | 1.1 | 1.3 | 1.6 | 0.5 | 0.8 | 5.3 |
| Example 64 | 2.4 | 3.0 | 2.8 | 1.2 | 1.8 | 11.2 | 1.2 | 1.5 | 1.8 | 0.6 | 0.9 | 6.0 |
| Example 65 | 2.4 | 3.0 | 1.0 | 1.2 | 1.8 | 9.4 | 1.2 | 1.5 | 1.8 | 0.6 | 0.9 | 6.0 |
| Example 66 | 1.6 | 2.0 | 2.4 | 0.8 | 1.2 | 8.0 | 0.8 | 1.0 | 1.2 | 0.4 | 0.6 | 4.0 |

TABLE 10

| | Elution test (increase in each component in test solvent before and after immersion) Result of elution test for second filter | | | | | | | |
|---|---|---|---|---|---|---|---|---|
| | Organic impurities | | | | | | | |
| | | Content | Metal ions (mass ppb) | | | | | |
| Table 1-2-4 | Type | (mass ppm) | Fe | Na | Ga | Al | K | Total |
| Example 34 | 1 | 177 | 1.0 | 1.3 | 1.5 | 0.5 | 0.8 | 5.1 |
| Example 35 | 1 | 236 | 1.4 | 1.7 | 2.1 | 0.7 | 1.0 | 6.9 |
| Example 36 | 1 | 295 | 1.7 | 2.1 | 2.6 | 0.9 | 1.3 | 8.6 |
| Example 37 | 1 | 265 | 1.5 | 1.9 | 2.3 | 0.8 | 1.2 | 7.7 |
| Example 38 | 2 | 206 | 1.2 | 1.5 | 1.8 | 0.6 | 0.9 | 6.0 |
| Example 39 | 3 | 265 | 1.5 | 1.9 | 2.3 | 0.8 | 1.2 | 7.7 |
| Example 40 | 4 | 177 | 1.0 | 1.3 | 1.5 | 0.5 | 0.8 | 5.1 |
| Example 41 | 5 | 236 | 1.4 | 1.7 | 2.1 | 0.7 | 1.0 | 6.9 |
| Example 42 | 6 | 206 | 1.2 | 1.5 | 1.8 | 0.6 | 0.9 | 6.0 |
| Example 43 | 7 | 265 | 1.5 | 1.9 | 2.3 | 0.8 | 1.2 | 7.7 |
| Example 44 | 1 | 265 | 1.5 | 1.9 | 2.3 | 0.8 | 1.2 | 7.7 |
| Example 45 | 1 | 158 | 0.9 | 1.2 | 1.4 | 0.5 | 0.7 | 4.7 |
| Example 46 | 1 | 246 | 1.4 | 1.8 | 2.2 | 0.7 | 1.1 | 7.2 |
| Example 47 | 1 | 217 | 1.3 | 1.6 | 1.9 | 0.6 | 0.9 | 6.3 |
| Example 48 | 1 | 187 | 1.1 | 1.4 | 1.6 | 0.5 | 0.8 | 5.4 |
| Example 49 | 1 | 158 | 0.9 | 1.2 | 1.4 | 0.5 | 0.7 | 4.7 |
| Example 50 | 1 | 217 | 1.3 | 1.6 | 1.9 | 0.6 | 0.9 | 6.3 |
| Example 51 | 1 | 276 | 1.6 | 2.0 | 2.4 | 0.8 | 1.2 | 8.0 |
| Example 52 | 1 | 246 | 1.4 | 1.8 | 2.2 | 0.7 | 1.1 | 7.2 |
| Example 53 | 1 | 187 | 1.1 | 1.4 | 1.6 | 0.5 | 0.8 | 5.4 |
| Example 54 | 1 | 246 | 1.4 | 1.8 | 2.2 | 0.7 | 1.1 | 7.2 |
| Example 55 | 1 | 158 | 0.9 | 1.2 | 1.4 | 0.5 | 0.7 | 4.7 |
| Example 56 | 1 | 217 | 1.3 | 1.6 | 1.9 | 0.6 | 0.9 | 6.3 |
| Example 57 | 1 | 187 | 1.1 | 1.4 | 1.6 | 0.5 | 0.8 | 5.4 |
| Example 58 | 1 | 246 | 1.4 | 1.8 | 2.2 | 0.7 | 1.1 | 7.2 |
| Example 59 | 1 | 246 | 1.4 | 1.8 | 2.2 | 0.7 | 1.1 | 7.2 |
| Example 60 | 1 | 177 | 1.0 | 1.3 | 1.5 | 0.5 | 0.8 | 5.1 |
| Example 61 | 1 | 227 | 1.3 | 1.7 | 2.0 | 0.7 | 1.0 | 6.7 |
| Example 62 | 1 | 315 | 1.8 | 2.3 | 2.7 | 0.9 | 1.4 | 9.1 |
| Example 63 | 1 | 307 | 1.8 | 2.2 | 2.7 | 0.9 | 1.3 | 8.9 |
| Example 64 | 1 | 345 | 1.8 | 2.3 | 2.7 | 0.9 | 1.4 | 9.1 |
| Example 65 | 1 | 345 | 2.0 | 2.5 | 2.9 | 1.0 | 1.5 | 9.9 |
| Example 66 | 1 | 228 | 1.3 | 1.7 | 2.0 | 0.7 | 1.0 | 6.7 |

TABLE 11

| | Elution test (increase in each component in test solvent before and after immersion) | | | | | | | | | | | | | | |
|---|---|---|---|---|---|---|---|---|---|---|---|---|---|---|---|
| | | | | | | | Result of elution test for third filter | | | | | | | | |
| | Result of elution test for second filter | | | | | | Organic impurities | | | | | | | | |
| | Metal particles (mass ppb) | | | | | | | Content | Metal ions (mass ppb) | | | | | | |
| Table 1-2-5 | Fe | Na | Ca | Al | K | Total | Type | (ppm) | Fe | Na | Ca | Al | K | Total |
| Example 34 | 0.5 | 0.6 | 0.7 | 0.2 | 0.4 | 2.4 | | | | | | | | |
| Example 35 | 0.7 | 0.8 | 1.0 | 0.3 | 0.5 | 3.3 | | | | | | | | |
| Example 36 | 0.8 | 1.0 | 1.2 | 0.4 | 0.6 | 4.0 | | | | | | | | |
| Example 37 | 0.7 | 0.9 | 1.1 | 0.4 | 0.6 | 3.7 | | | | | | | | |
| Example 38 | 0.6 | 0.7 | 0.9 | 0.3 | 0.4 | 2.9 | | | | | | | | |
| Example 39 | 0.7 | 0.9 | 1.1 | 0.4 | 0.6 | 3.7 | | | | | | | | |
| Example 40 | 0.5 | 0.6 | 0.7 | 0.2 | 0.4 | 2.4 | | | | | | | | |
| Example 41 | 0.7 | 0.8 | 1.0 | 0.3 | 0.5 | 3.3 | | | | | | | | |
| Example 42 | 0.6 | 0.7 | 0.9 | 0.3 | 0.4 | 2.9 | | | | | | | | |
| Example 43 | 0.7 | 0.9 | 1.1 | 0.4 | 0.6 | 3.7 | | | | | | | | |
| Example 44 | 0.7 | 0.9 | 1.1 | 0.4 | 0.6 | 3.7 | | | | | | | | |
| Example 45 | 0.4 | 0.5 | 0.7 | 0.2 | 0.3 | 2.1 | | | | | | | | |
| Example 46 | 0.7 | 0.9 | 1.0 | 0.3 | 0.5 | 3.4 | | | | | | | | |
| Example 47 | 0.6 | 0.8 | 0.9 | 0.3 | 0.5 | 3.1 | | | | | | | | |
| Example 48 | 0.5 | 0.6 | 0.8 | 0.3 | 0.4 | 2.6 | | | | | | | | |
| Example 49 | 0.4 | 0.5 | 0.7 | 0.2 | 0.3 | 2.1 | | | | | | | | |
| Example 50 | 0.6 | 0.8 | 0.9 | 0.3 | 0.5 | 3.1 | | | | | | | | |
| Example 51 | 0.8 | 1.0 | 1.1 | 0.4 | 0.6 | 3.9 | | | | | | | | |
| Example 52 | 0.7 | 0.9 | 1.0 | 0.3 | 0.5 | 3.4 | | | | | | | | |
| Example 53 | 0.5 | 0.6 | 0.8 | 0.3 | 0.4 | 2.6 | | | | | | | | |
| Example 54 | 0.7 | 0.9 | 1.0 | 0.3 | 0.5 | 3.4 | | | | | | | | |

TABLE 11-continued

| Table 1-2-5 | Elution test (increase in each component in test solvent before and after immersion) | | | | | | | | | | | | | | |
|---|---|---|---|---|---|---|---|---|---|---|---|---|---|---|---|
| | Result of elution test for second filter | | | | | | Result of elution test for third filter | | | | | | | | |
| | Metal particles (mass ppb) | | | | | | Organic impurities | | Metal ions (mass ppb) | | | | | | |
| | Fe | Na | Ca | Al | K | Total | Type | Content (ppm) | Fe | Na | Ca | Al | K | Total |
| Example 55 | 0.4 | 0.5 | 0.7 | 0.2 | 0.3 | 2.1 | | | | | | | | |
| Example 56 | 0.6 | 0.8 | 0.9 | 0.3 | 0.5 | 3.1 | | | | | | | | |
| Example 57 | 0.5 | 0.6 | 0.8 | 0.3 | 0.4 | 2.6 | | | | | | | | |
| Example 58 | 0.7 | 0.9 | 1.0 | 0.3 | 0.5 | 3.4 | | | | | | | | |
| Example 59 | 0.7 | 0.9 | 1.0 | 0.3 | 0.5 | 3.4 | | | | | | | | |
| Example 60 | 0.5 | 0.6 | 0.7 | 0.2 | 0.4 | 2.4 | | | | | | | | |
| Example 61 | 0.6 | 0.8 | 0.9 | 0.3 | 0.5 | 3.1 | | | | | | | | |
| Example 62 | 0.9 | 1.1 | 1.3 | 0.4 | 0.7 | 4.4 | | | | | | | | |
| Example 63 | 0.9 | 1.1 | 1.3 | 0.4 | 0.6 | 4.3 | | | | | | | | |
| Example 64 | 1.0 | 1.2 | 1.4 | 0.5 | 0.7 | 4.8 | | | | | | | | |
| Example 65 | 1.0 | 1.2 | 1.4 | 0.5 | 0.7 | 4.8 | | | | | | | | |
| Example 66 | 0.6 | 0.8 | 0.9 | 0.3 | 0.5 | 3.1 | | | | | | | | |

TABLE 12

| Table 1-2-6 | Elution test (increase in each component in test solvent before and after immersion) Result of elution test for third filter Metal particles (mass ppb) | | | | | | Substance to be purified | Defect inhibition |
|---|---|---|---|---|---|---|---|---|
| | Fe | Na | Ca | Al | K | Total | Organic solvent | performance |
| Example 34 | | | | | | | PGMEA | A |
| Example 35 | | | | | | | PGMEA | B |
| Example 36 | | | | | | | PGMEA | C |
| Example 37 | | | | | | | PGMEA | B |
| Example 38 | | | | | | | nBA | A |
| Example 39 | | | | | | | CyHe | A |
| Example 40 | | | | | | | MIBC | A |
| Example 41 | | | | | | | iAA | A |
| Example 42 | | | | | | | PGME | A |
| Example 43 | | | | | | | IPA | A |
| Example 44 | | | | | | | IPA | A |
| Example 45 | | | | | | | PGMEA | A |
| Example 46 | | | | | | | PGMEA | A |
| Example 47 | | | | | | | PGMEA | A |
| Example 48 | | | | | | | PGMEA | A |
| Example 49 | | | | | | | PGMEA | A |
| Example 50 | | | | | | | PGMEA | B |
| Example 51 | | | | | | | PGMEA | C |
| Example 52 | | | | | | | PGMEA | B |
| Example 53 | | | | | | | nBA | A |
| Example 54 | | | | | | | CyHe | A |
| Example 55 | | | | | | | MIBC | A |
| Example 56 | | | | | | | iAA | A |
| Example 57 | | | | | | | PGME | A |
| Example 58 | | | | | | | IPA | A |
| Example 59 | | | | | | | IPA | A |
| Example 60 | | | | | | | PGMEA | A |
| Example 61 | | | | | | | PGMEA | A |
| Example 62 | | | | | | | PGMEA | B |
| Example 63 | | | | | | | PGMEA | C |
| Example 64 | | | | | | | PGMEA | D |
| Example 65 | | | | | | | PGMEA | B |
| Example 66 | | | | | | | PGMEA | B |

TABLE 13

| Table 1-3-1 | Filter unit (first to third filter units are arranged in this order from primary side) First filter unit (accommodating first filter) Material of filter | Supply pressure (MPa) | Pore size (nm) | Second filter unit (accommodating second filter) Material of filter | Supply pressure (MPa) | Pore size (nm) |
|---|---|---|---|---|---|---|
| Example 67 | UPE | 0.1 | 10 | Nylon | 0.03 | 5 |
| Example 68 | PTFE | 0.1 | 15 | Nylon | 0.015 | 5 |
| Example 69 | PTFE | 0.3 | 15 | Nylon | 0.015 | 5 |
| Example 70 | PTFE | 0.02 | 15 | Nylon | 0.015 | 5 |
| Example 71 | PTFE | 0.05 | 15 | Nylon | 0.015 | 5 |
| Example 72 | PTFE | 0.1 | 15 | Nylon | 0.03 | 5 |
| Example 73 | PTFE | 0.1 | 15 | Nylon | 0.05 | 5 |
| Example 74 | PTFE | 0.1 | 15 | Nylon | 0.08 | 5 |
| Example 75 | PTFE | 0.1 | 15 | Nylon | 0.015 | 5 |
| Example 76 | PTFE | 0.1 | 15 | Nylon | 0.015 | 5 |
| Example 77 | PTFE | 0.1 | 15 | Nylon | 0.015 | 5 |
| Example 78 | PTFE | 0.1 | 15 | Nylon | 0.015 | 5 |
| Example 79 | PTFE | 0.1 | 15 | Nylon | 0.015 | 5 |
| Example 80 | PTFE | 0.1 | 15 | Nylon | 0.015 | 5 |
| Example 81 | PTFE | 0.1 | 15 | Nylon | 0.015 | 5 |
| Example 82 | HDPE | 0.2 | 100 | PTFE | 0.05 | 15 |
| Example 83 | HDPE | 0.2 | 100 | PTFE | 0.015 | 15 |
| Example 84 | HDPE | 0.1 | 100 | PTFE | 0.05 | 15 |
| Example 85 | HDPE | 0.2 | 100 | PTFE | 0.1 | 15 |
| Example 86 | HDPE | 0.2 | 100 | PTFE | 0.1 | 15 |
| Example 87 | HDPE | 0.2 | 100 | PTFE | 0.1 | 15 |
| Example 88 | HDPE | 0.2 | 100 | PTFE | 0.05 | 15 |
| Example 89 | HDPE | 0.1 | 100 | PTFE | 0.05 | 15 |
| Example 90 | HDPE | 0.2 | 100 | PTFE | 0.1 | 15 |
| Example 91 | HDPE | 0.2 | 100 | PTFE | 0.1 | 15 |
| Example 92 | HDPE | 0.2 | 100 | PTFE | 0.1 | 15 |
| Example 93 | PP | 0.2 | 200 | PTFE | 0.05 | 15 |
| Example 94 | PP | 0.1 | 200 | PTFE | 0.05 | 15 |
| Example 95 | PP | 0.2 | 200 | PTFE | 0.1 | 15 |
| Example 96 | PP | 0.2 | 200 | PTFE | 0.1 | 15 |
| Example 97 | PP | 0.2 | 200 | PTFE | 0.1 | 15 |
| Example 98 | PP | 0.2 | 200 | PTFE | 0.05 | 15 |
| Example 99 | PP | 0.1 | 200 | PTFE | 0.05 | 15 |

TABLE 14

| Table 1-3-2 | Filter unit (first to third filter units are arranged in this order from primary side) Third filter unit (accommodating third filter) Material of filter | Supply pressure (MPa) | Pore size (nm) | Circulation | Washing solution | Elution test (increase in each component in test solvent before and after immersion) Result of elution test for first filter Organic impurities Type | Content (mass ppm) |
|---|---|---|---|---|---|---|---|
| Example 67 | | | | N/A | PGMEA | 1 | 255 |
| Example 68 | | | | N/A | PGMEA | 1 | 248 |
| Example 69 | | | | N/A | PGMEA | 1 | 279 |
| Example 70 | | | | N/A | PGMEA | 1 | 185 |
| Example 71 | | | | N/A | PGMEA | 1 | 196 |
| Example 72 | | | | N/A | PGMEA | 1 | 216 |
| Example 73 | | | | N/A | PGMEA | 1 | 285 |
| Example 74 | | | | N/A | PGMEA | 1 | 252 |
| Example 75 | | | | Performed | PGMEA | 1 | 242 |
| Example 76 | | | | N/A | nBA | 1 | 256 |
| Example 77 | | | | N/A | CyHe | 1 | 242 |
| Example 78 | | | | N/A | MIBC | 1 | 192 |
| Example 79 | | | | N/A | iAA | 1 | 152 |
| Example 80 | | | | N/A | PGME | 1 | 162 |
| Example 81 | | | | N/A | IPA | 1 | 254 |
| Example 82 | UPE | 0.015 | 3 | N/A | PGMEA | 1 | 215 |
| Example 83 | UPE | 0.04 | 3 | N/A | PGMEA | 1 | 22 |
| Example 84 | UPE | 0.015 | 3 | N/A | PGMEA | 1 | 215 |
| Example 85 | UPE | 0.02 | 3 | N/A | PGMEA | 1 | 326 |
| Example 86 | UPE | 0.04 | 3 | N/A | PGMEA | 1 | 284 |
| Example 87 | UPE | 0.015 | 3 | N/A | PGMEA | 1 | 216 |
| Example 88 | Nylon | 0.015 | 5 | N/A | PGMEA | 1 | 256 |

TABLE 14-continued

| Table 1-3-2 | Filter unit (first to third filter units are arranged in this order from primary side) Third filter unit (accommodating third filter) Material of filter | Supply pressure (MPa) | Pore size (nm) | Circulation | Washing solution | Elution test (increase in each component in test solvent before and after immersion) Result of elution test for first filter Organic impurities Type | Content (mass ppm) |
|---|---|---|---|---|---|---|---|
| Example 89 | Nylon | 0.015 | 5 | N/A | PGMEA | 1 | 246 |
| Example 90 | Nylon | 0.015 | 5 | N/A | PGMEA | 1 | 285 |
| Example 91 | Nylon | 0.015 | 5 | N/A | PGMEA | 1 | 265 |
| Example 92 | Nylon | 0.015 | 5 | N/A | PGMEA | 1 | 245 |
| Example 93 | UPE | 0.015 | 3 | N/A | PGMEA | 1 | 200 |
| Example 94 | UPE | 0.015 | 3 | N/A | PGMEA | 1 | 200 |
| Example 95 | UPE | 0.02 | 3 | N/A | PGMEA | 1 | 311 |
| Example 96 | UPE | 0.04 | 3 | N/A | PGMEA | 1 | 269 |
| Example 97 | UPE | 0.015 | 3 | N/A | PGMEA | 1 | 201 |
| Example 98 | Nylon | 0.015 | 5 | N/A | PGMEA | 1 | 241 |
| Example 99 | Nylon | 0.015 | 5 | N/A | PGMEA | 1 | 231 |

TABLE 15

| | Elution test (increase in each component in test solvent before and after immersion) Result of elution test for first filter | | | | | | | | | | | |
|---|---|---|---|---|---|---|---|---|---|---|---|---|
| | Metal ions (mass ppb) | | | | | | Metal particles (mass ppb) | | | | | |
| Table 1-3-3 | Fe | Na | Ca | Al | K | Total | Fe | Na | Ca | Al | K | Total |
| Example 67 | 1.7 | 2.1 | 2.5 | 0.8 | 1.3 | 8.4 | 0.8 | 1.1 | 1.3 | 0.4 | 0.6 | 4.2 |
| Example 68 | 1.7 | 2.1 | 2.5 | 0.8 | 1.2 | 8.3 | 0.8 | 1.0 | 1.2 | 0.4 | 0.6 | 4.0 |
| Example 69 | 1.9 | 2.3 | 2.8 | 0.9 | 1.4 | 9.3 | 0.9 | 1.2 | 1.4 | 0.5 | 0.7 | 4.7 |
| Example 70 | 1.2 | 1.5 | 1.9 | 0.6 | 0.9 | 6.1 | 0.6 | 0.8 | 0.9 | 0.3 | 0.5 | 3.1 |
| Example 71 | 1.3 | 1.6 | 2.0 | 0.7 | 1.0 | 6.6 | 0.7 | 0.8 | 1.0 | 0.3 | 0.5 | 3.3 |
| Example 72 | 1.4 | 1.8 | 2.2 | 0.7 | 1.1 | 7.2 | 0.7 | 0.9 | 1.1 | 0.4 | 0.5 | 3.6 |
| Example 73 | 1.9 | 2.4 | 2.9 | 1.0 | 1.4 | 9.6 | 1.0 | 1.2 | 1.4 | 0.5 | 0.7 | 4.8 |
| Example 74 | 1.7 | 2.1 | 2.5 | 0.8 | 1.3 | 8.4 | 0.8 | 1.1 | 1.3 | 0.4 | 0.6 | 4.2 |
| Example 75 | 1.6 | 2.0 | 2.4 | 0.8 | 1.2 | 8.0 | 0.8 | 1.0 | 1.2 | 0.4 | 0.6 | 4.0 |
| Example 76 | 1.7 | 2.1 | 2.6 | 0.9 | 1.3 | 8.6 | 0.9 | 1.1 | 1.3 | 0.4 | 0.6 | 4.3 |
| Example 77 | 1.6 | 2.0 | 2.4 | 0.8 | 1.2 | 8.0 | 0.8 | 1.0 | 1.2 | 0.4 | 0.6 | 4.0 |
| Example 78 | 1.3 | 1.6 | 1.9 | 0.6 | 1.0 | 6.4 | 0.6 | 0.8 | 1.0 | 0.3 | 0.5 | 3.2 |
| Example 79 | 1.0 | 1.3 | 1.5 | 0.5 | 0.8 | 5.1 | 0.5 | 0.6 | 0.8 | 0.3 | 0.4 | 2.6 |
| Example 80 | 1.1 | 1.4 | 1.6 | 0.5 | 0.8 | 5.4 | 0.5 | 0.7 | 0.8 | 0.3 | 0.4 | 2.7 |
| Example 81 | 1.7 | 2.1 | 2.5 | 0.8 | 1.3 | 8.4 | 0.8 | 1.1 | 1.3 | 0.4 | 0.6 | 4.2 |
| Example 82 | 1.4 | 1.8 | 2.2 | 0.7 | 1.1 | 7.2 | 0.7 | 0.9 | 1.1 | 0.4 | 0.5 | 3.6 |
| Example 83 | 0.1 | 0.2 | 0.2 | 0.1 | 0.1 | 0.7 | 0.1 | 0.1 | 0.1 | 0.0 | 0.1 | 0.4 |
| Example 84 | 1.4 | 1.8 | 2.2 | 0.7 | 1.1 | 7.2 | 0.7 | 0.9 | 1.1 | 0.4 | 0.5 | 3.6 |
| Example 85 | 2.2 | 2.7 | 3.3 | 1.1 | 1.6 | 10.9 | 1.1 | 1.4 | 1.6 | 0.5 | 0.8 | 5.4 |
| Example 86 | 1.9 | 2.4 | 2.8 | 0.9 | 1.4 | 9.4 | 0.9 | 1.2 | 1.4 | 0.5 | 0.7 | 4.7 |
| Example 87 | 1.4 | 1.8 | 2.2 | 0.7 | 1.1 | 7.2 | 0.7 | 0.9 | 1.1 | 0.4 | 0.5 | 3.6 |
| Example 88 | 1.7 | 2.1 | 2.6 | 0.9 | 1.3 | 8.6 | 0.9 | 1.1 | 1.3 | 0.4 | 0.6 | 4.3 |
| Example 89 | 1.6 | 2.1 | 2.5 | 0.8 | 1.2 | 8.2 | 0.8 | 1.0 | 1.2 | 0.4 | 0.6 | 4.0 |
| Example 90 | 1.9 | 2.4 | 2.9 | 1.0 | 1.4 | 9.6 | 1.0 | 1.2 | 1.4 | 0.5 | 0.7 | 4.8 |
| Example 91 | 1.8 | 2.2 | 2.7 | 0.9 | 1.3 | 8.9 | 0.9 | 1.1 | 1.3 | 0.4 | 0.7 | 4.4 |
| Example 92 | 1.6 | 2.0 | 2.5 | 0.8 | 1.2 | 8.1 | 0.8 | 1.0 | 1.2 | 0.4 | 0.6 | 4.0 |
| Example 93 | 1.3 | 1.7 | 2.0 | 0.7 | 1.0 | 6.7 | 0.7 | 0.8 | 1.0 | 0.3 | 0.5 | 3.3 |
| Example 94 | 1.3 | 1.7 | 2.0 | 0.7 | 1.0 | 6.7 | 0.7 | 0.8 | 1.0 | 0.3 | 0.5 | 3.3 |
| Example 95 | 2.1 | 2.6 | 3.1 | 1.0 | 1.6 | 10.4 | 1.0 | 1.3 | 1.6 | 0.5 | 0.8 | 5.2 |
| Example 96 | 1.8 | 2.2 | 2.7 | 0.9 | 1.3 | 8.9 | 0.9 | 1.1 | 1.3 | 0.4 | 0.7 | 4.4 |
| Example 97 | 1.3 | 1.7 | 2.0 | 0.7 | 1.0 | 6.7 | 0.7 | 0.8 | 1.0 | 0.3 | 0.5 | 3.3 |
| Example 98 | 1.6 | 2.0 | 2.4 | 0.8 | 1.2 | 8.0 | 0.8 | 1.0 | 1.2 | 0.4 | 0.6 | 4.0 |
| Example 99 | 1.5 | 1.9 | 2.3 | 0.8 | 1.2 | 7.7 | 0.8 | 1.0 | 1.2 | 0.4 | 0.6 | 4.0 |

TABLE 16

| Table 1-3-4 | Elution test (increase in each component in test solvent before and after immersion) Result of elution test for second filter — Organic impurities: Type | Content (mass ppm) | Metal ions (mass ppb): Fe | Na | Ca | Al | K | Total |
|---|---|---|---|---|---|---|---|---|
| Example 67 | 1 | 242 | 1.4 | 1.8 | 2.1 | 0.7 | 1.1 | 7.1 |
| Example 68 | 1 | 236 | 1.4 | 1.7 | 2.1 | 0.7 | 1.0 | 6.9 |
| Example 69 | 1 | 265 | 1.5 | 1.9 | 2.3 | 0.8 | 1.2 | 7.7 |
| Example 70 | 1 | 176 | 1.0 | 1.3 | 1.5 | 0.5 | 0.8 | 5.1 |
| Example 71 | 1 | 186 | 1.1 | 1.4 | 1.6 | 0.5 | 0.8 | 5.4 |
| Example 72 | 1 | 205 | 1.2 | 1.5 | 1.8 | 0.6 | 0.9 | 6.0 |
| Example 73 | 1 | 271 | 1.6 | 2.0 | 2.4 | 0.8 | 1.2 | 8.0 |
| Example 74 | 1 | 239 | 1.4 | 1.7 | 2.1 | 0.7 | 1.0 | 6.9 |
| Example 75 | 1 | 230 | 1.3 | 1.7 | 2.0 | 0.7 | 1.0 | 6.7 |
| Example 76 | 1 | 243 | 1.4 | 1.8 | 2.1 | 0.7 | 1.1 | 7.1 |
| Example 77 | 1 | 230 | 1.3 | 1.7 | 2.0 | 0.7 | 1.0 | 6.7 |
| Example 78 | 1 | 182 | 1.1 | 1.3 | 1.6 | 0.5 | 0.8 | 5.3 |
| Example 79 | 1 | 144 | 0.8 | 1.1 | 1.3 | 0.4 | 0.6 | 4.2 |
| Example 80 | 1 | 154 | 0.9 | 1.1 | 1.3 | 0.4 | 0.7 | 4.4 |
| Example 81 | 1 | 241 | 1.4 | 1.8 | 2.1 | 0.7 | 1.1 | 7.1 |
| Example 82 | 1 | 204 | 1.2 | 1.5 | 1.8 | 0.6 | 0.9 | 6.0 |
| Example 83 | 1 | 20.4 | 0.1 | 0.1 | 0.2 | 0.1 | 0.1 | 0.6 |
| Example 84 | 1 | 204 | 1.2 | 1.5 | 1.8 | 0.6 | 0.9 | 6.0 |
| Example 85 | 1 | 310 | 1.8 | 2.3 | 2.7 | 0.9 | 1.4 | 9.1 |
| Example 86 | 1 | 270 | 1.6 | 2.0 | 2.4 | 0.8 | 1.2 | 8.0 |
| Example 87 | 1 | 205 | 1.2 | 1.5 | 1.8 | 0.6 | 0.9 | 6.0 |
| Example 88 | 1 | 243 | 1.4 | 1.8 | 2.1 | 0.7 | 1.1 | 7.1 |
| Example 89 | 1 | 234 | 1.4 | 1.7 | 2.0 | 0.7 | 1.0 | 6.8 |
| Example 90 | 1 | 271 | 1.6 | 2.0 | 2.4 | 0.8 | 1.2 | 8.0 |
| Example 91 | 1 | 252 | 1.5 | 1.8 | 2.2 | 0.7 | 1.1 | 7.3 |
| Example 92 | 1 | 233 | 1.4 | 1.7 | 2.0 | 0.7 | 1.0 | 6.8 |
| Example 93 | 1 | 190 | 1.1 | 1.4 | 1.7 | 0.6 | 0.8 | 5.6 |
| Example 94 | 1 | 190 | 1.1 | 1.4 | 1.7 | 0.6 | 0.8 | 5.6 |
| Example 95 | 1 | 295 | 1.7 | 2.2 | 2.6 | 0.9 | 1.3 | 8.7 |
| Example 96 | 1 | 256 | 1.5 | 1.9 | 2.2 | 0.7 | 1.1 | 7.4 |
| Example 97 | 1 | 191 | 1.1 | 1.4 | 1.7 | 0.6 | 0.8 | 5.6 |
| Example 98 | 1 | 229 | 1.3 | 1.7 | 2.0 | 0.7 | 1.0 | 6.7 |
| Example 99 | 1 | 219 | 1.3 | 1.6 | 1.9 | 0.6 | 1.0 | 6.4 |

TABLE 17

| Table 1-3-5 | Elution test (increase in each component in test solvent before and after immersion) Result of elution test for second filter — Metal particles (mass ppb): Fe | Na | Ca | Al | K | Total | Result of elution test for third filter — Organic impurities: Type | Content (ppm) | Metal ions (mass ppb): Fe | Na | Ca | Al | K | Total |
|---|---|---|---|---|---|---|---|---|---|---|---|---|---|---|
| Example 67 | 0.7 | 0.8 | 1.0 | 0.3 | 0.5 | 3.3 | | | | | | | | |
| Example 68 | 0.7 | 0.8 | 1.0 | 0.3 | 0.5 | 3.3 | | | | | | | | |
| Example 69 | 0.7 | 0.9 | 1.1 | 0.4 | 0.6 | 3.7 | | | | | | | | |
| Example 70 | 0.5 | 0.6 | 0.7 | 0.2 | 0.4 | 2.4 | | | | | | | | |
| Example 71 | 0.5 | 0.6 | 0.8 | 0.3 | 0.4 | 2.6 | | | | | | | | |
| Example 72 | 0.6 | 0.7 | 0.9 | 0.3 | 0.4 | 2.9 | | | | | | | | |
| Example 73 | 0.8 | 0.9 | 1.1 | 0.4 | 0.6 | 3.8 | | | | | | | | |
| Example 74 | 0.7 | 0.8 | 1.0 | 0.3 | 0.5 | 3.3 | | | | | | | | |
| Example 75 | 0.6 | 0.8 | 1.0 | 0.3 | 0.5 | 3.2 | | | | | | | | |
| Example 76 | 0.7 | 0.8 | 1.0 | 0.3 | 0.5 | 3.3 | | | | | | | | |
| Example 77 | 0.6 | 0.8 | 1.0 | 0.3 | 0.5 | 3.2 | | | | | | | | |
| Example 78 | 0.5 | 0.6 | 0.8 | 0.3 | 0.4 | 2.6 | | | | | | | | |
| Example 79 | 0.4 | 0.5 | 0.6 | 0.2 | 0.3 | 2.0 | | | | | | | | |
| Example 80 | 0.4 | 0.5 | 0.6 | 0.2 | 0.3 | 2.0 | | | | | | | | |
| Example 81 | 0.7 | 0.8 | 1.0 | 0.3 | 0.5 | 3.3 | | | | | | | | |
| Example 82 | 0.6 | 0.7 | 0.8 | 0.3 | 0.4 | 2.8 | 1 | 194 | 1.0 | 1.2 | 1.5 | 0.5 | 0.7 | 4.9 |
| Example 83 | 0.1 | 0.1 | 0.1 | 0.0 | 0.0 | 0.3 | 1 | 19 | 0.1 | 0.1 | 0.1 | 0.0 | 0.1 | 0.4 |
| Example 84 | 0.6 | 0.7 | 0.8 | 0.3 | 0.4 | 2.8 | 1 | 194 | 1.0 | 1.2 | 1.5 | 0.5 | 0.7 | 4.9 |
| Example 85 | 0.9 | 1.1 | 1.3 | 0.4 | 0.6 | 4.3 | 1 | 294 | 1.5 | 1.9 | 2.2 | 0.7 | 1.1 | 7.4 |
| Example 86 | 0.7 | 0.9 | 1.1 | 0.4 | 0.6 | 3.7 | 1 | 256 | 1.3 | 1.6 | 2.0 | 0.7 | 1.0 | 6.6 |
| Example 87 | 0.6 | 0.7 | 0.9 | 0.3 | 0.4 | 2.9 | 1 | 195 | 1.0 | 1.2 | 1.5 | 0.5 | 0.7 | 4.9 |

TABLE 17-continued

| Table 1-3-5 | Elution test (increase in each component in test solvent before and after immersion) Result of elution test for second filter Metal particles (mass ppb) Fe | Na | Ca | Al | K | Total | Result of elution test for third filter Organic impurities Type | Content (ppm) | Metal ions (mass ppb) Fe | Na | Ca | Al | K | Total |
|---|---|---|---|---|---|---|---|---|---|---|---|---|---|---|
| Example 88 | 0.7 | 0.8 | 1.0 | 0.3 | 0.5 | 3.3 | 1 | 231 | 1.2 | 1.5 | 1.8 | 0.6 | 0.9 | 6.0 |
| Example 89 | 0.6 | 0.8 | 1.0 | 0.3 | 0.5 | 3.2 | 1 | 222 | 1.1 | 1.4 | 1.7 | 0.6 | 0.8 | 5.6 |
| Example 90 | 0.8 | 0.9 | 1.1 | 0.4 | 0.6 | 3.8 | 1 | 257 | 1.3 | 1.6 | 2.0 | 0.7 | 1.0 | 6.6 |
| Example 91 | 0.7 | 0.9 | 1.0 | 0.3 | 0.5 | 3.4 | 1 | 239 | 1.2 | 1.5 | 1.8 | 0.6 | 0.9 | 6.0 |
| Example 92 | 0.6 | 0.8 | 1.0 | 0.3 | 0.5 | 3.2 | 1 | 221 | 1.1 | 1.4 | 1.7 | 0.6 | 0.8 | 5.6 |
| Example 93 | 0.5 | 0.7 | 0.8 | 0.3 | 0.4 | 2.7 | 1 | 181 | 0.9 | 1.1 | 1.4 | 0.5 | 0.7 | 4.6 |
| Example 94 | 0.5 | 0.7 | 0.8 | 0.3 | 0.4 | 2.7 | 1 | 181 | 0.9 | 1.1 | 1.4 | 0.5 | 0.7 | 4.6 |
| Example 95 | 0.8 | 1.0 | 1.2 | 0.4 | 0.6 | 4.0 | 1 | 281 | 1.4 | 1.8 | 2.1 | 0.7 | 1.1 | 7.1 |
| Example 96 | 0.7 | 0.9 | 1.1 | 0.4 | 0.5 | 3.6 | 1 | 243 | 1.2 | 1.5 | 1.9 | 0.6 | 0.9 | 6.1 |
| Example 97 | 0.5 | 0.7 | 0.8 | 0.3 | 0.4 | 2.7 | 1 | 181 | 0.9 | 1.2 | 1.4 | 0.5 | 0.7 | 4.7 |
| Example 98 | 0.6 | 0.8 | 1.0 | 0.3 | 0.5 | 3.2 | 1 | 218 | 1.1 | 1.4 | 1.7 | 0.6 | 0.8 | 5.6 |
| Example 99 | 0.6 | 0.8 | 0.9 | 0.3 | 0.5 | 3.1 | 1 | 208 | 1.1 | 1.3 | 1.6 | 0.5 | 0.8 | 5.3 |

TABLE 18

| Table 1-3-6 | Elution test (increase in each component in test solvent before and after immersion) Result of elution test for third filter Metal particles (mass ppb) Fe | Na | Ca | Al | K | Total | Substance to be purified Organic solvent | Defect inhibition performance |
|---|---|---|---|---|---|---|---|---|
| Example 67 | | | | | | | PGMEA | B |
| Example 68 | | | | | | | PGMEA | A |
| Example 69 | | | | | | | PGMEA | A |
| Example 70 | | | | | | | PGMEA | A |
| Example 71 | | | | | | | PGMEA | A |
| Example 72 | | | | | | | PGMEA | A |
| Example 73 | | | | | | | PGMEA | B |
| Example 74 | | | | | | | PGMEA | C |
| Example 75 | | | | | | | PGMEA | B |
| Example 76 | | | | | | | nBA | A |
| Example 77 | | | | | | | CyHe | A |
| Example 78 | | | | | | | MIBC | A |
| Example 79 | | | | | | | iAA | A |
| Example 80 | | | | | | | PGME | A |
| Example 81 | | | | | | | IPA | A |
| Example 82 | 0.4 | 0.6 | 0.7 | 0.2 | 0.3 | 2.2 | PGMEA | AA |
| Example 83 | 0.0 | 0.1 | 0.1 | 0.0 | 0.0 | 0.2 | PGMEA | A |
| Example 84 | 0.4 | 0.6 | 0.7 | 0.2 | 0.3 | 2.2 | PGMEA | AA |
| Example 85 | 0.7 | 0.8 | 1.0 | 0.3 | 0.5 | 3.3 | PGMEA | AA |
| Example 86 | 0.6 | 0.7 | 0.9 | 0.3 | 0.4 | 2.9 | PGMEA | AA |
| Example 87 | 0.4 | 0.6 | 0.7 | 0.2 | 0.3 | 2.2 | PGMEA | AA |
| Example 88 | 0.5 | 0.7 | 0.8 | 0.3 | 0.4 | 2.7 | PGMEA | AA |
| Example 89 | 0.5 | 0.6 | 0.8 | 0.3 | 0.4 | 2.6 | PGMEA | AA |
| Example 90 | 0.6 | 0.7 | 0.9 | 0.3 | 0.4 | 2.9 | PGMEA | AA |
| Example 91 | 0.6 | 0.7 | 0.8 | 0.3 | 0.4 | 2.8 | PGMEA | AA |
| Example 92 | 0.5 | 0.6 | 0.8 | 0.3 | 0.4 | 2.6 | PGMEA | AA |
| Example 93 | 0.4 | 0.5 | 0.6 | 0.2 | 0.3 | 2.0 | PGMEA | A |
| Example 94 | 0.4 | 0.5 | 0.6 | 0.2 | 0.3 | 2.0 | PGMEA | A |
| Example 95 | 0.6 | 0.8 | 1.0 | 0.3 | 0.5 | 3.2 | PGMEA | A |
| Example 96 | 0.6 | 0.7 | 0.8 | 0.3 | 0.4 | 2.8 | PGMEA | B |
| Example 97 | 0.4 | 0.5 | 0.6 | 0.2 | 0.3 | 2.0 | PGMEA | A |
| Example 98 | 0.5 | 0.6 | 0.8 | 0.3 | 0.4 | 2.6 | PGMEA | A |
| Example 99 | 0.5 | 0.6 | 0.7 | 0.2 | 0.4 | 2.4 | PGMEA | A |

TABLE 19

| Table 1-4-1 | Filter unit (first to third filter units are arranged in this order from primary side) | | | | | |
|---|---|---|---|---|---|---|
| | First filter unit (accommodating first filter) | | | Second filter unit (accommodating second filter) | | |
| | Material of filter | Supply pressure (MPa) | Pore size (nm) | Material of filter | Supply pressure (MPa) | Pore size (nm) |
| Example 100 | PP | 0.2 | 200 | PTFE | 0.1 | 15 |
| Example 101 | PP | 0.2 | 200 | PTFE | 0.1 | 15 |
| Example 102 | PP | 0.2 | 200 | PTFE | 0.1 | 15 |
| Example 103 | HDPE | 0.2 | 100 | PTFE | 0.05 | 15 |
| Example 104 | HDPE | 0.1 | 100 | PTFE | 0.05 | 15 |
| Example 105 | HDPE | 0.2 | 100 | PTFE | 0.1 | 15 |
| Example 106 | HDPE | 0.2 | 100 | PTFE | 0.1 | 15 |
| Example 107 | HDPE | 0.2 | 100 | PTFE | 0.1 | 15 |
| Example 108 | HDPE | 0.2 | 100 | PTFE | 0.05 | 15 |
| Example 109 | HDPE | 0.1 | 100 | PTFE | 0.05 | 15 |
| Example 110 | HDPE | 0.2 | 100 | PTFE | 0.1 | 15 |
| Example 111 | HDPE | 0.2 | 100 | PTFE | 0.1 | 15 |
| Example 112 | HDPE | 0.2 | 100 | PTFE | 0.1 | 15 |
| Example 113 | PP | 0.2 | 200 | PTFE(IEX) | 0.05 | 15 |
| Example 114 | PP | 0.1 | 200 | PTFE(IEX) | 0.05 | 15 |
| Example 115 | PP | 0.2 | 200 | PTFE(IEX) | 0.1 | 15 |
| Example 116 | PP | 0.2 | 200 | PTFE(IEX) | 0.1 | 15 |
| Example 117 | PP | 0.2 | 200 | PTFE(IEX) | 0.1 | 15 |
| Example 118 | PP | 0.2 | 200 | PTFE(IEX) | 0.05 | 15 |
| Example 119 | PP | 0.1 | 200 | PTFE(IEX) | 0.05 | 15 |
| Example 120 | PP | 0.2 | 200 | PTFE(IEX) | 0.1 | 15 |
| Example 121 | PP | 0.2 | 200 | PTFE(IEX) | 0.1 | 15 |
| Example 122 | UPE | 0.015 | 3 | PP | 0.2 | 200 |
| Example 123 | UPE | 0.015 | 3 | PP | 0.2 | 200 |
| Example 124 | UPE | 0.02 | 3 | PP | 0.1 | 200 |
| Example 125 | Nylon | 0.015 | 5 | PP | 0.2 | 200 |
| Example 126 | Nylon | 0.015 | 5 | PP | 0.1 | 200 |
| Comparative Example 1 | PTFE | 0.1 | 15 | UPE | 0.1 | 15 |
| Comparative Example 2 | PTFE | 0.1 | 20 | UPE | 0.1 | 10 |
| Comparative Example 3 | PTFE | 0.1 | 15 | UPE | 0.2 | 3 |
| Comparative Example 4 | PTFE | 0.1 | 15 | UPE | 0.2 | 1 |
| Comparative Example 5 | PTFE | 0.1 | 10 | UPE | 0.2 | 1 |
| Comparative Example 6 | PTFE | 0.1 | 10 | UPE | 0.2 | 3 |

TABLE 20

| Table 1-4-2 | Filter unit (first to third filter units are arranged in this order from primary side) Third filter unit (accommodating third filter) | | | | | Elution test (increase in each component in test solvent before and after immersion) Result of elution test for first filter Organic impurities | |
|---|---|---|---|---|---|---|---|
| | Material of filter | Supply pressure (MPa) | Pore size (nm) | Circulation | Washing solution | Type | Content (mass ppm) |
| Example 100 | Nylon | 0.015 | 5 | N/A | PGMEA | 1 | 270 |
| Example 101 | Nylon | 0.015 | 5 | N/A | PGMEA | 1 | 250 |
| Example 102 | Nylon | 0.015 | 5 | N/A | PGMEA | 1 | 230 |
| Example 103 | UPE | 0.015 | 3 | N/A | PGMEA | 1 | 215 |
| Example 104 | UPE | 0.015 | 3 | N/A | PGMEA | 1 | 215 |
| Example 105 | UPE | 0.02 | 3 | N/A | PGMEA | 1 | 326 |
| Example 106 | UPE | 0.04 | 3 | N/A | PGMEA | 1 | 284 |
| Example 107 | UPE | 0.015 | 3 | N/A | PGMEA | 1 | 216 |
| Example 108 | Nylon | 0.015 | 5 | N/A | PGMEA | 1 | 256 |
| Example 109 | Nylon | 0.015 | 5 | N/A | PGMEA | 1 | 246 |
| Example 110 | Nylon | 0.015 | 5 | N/A | PGMEA | 1 | 285 |
| Example 111 | Nylon | 0.015 | 5 | N/A | PGMEA | 1 | 265 |
| Example 112 | Nylon | 0.015 | 5 | N/A | PGMEA | 1 | 245 |
| Example 113 | UPE | 0.015 | 3 | N/A | PGMEA | 1 | 165 |
| Example 114 | UPE | 0.015 | 3 | N/A | PGMEA | 1 | 165 |
| Example 115 | UPE | 0.02 | 3 | N/A | PGMEA | 1 | 276 |

TABLE 20-continued

| Table 1-4-2 | Filter unit (first to third filter units are arranged in this order from primary side) Third filter unit (accommodating third filter) Material of filter | Supply pressure (MPa) | Pore size (nm) | Circulation | Washing solution | Elution test (increase in each component in test solvent before and after immersion) Result of elution test for first filter Organic impurities Type | Content (mass ppm) |
|---|---|---|---|---|---|---|---|
| Example 116 | UPE | 0.04 | 3 | N/A | PGMEA | 1 | 234 |
| Example 117 | UPE | 0.015 | 3 | N/A | PGMEA | 1 | 166 |
| Example 118 | Nylon | 0.015 | 5 | N/A | PGMEA | 1 | 206 |
| Example 119 | Nylon | 0.015 | 5 | N/A | PGMEA | 1 | 196 |
| Example 120 | Nylon | 0.015 | 5 | N/A | PGMEA | 1 | 235 |
| Example 121 | Nylon | 0.015 | 5 | N/A | PGMEA | 1 | 215 |
| Example 122 | PTFE(IEX) | 0.1 | 15 | N/A | PGMEA | 1 | 195 |
| Example 123 | PTFE(IEX) | 0.05 | 15 | N/A | PGMEA | 1 | 115 |
| Example 124 | PTFE(IEX) | 0.05 | 15 | N/A | PGMEA | 1 | 115 |
| Example 125 | PTFE(IEX) | 0.1 | 15 | N/A | PGMEA | 1 | 226 |
| Example 126 | PTFE(IEX) | 0.05 | 15 | N/A | PGMEA | 1 | 184 |
| Comparative Example 1 | | | | N/A | PGMEA | 1 | 1258 |
| Comparative Example 2 | | | | N/A | PGMEA | 1 | 1384 |
| Comparative Example 3 | | | | N/A | PGMEA | 1 | 1568 |
| Comparative Example 4 | | | | N/A | PGMEA | 1 | 1254 |
| Comparative Example 5 | | | | N/A | PGMEA | 1 | 1245 |
| Comparative Example 6 | | | | N/A | PGMEA | 1 | 1098 |

TABLE 21

| | Elution test (increase in each component in test solvent before and after immersion) Result of elution test for first filter | | | | | | | | | | | |
|---|---|---|---|---|---|---|---|---|---|---|---|---|
| | Metal ions (mass ppb) | | | | | | Metal particles (mass ppb) | | | | | |
| Table 1-4-3 | Fe | Na | Ca | Al | K | Total | Fe | Na | Ca | Al | K | Total |
| Example 100 | 1.8 | 2.3 | 2.7 | 0.9 | 1.4 | 9.1 | 0.9 | 1.1 | 1.4 | 0.5 | 0.7 | 4.6 |
| Example 101 | 1.7 | 2.1 | 2.5 | 0.8 | 1.3 | 8.4 | 0.8 | 1.0 | 1.3 | 0.4 | 0.6 | 4.1 |
| Example 102 | 1.5 | 1.9 | 2.3 | 0.8 | 1.2 | 7.7 | 0.8 | 1.0 | 1.2 | 0.4 | 0.6 | 4.0 |
| Example 103 | 1.4 | 1.8 | 2.2 | 0.7 | 1.1 | 7.2 | 0.7 | 0.9 | 1.1 | 0.4 | 0.5 | 3.6 |
| Example 104 | 1.4 | 1.8 | 2.2 | 0.7 | 1.1 | 7.2 | 0.7 | 0.9 | 1.1 | 0.4 | 0.5 | 3.6 |
| Example 105 | 2.2 | 2.7 | 3.3 | 1.1 | 1.6 | 10.9 | 1.1 | 1.4 | 1.6 | 0.5 | 0.8 | 5.4 |
| Example 106 | 1.9 | 2.4 | 2.8 | 0.9 | 1.4 | 9.4 | 0.9 | 1.2 | 1.4 | 0.5 | 0.7 | 4.7 |
| Example 107 | 1.4 | 1.8 | 2.2 | 0.7 | 1.1 | 7.2 | 0.7 | 0.9 | 1.1 | 0.4 | 0.5 | 3.6 |
| Example 108 | 1.7 | 2.1 | 2.6 | 0.9 | 1.3 | 8.6 | 0.9 | 1.1 | 1.3 | 0.4 | 0.6 | 4.3 |
| Example 109 | 1.6 | 2.1 | 2.5 | 0.8 | 1.2 | 8.2 | 0.8 | 1.0 | 1.2 | 0.4 | 0.6 | 4.0 |
| Example 110 | 1.9 | 2.4 | 2.9 | 1.0 | 1.4 | 9.6 | 1.0 | 1.2 | 1.4 | 0.5 | 0.7 | 4.8 |
| Example 111 | 1.8 | 2.2 | 2.7 | 0.9 | 1.3 | 8.9 | 0.9 | 1.1 | 1.3 | 0.4 | 0.7 | 4.4 |
| Example 112 | 1.6 | 2.0 | 2.5 | 0.8 | 1.2 | 8.1 | 0.8 | 1.0 | 1.2 | 0.4 | 0.6 | 4.0 |
| Example 113 | 1.1 | 1.4 | 1.7 | 0.6 | 0.8 | 5.6 | 0.6 | 0.7 | 0.8 | 0.3 | 0.4 | 2.8 |
| Example 114 | 1.1 | 1.4 | 1.7 | 0.6 | 0.8 | 5.6 | 0.6 | 0.7 | 0.8 | 0.3 | 0.4 | 2.8 |
| Example 115 | 1.8 | 2.3 | 2.8 | 0.9 | 1.4 | 9.2 | 0.9 | 1.2 | 1.4 | 0.5 | 0.7 | 4.7 |
| Example 116 | 1.6 | 2.0 | 2.3 | 0.8 | 1.2 | 7.9 | 0.8 | 1.0 | 1.2 | 0.4 | 0.6 | 4.0 |
| Example 117 | 1.1 | 1.4 | 1.7 | 0.6 | 0.8 | 5.6 | 0.6 | 0.7 | 0.8 | 0.3 | 0.4 | 2.8 |
| Example 118 | 1.4 | 1.7 | 2.1 | 0.7 | 1.0 | 6.9 | 0.7 | 0.9 | 1.0 | 0.3 | 0.5 | 3.4 |
| Example 119 | 1.3 | 1.6 | 2.0 | 0.7 | 1.0 | 6.6 | 0.7 | 0.8 | 1.0 | 0.3 | 0.5 | 3.3 |
| Example 120 | 1.6 | 2.0 | 2.4 | 0.8 | 1.2 | 8.0 | 0.8 | 1.0 | 1.2 | 0.4 | 0.6 | 4.0 |
| Example 121 | 1.4 | 1.8 | 2.2 | 0.7 | 1.1 | 7.2 | 0.7 | 0.9 | 1.1 | 0.4 | 0.5 | 3.6 |
| Example 122 | 1.3 | 1.6 | 2.0 | 0.7 | 1.0 | 6.6 | 0.7 | 0.8 | 1.0 | 0.3 | 0.5 | 3.3 |
| Example 123 | 0.8 | 1.0 | 1.2 | 0.4 | 0.6 | 4.0 | 0.4 | 0.5 | 0.6 | 0.2 | 0.3 | 2.0 |
| Example 124 | 0.8 | 1.0 | 1.2 | 0.4 | 0.6 | 4.0 | 0.4 | 0.5 | 0.6 | 0.2 | 0.3 | 2.0 |
| Example 125 | 1.5 | 1.9 | 2.3 | 0.8 | 1.1 | 7.6 | 0.8 | 0.9 | 1.1 | 0.4 | 0.6 | 3.8 |
| Example 126 | 1.2 | 1.5 | 1.8 | 0.6 | 0.9 | 6.0 | 0.6 | 0.8 | 0.9 | 0.3 | 0.5 | 3.1 |
| Comparative Example 1 | 8.4 | 10.5 | 12.6 | 4.2 | 6.3 | 42.0 | 4.2 | 5.2 | 6.3 | 2.1 | 3.1 | 20.9 |
| Comparative Example 2 | 9.2 | 11.5 | 13.8 | 4.6 | 6.9 | 46.0 | 4.6 | 5.8 | 6.9 | 2.3 | 3.5 | 23.1 |
| Comparative Example 3 | 10.5 | 13.1 | 15.7 | 5.2 | 7.8 | 52.3 | 5.2 | 6.5 | 7.8 | 2.6 | 3.9 | 26.0 |

TABLE 21-continued

| Table 1-4-3 | Metal ions (mass ppb) Fe | Na | Ca | Al | K | Total | Metal particles (mass ppb) Fe | Na | Ca | Al | K | Total |
|---|---|---|---|---|---|---|---|---|---|---|---|---|
| Comparative Example 4 | 8.4 | 10.5 | 12.5 | 4.2 | 6.3 | 41.9 | 4.2 | 5.2 | 6.3 | 2.1 | 3.1 | 20.9 |
| Comparative Example 5 | 8.3 | 10.4 | 12.5 | 4.2 | 6.2 | 41.6 | 4.2 | 5.2 | 6.2 | 2.1 | 3.1 | 20.8 |
| Comparative Example 6 | 7.3 | 9.1 | 11.0 | 3.7 | 5.5 | 36.6 | 3.7 | 4.6 | 5.5 | 1.8 | 2.7 | 18.3 |

Elution test (increase in each component in test solvent before and after immersion) Result of elution test for first filter

TABLE 22

| Table 1-4-4 | Organic impurities Type | Organic impurities Content (mass ppm) | Metal ions (mass ppb) Fe | Na | Ca | Al | K | Total |
|---|---|---|---|---|---|---|---|---|
| Example 100 | 1 | 257 | 1.5 | 1.9 | 2.2 | 0.7 | 1.1 | 7.4 |
| Example 101 | 1 | 238 | 1.4 | 1.7 | 2.1 | 0.7 | 1.0 | 6.9 |
| Example 102 | 1 | 219 | 1.3 | 1.6 | 1.9 | 0.6 | 1.0 | 6.4 |
| Example 103 | 1 | 204 | 1.2 | 1.5 | 1.8 | 0.6 | 0.9 | 6.0 |
| Example 104 | 1 | 204 | 1.2 | 1.5 | 1.8 | 0.6 | 0.9 | 6.0 |
| Example 105 | 1 | 310 | 1.8 | 2.3 | 2.7 | 0.9 | 1.4 | 9.1 |
| Example 106 | 1 | 270 | 1.6 | 2.0 | 2.4 | 0.8 | 1.2 | 8.0 |
| Example 107 | 1 | 205 | 1.2 | 1.5 | 1.8 | 0.6 | 0.9 | 6.0 |
| Example 108 | 1 | 243 | 1.4 | 1.8 | 2.1 | 0.7 | 1.1 | 7.1 |
| Example 109 | 1 | 234 | 1.4 | 1.7 | 2.0 | 0.7 | 1.0 | 6.8 |
| Example 110 | 1 | 271 | 1.6 | 2.0 | 2.4 | 0.8 | 1.2 | 8.0 |
| Example 111 | 1 | 252 | 1.5 | 1.8 | 2.2 | 0.7 | 1.1 | 7.3 |
| Example 112 | 1 | 233 | 1.4 | 1.7 | 2.0 | 0.7 | 1.0 | 6.8 |
| Example 113 | 1 | 157 | 0.9 | 1.1 | 1.4 | 0.5 | 0.7 | 4.6 |
| Example 114 | 1 | 157 | 0.9 | 1.1 | 1.4 | 0.5 | 0.7 | 4.6 |
| Example 115 | 1 | 262 | 1.5 | 1.9 | 2.3 | 0.8 | 1.1 | 7.6 |
| Example 116 | 1 | 222 | 1.3 | 1.6 | 1.9 | 0.6 | 1.0 | 6.4 |
| Example 117 | 1 | 158 | 0.9 | 1.1 | 1.4 | 0.5 | 0.7 | 4.6 |
| Example 118 | 1 | 196 | 1.1 | 1.4 | 1.7 | 0.6 | 0.9 | 5.7 |
| Example 119 | 1 | 186 | 1.1 | 1.4 | 1.6 | 0.5 | 0.8 | 5.4 |
| Example 120 | 1 | 223 | 1.3 | 1.6 | 2.0 | 0.7 | 1.0 | 6.6 |
| Example 121 | 1 | 204 | 1.2 | 1.5 | 1.8 | 0.6 | 0.9 | 6.0 |
| Example 122 | 1 | 185 | 1.1 | 1.3 | 1.6 | 0.5 | 0.8 | 5.3 |
| Example 123 | 1 | 109 | 0.6 | 0.8 | 1.0 | 0.3 | 0.5 | 3.2 |
| Example 124 | 1 | 109 | 0.6 | 0.8 | 1.0 | 0.3 | 0.5 | 3.2 |
| Example 125 | 1 | 215 | 1.3 | 1.6 | 1.9 | 0.6 | 0.9 | 6.3 |
| Example 126 | 1 | 175 | 1.0 | 1.3 | 1.5 | 0.5 | 0.8 | 5.1 |
| Comparative Example 1 | 1 | 1,195 | 7.0 | 8.7 | 10.4 | 3.5 | 5.2 | 34.8 |
| Comparative Example 2 | 1 | 1,315 | 7.7 | 9.6 | 11.5 | 3.8 | 5.7 | 38.3 |
| Comparative Example 3 | 1 | 1,490 | 8.7 | 10.8 | 13.0 | 4.3 | 6.5 | 43.3 |
| Comparative Example 4 | 1 | 1,192 | 6.9 | 8.7 | 10.4 | 3.5 | 5.2 | 34.7 |
| Comparative Example 5 | 1 | 1,183 | 6.9 | 8.6 | 10.3 | 3.4 | 5.2 | 34.4 |
| Comparative Example 6 | 1 | 1,043 | 6.1 | 7.6 | 9.1 | 3.0 | 4.6 | 30.4 |

Elution test (increase in each component in test solvent before and after immersion) Result of elution test for second filter

TABLE 23

| | Elution test (increase in each component in test solvent before and after immersion) | | | | | | | | | | | | | | |
|---|---|---|---|---|---|---|---|---|---|---|---|---|---|---|---|
| | | | | | | | Result of elution test for third filter | | | | | | | | |
| | Result of elution test for second filter | | | | | | Organic impurities | | | | | | | | |
| | Metal particles (mass ppb) | | | | | | | Content | Metal ions (mass ppb) | | | | | | |
| Table 1-4-5 | Fe | Na | Ca | Al | K | Total | Type | (ppm) | Fe | Na | Ca | Al | K | Total |
| Example 100 | 0.7 | 0.9 | 1.1 | 0.4 | 0.5 | 3.6 | 1 | 244 | 1.2 | 1.6 | 1.9 | 0.6 | 0.9 | 6.2 |
| Example 101 | 0.7 | 0.8 | 1.0 | 0.3 | 0.5 | 3.3 | 1 | 226 | 1.1 | 1.4 | 1.7 | 0.6 | 0.9 | 5.7 |
| Example 102 | 0.6 | 0.8 | 0.9 | 0.3 | 0.5 | 3.1 | 1 | 208 | 1.1 | 1.3 | 1.6 | 0.5 | 0.8 | 5.3 |
| Example 103 | 0.6 | 0.7 | 0.8 | 0.3 | 0.4 | 2.8 | 1 | 194 | 1.0 | 1.2 | 1.5 | 0.5 | 0.7 | 4.9 |
| Example 104 | 0.6 | 0.7 | 0.8 | 0.3 | 0.4 | 2.8 | 1 | 194 | 1.0 | 1.2 | 1.5 | 0.5 | 0.7 | 4.9 |
| Example 105 | 0.9 | 1.1 | 1.3 | 0.4 | 0.6 | 4.3 | 1 | 294 | 1.5 | 1.9 | 2.2 | 0.7 | 1.1 | 7.4 |
| Example 106 | 0.7 | 0.9 | 1.1 | 0.4 | 0.6 | 3.7 | 1 | 256 | 1.3 | 1.6 | 2.0 | 0.7 | 1.0 | 6.6 |
| Example 107 | 0.6 | 0.7 | 0.9 | 0.3 | 0.4 | 2.9 | 1 | 195 | 1.0 | 1.2 | 1.5 | 0.5 | 0.7 | 4.9 |
| Example 108 | 0.7 | 0.8 | 1.0 | 0.3 | 0.5 | 3.3 | 1 | 231 | 1.2 | 1.5 | 1.8 | 0.6 | 0.9 | 6.0 |
| Example 109 | 0.6 | 0.8 | 1.0 | 0.3 | 0.5 | 3.2 | 1 | 222 | 1.1 | 1.4 | 1.7 | 0.6 | 0.8 | 5.6 |
| Example 110 | 0.8 | 0.9 | 1.1 | 0.4 | 0.6 | 3.8 | 1 | 257 | 1.3 | 1.6 | 2.0 | 0.7 | 1.0 | 6.6 |
| Example 111 | 0.7 | 0.9 | 1.0 | 0.3 | 0.5 | 3.4 | 1 | 239 | 1.2 | 1.5 | 1.8 | 0.6 | 0.9 | 6.0 |
| Example 112 | 0.6 | 0.8 | 1.0 | 0.3 | 0.5 | 3.2 | 1 | 221 | 1.1 | 1.4 | 1.7 | 0.6 | 0.8 | 5.6 |
| Example 113 | 0.4 | 0.5 | 0.7 | 0.2 | 0.3 | 2.1 | 1 | 149 | 0.8 | 0.9 | 1.1 | 0.4 | 0.6 | 3.8 |
| Example 114 | 0.4 | 0.5 | 0.7 | 0.2 | 0.3 | 2.1 | 1 | 149 | 0.8 | 0.9 | 1.1 | 0.4 | 0.6 | 3.8 |
| Example 115 | 0.7 | 0.9 | 1.1 | 0.4 | 0.5 | 3.6 | 1 | 249 | 1.3 | 1.6 | 1.9 | 0.6 | 1.0 | 6.4 |
| Example 116 | 0.6 | 0.8 | 0.9 | 0.3 | 0.5 | 3.1 | 1 | 211 | 1.1 | 1.3 | 1.6 | 0.5 | 0.8 | 5.3 |
| Example 117 | 0.4 | 0.5 | 0.7 | 0.2 | 0.3 | 2.1 | 1 | 150 | 0.8 | 1.0 | 1.1 | 0.4 | 0.6 | 3.9 |
| Example 118 | 0.5 | 0.7 | 0.8 | 0.3 | 0.4 | 2.7 | 1 | 186 | 0.9 | 1.2 | 1.4 | 0.5 | 0.7 | 4.7 |
| Example 119 | 0.5 | 0.6 | 0.8 | 0.3 | 0.4 | 2.6 | 1 | 177 | 0.9 | 1.1 | 1.4 | 0.5 | 0.7 | 4.6 |
| Example 120 | 0.6 | 0.8 | 0.9 | 0.3 | 0.5 | 3.1 | 1 | 212 | 1.1 | 1.3 | 1.6 | 0.5 | 0.8 | 5.3 |
| Example 121 | 0.6 | 0.7 | 0.8 | 0.3 | 0.4 | 2.8 | 1 | 194 | 1.0 | 1.2 | 1.5 | 0.5 | 0.7 | 4.9 |
| Example 122 | 0.5 | 0.6 | 0.8 | 0.3 | 0.4 | 2.6 | 1 | 176 | 0.9 | 1.1 | 1.3 | 0.4 | 0.7 | 4.4 |
| Example 123 | 0.3 | 0.4 | 0.5 | 0.2 | 0.2 | 1.6 | 1 | 104 | 0.5 | 0.7 | 0.8 | 0.3 | 0.4 | 2.7 |
| Example 124 | 0.3 | 0.4 | 0.5 | 0.2 | 0.2 | 1.6 | 1 | 104 | 0.5 | 0.7 | 0.8 | 0.3 | 0.4 | 2.7 |
| Example 125 | 0.6 | 0.7 | 0.9 | 0.3 | 0.4 | 2.9 | 1 | 204 | 1.0 | 1.3 | 1.6 | 0.5 | 0.8 | 5.2 |
| Example 126 | 0.5 | 0.6 | 0.7 | 0.2 | 0.4 | 2.4 | 1 | 166 | 0.8 | 1.1 | 1.3 | 0.4 | 0.6 | 4.2 |
| Comparative Example 1 | 3.3 | 4.1 | 5.0 | 1.7 | 2.5 | 16.6 | | | | | | | | |
| Comparative Example 2 | 3.6 | 4.6 | 5.5 | 1.8 | 2.7 | 18.2 | | | | | | | | |
| Comparative Example 3 | 4.1 | 5.2 | 6.2 | 2.1 | 3.1 | 20.7 | | | | | | | | |
| Comparative Example 4 | 3.3 | 4.1 | 5.0 | 1.7 | 2.5 | 16.6 | | | | | | | | |
| Comparative Example 5 | 3.3 | 4.1 | 4.9 | 1.6 | 2.5 | 16.4 | | | | | | | | |
| Comparative Example 6 | 2.9 | 3.6 | 4.3 | 1.4 | 2.2 | 14.4 | | | | | | | | |

TABLE 24

| | Elution test (increase in each component in test solvent before and after immersion) Result of elution test for third filter Metal particles (mass ppb) | | | | | | Substance to be purified Organic | Defect inhibition |
|---|---|---|---|---|---|---|---|---|
| Table 1-4-6 | Fe | Na | Ca | Al | K | Total | solvent | performance |
| Example 100 | 0.6 | 0.7 | 0.8 | 0.3 | 0.4 | 2.8 | PGMEA | A |
| Example 101 | 0.5 | 0.7 | 0.8 | 0.3 | 0.4 | 2.7 | PGMEA | A |
| Example 102 | 0.5 | 0.6 | 0.7 | 0.2 | 0.4 | 2.4 | PGMEA | A |
| Example 103 | 0.4 | 0.6 | 0.7 | 0.2 | 0.3 | 2.2 | PGMEA | AA |
| Example 104 | 0.4 | 0.6 | 0.7 | 0.2 | 0.3 | 2.2 | PGMEA | AA |
| Example 105 | 0.7 | 0.8 | 1.0 | 0.3 | 0.5 | 3.3 | PGMEA | AA |
| Example 106 | 0.6 | 0.7 | 0.9 | 0.3 | 0.4 | 2.9 | PGMEA | AA |
| Example 107 | 0.4 | 0.6 | 0.7 | 0.2 | 0.3 | 2.2 | PGMEA | AA |
| Example 108 | 0.5 | 0.7 | 0.8 | 0.3 | 0.4 | 2.7 | PGMEA | AA |
| Example 109 | 0.5 | 0.6 | 0.8 | 0.3 | 0.4 | 2.6 | PGMEA | AA |
| Example 110 | 0.6 | 0.7 | 0.9 | 0.3 | 0.4 | 2.9 | PGMEA | AA |
| Example 111 | 0.6 | 0.7 | 0.8 | 0.3 | 0.4 | 2.8 | PGMEA | AA |
| Example 112 | 0.5 | 0.6 | 0.8 | 0.3 | 0.4 | 2.6 | PGMEA | AA |
| Example 113 | 0.3 | 0.4 | 0.5 | 0.2 | 0.3 | 1.7 | PGMEA | A |
| Example 114 | 0.3 | 0.4 | 0.5 | 0.2 | 0.3 | 1.7 | PGMEA | A |
| Example 115 | 0.6 | 0.7 | 0.9 | 0.3 | 0.4 | 2.9 | PGMEA | A |
| Example 116 | 0.5 | 0.6 | 0.7 | 0.2 | 0.4 | 2.4 | PGMEA | B |

TABLE 24-continued

| Table 1-4-6 | Elution test (increase in each component in test solvent before and after immersion) Result of elution test for third filter Metal particles (mass ppb) Fe | Na | Ca | Al | K | Total | Substance to be purified Organic solvent | Defect inhibition performance |
|---|---|---|---|---|---|---|---|---|
| Example 117 | 0.3 | 0.4 | 0.5 | 0.2 | 0.3 | 1.7 | PGMEA | A |
| Example 118 | 0.4 | 0.5 | 0.6 | 0.2 | 0.3 | 2.0 | PGMEA | A |
| Example 119 | 0.4 | 0.5 | 0.6 | 0.2 | 0.3 | 2.0 | PGMEA | A |
| Example 120 | 0.5 | 0.6 | 0.7 | 0.2 | 0.4 | 2.4 | PGMEA | A |
| Example 121 | 0.4 | 0.6 | 0.7 | 0.2 | 0.3 | 2.2 | PGMEA | A |
| Example 122 | 0.4 | 0.5 | 0.6 | 0.2 | 0.3 | 2.0 | PGMEA | B |
| Example 123 | 0.2 | 0.3 | 0.4 | 0.1 | 0.2 | 1.2 | PGMEA | B |
| Example 124 | 0.2 | 0.3 | 0.4 | 0.1 | 0.2 | 1.2 | PGMEA | C |
| Example 125 | 0.5 | 0.6 | 0.7 | 0.2 | 0.4 | 2.4 | PGMEA | B |
| Example 126 | 0.4 | 0.5 | 0.6 | 0.2 | 0.3 | 2.0 | PGMEA | B |
| Comparative Example 1 | | | | | | | PGMEA | E |
| Comparative Example 2 | | | | | | | PGMEA | E |
| Comparative Example 3 | | | | | | | PGMEA | E |
| Comparative Example 4 | | | | | | | PGMEA | E |
| Comparative Example 5 | | | | | | | PGMEA | E |
| Comparative Example 6 | | | | | | | PGMEA | E |

As described in Table 1, the chemical liquids purified by the chemical liquid purification methods of Examples 1 to 126 had excellent defect inhibition performance. In contrast, the chemical liquids purified by the chemical liquid purification methods of Comparative Examples 1 to 6 did not have the desired effects.

The chemical liquid obtained by the chemical liquid purification method of Example 1, in which the pore size $X_1$ was 110% to 20,000% of the pore size $X_2$, had higher defect inhibition performance compared to the chemical liquids obtained by the chemical liquid purification methods of Examples 8 and 9.

The chemical liquid obtained by the chemical liquid purification method of Example 1, in which the pore size $X_2$ was 1.0 to 15 nm, had higher defect inhibition performance compared to the chemical liquids obtained by the chemical liquid purification methods of Examples 18 and 19.

The chemical liquid obtained by the chemical liquid purification method of Example 1, in which the pore size $X_1$ was 10 to 200 nm, had higher defect inhibition performance compared to the chemical liquids obtained by the chemical liquid purification methods of Examples 20 and 21.

The chemical liquid obtained by the chemical liquid purification method of Example 1, in which the pressure ratio of the supply pressure $P_1$ to the supply pressure $P_2$ was 5.0% to 1,000% of the pore size ratio of the pore size $X_1$ to the pore size $X_2$, had higher defect inhibition performance compared to the chemical liquids obtained by the chemical liquid purification methods of Examples 22 and 23.

The chemical liquid obtained by the chemical liquid purification method of Example 1, in which the supply pressure $P_2$ was 0.0010 to 0.050 MPa, had higher defect inhibition performance compared to the chemical liquids obtained by the chemical liquid purification methods of Examples 23, 36, 51, and 74.

The chemical liquid obtained by the chemical liquid purification method of Example 1, in which the filter $F_{min}$ was finally used among two or more kinds of filters, had higher defect inhibition performance compared to the chemical liquid obtained by the chemical liquid purification method of Example 27.

The chemical liquid obtained by the chemical liquid purification method of Example 1, in which each of two or more kinds of filters was used once, had higher defect inhibition performance compared to the chemical liquid obtained by the chemical liquid purification method of Example 37.

The chemical liquid obtained by the chemical liquid purification method of Example 1, in which at least one of two or more kinds of filters contains polyfluorocarbon, had higher defect inhibition performance compared to the chemical liquid obtained by the chemical liquid purification method of Example 52.

The chemical liquid obtained by the chemical liquid purification method of Example 1, in which the filter $F_{min}$ contains at least one kind of material selected from the group consisting of a polyolefin, polyamide, polyamide imide, polyester, polysulfone, cellulose, polyfluorocarbon, and derivatives of these, had higher defect inhibition performance compared to the chemical liquid obtained by the chemical liquid purification method of Example 28.

The chemical liquid obtained by the chemical liquid purification method of Example 1, in which the filter $F_{min}$ did not contain fluorine atoms, had higher defect inhibition performance compared to the chemical liquid obtained by the chemical liquid purification method of Example 29.

The chemical liquid obtained by the chemical liquid purification method of Example 1, in which the increase in organic impurities in the test solvent before and after immersion in the elution test was equal to or smaller than 400 mass ppm, had higher defect inhibition performance compared to the chemical liquid obtained by the chemical liquid purification method of Example 17.

The chemical liquid obtained by the chemical liquid purification method of Example 1, in which the increase in the specific metal ions in the test solvent before and after immersion in the elution test was equal to or smaller than 10 mass ppb, had higher defect inhibition performance compared to the chemical liquid obtained by the chemical liquid purification method of Example 14.

The chemical liquid obtained by the chemical liquid purification method of Example 1, in which the increase in the specific metal particles in the test solvent before and after immersion in the elution test was equal to or smaller than 10 mass ppb, had higher defect inhibition performance compared to the chemical liquid obtained by the chemical liquid purification method of Example 15.

Example 1A: Preparation of Resist Composition (Actinic Ray-Sensitive or Radiation-Sensitive Composition)

By mixing the following components together, a resist composition for EUV was prepared.

Resin: A-2, 0.79 g

Acid generator: B-2, 0.18 g

Basic compound: E-1, 0.03 g

Solvent: chemical liquid of Example 88, 75 g

The resin A-2 is a resin constituted with the units represented by the following formulae.

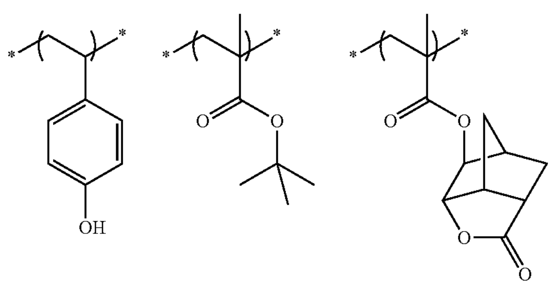

The contents of the units in the resin A-2 is 30:60:10 from left in terms of molar ratio. The weight-average molecular weight thereof is 12,300, and Mw/Mn thereof is 1.51.

The acid generator B-2 is a compound represented by the following formula.

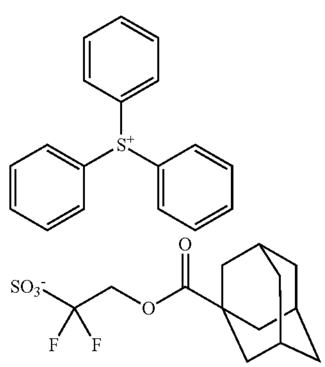

The basic compound E-1 is a compound represented by the following formula.

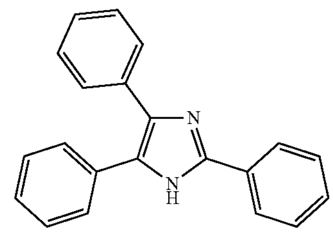 [SMILES: c1ccc(-c2nc(-c3ccccc3)c(-c3ccccc3)[nH]2)cc1]

Examples 2A and 3A: Preparation of Resist Composition

Resist compositions of Example 2A and Example 3A were prepared in the same manner as the manner adopted for preparing the chemical liquid of Example 1A, except that the chemical liquids of Example 1 and Example 48 were used instead of the chemical liquid of Example 1.

[Defect Inhibition Performance of Resist Composition]

The defect inhibition performance of the resist compositions prepared as above was evaluated by the same method as that described above. As a result, the results from the Examples 1A, 2A, and 3A were same as the evaluation results from the chemical liquids of Example 88, Example 50, and Example 1 respectively.

Examples 1B to 3B: Preparation and Evaluation of Color Mosaic Solution

PGMEA contained in the colored radiation-sensitive composition G-1 described in JP2013-015817A was replaced with the chemical liquid of Example 88, thereby preparing a color mosaic solution (resist composition containing a colorant) (Example 1B).

In the same manner as that described above, PGMEA described above was replaced with the chemical liquid of Example 44 and the chemical liquid of Example 1, thereby preparing color mosaic solutions (Examples 2B and 3B).

By the same method as that described above, the defect inhibition performance of the color mosaic solutions of Examples 1B to 3B was evaluated. The results from Examples 1B, 2B, and 3B were the same as the results from Example 82, Example 50, and Example 1 respectively.

Example 1C: Preparation and Evaluation of p-CMP Rinsing Solution (Washing Solution Used after CMP)

The chemical liquid of Example 15 was used as a p-CMP rinsing solution. That is, a substrate having undergone CMP was washed with "Clean 100" manufactured by Wako Pure Chemical Industries, Ltd. and the chemical liquid described above, and the defect inhibition performance of the obtained substrate having undergone washing was evaluated by the same method as that described above. The results from this substrate were the same as the evaluation results from Example 44.

Examples 127 to 136

Chemical liquids were obtained in the same manner as in Example 1, except that in the filtering device shown in FIG. 5, a fourth filter unit was disposed on the secondary side of the third filter unit, and a first filter, a second filter, a third filter, and a fourth filter were accommodated in each of the filter units such that the filters were arranged in this order from the primary side, the supply pressure of a substance to be purified supplied to each of the filters was set as described in Table 2, and a substance to be purified containing an organic solvent described in Table 2 was used. For each of the filters, the elution test was performed. The results are shown in Table 1.

In the above examples, the pipe line of the downstream of the filter unit accommodating the fourth filter was branched such that the substance to be purified could be sent back to the manufacturing tank and subjected to circulation filtration.

The filter unit included in the purification device used for purifying each of the chemical liquids according to examples and comparative examples, whether or not circulation filtration was performed, the washing solution used for washing the filter cartridge, the result of the elution test for each filter, the type of the organic solvent contained in the substance to be purified used, and the results of the evaluation of the defect inhibition performance of the obtained chemical liquid are described in the corresponding lines in 7 tables including Table 2-1-1 to Table 2-1-7.

The meanings of abbreviations in Table 2 are the same as those described above. "Oktolex" means the following.

Oktolex: manufactured by Entegris, Inc., a filter containing UPE as a base material, the surface of the base material contains a resin having a group interacting with ions not generating protons.

TABLE 25

| | Filter unit (first to fourth filter units are arranged in this order from primary side) | | | | | |
|---|---|---|---|---|---|---|
| | First filter unit (accommodating first filter) | | | Second filter unit (accommodating second filter) | | |
| Table 2-1-1 | Material of filter | Supply pressure (MPa) | Pore size (nm) | Material of filter | Supply pressure (MPa) | Pore size (nm) |
| Example 127 | PP | 0.2 | 200 | IEX | 0.1 | 15 |
| Example 128 | PP | 0.2 | 200 | IEX | 0.1 | 15 |
| Example 129 | PP | 0.2 | 200 | IEX | 0.1 | 15 |
| Example 130 | PP | 0.2 | 200 | IEX | 0.1 | 15 |
| Example 131 | PP | 0.2 | 200 | IEX | 0.1 | 15 |
| Example 132 | PP | 0.2 | 200 | Oktolex | 0.1 | 5 |
| Example 133 | PP | 0.2 | 200 | Oktolex | 0.1 | 5 |
| Example 134 | PP | 0.2 | 200 | Oktolex | 0.1 | 5 |
| Example 135 | PP | 0.2 | 200 | Oktolex | 0.1 | 5 |
| Example 136 | PP | 0.2 | 200 | Oktolex | 0.1 | 5 |

TABLE 26

| | Filter unit (first to fourth filter units are arranged in this order from primary side) | | | | | | | | Elution test (increase in each component in test solvent before and after immersion) Result of elution test | |
|---|---|---|---|---|---|---|---|---|---|---|
| | Third filter unit (accommodating third filter) | | | Fourth filter unit (accommodating fourth filter) | | | | | Organic impurities1 | |
| Table 2-1-2 | Material of filter | Supply pressure (MPa) | Pore size (nm) | Material of filter | Supply pressure (MPa) | Pore size (nm) | Circulation | Washing solution | Type | Content (mass ppm) |
| Example 127 | Nylon | 0.04 | 5 | PTFE | 0.015 | 5 | Performed | PGMEA | 1 | 221 |
| Example 128 | Nylon | 0.04 | 5 | PTFE | 0.015 | 5 | Performed | nBA | 1 | 180 |
| Example 129 | Nylon | 0.04 | 5 | PTFE | 0.015 | 5 | Performed | CyHe | 1 | 180 |
| Example 130 | Nylon | 0.04 | 5 | PTFE | 0.015 | 5 | Performed | MIBC | 1 | 280 |
| Example 131 | Nylon | 0.04 | 5 | PTFE | 0.015 | 5 | Performed | IPA | 1 | 242 |
| Example 132 | PTFE | 0.04 | 7 | UPE | 0.015 | 3 | Performed | PGME | 1 | 181 |
| Example 133 | PTFE | 0.04 | 7 | UPE | 0.015 | 3 | Performed | nBA | 1 | 217 |
| Example 134 | PTFE | 0.04 | 7 | UPE | 0.015 | 3 | Performed | CyHe | 1 | 208 |
| Example 135 | PTFE | 0.04 | 7 | UPE | 0.015 | 3 | Performed | MIBC | 1 | 243 |
| Example 136 | PTFE | 0.04 | 7 | UPE | 0.015 | 3 | Performed | IPA | 1 | 225 |

TABLE 27

| | Elution test (increase in each component in test solvent before and after immersion) Result of elution test for first filter | | | | | | | | | | | |
|---|---|---|---|---|---|---|---|---|---|---|---|---|
| | Metal ions (mass ppb) | | | | | | Metal particles (mass ppb) | | | | | |
| Table 2-1-3 | Fe | Na | Ca | Al | K | Total | Fe | Na | Ca | Al | K | Total |
| Example 127 | 1.5 | 1.8 | 2.2 | 0.7 | 1.1 | 7.3 | 0.7 | 0.9 | 1.1 | 0.4 | 0.6 | 3.7 |
| Example 128 | 1.2 | 1.5 | 1.8 | 0.6 | 0.9 | 6.0 | 0.6 | 0.8 | 0.9 | 0.3 | 0.5 | 3.1 |
| Example 129 | 1.2 | 1.5 | 1.8 | 0.6 | 0.9 | 6.0 | 0.6 | 0.8 | 0.9 | 0.3 | 0.5 | 3.1 |
| Example 130 | 1.9 | 2.3 | 2.8 | 0.9 | 1.4 | 9.3 | 0.9 | 1.2 | 1.4 | 0.5 | 0.7 | 4.7 |

TABLE 27-continued

| Table 2-1-3 | Elution test (increase in each component in test solvent before and after immersion) Result of elution test for first filter Metal ions (mass ppb) Fe | Na | Ca | Al | K | Total | Metal particles (mass ppb) Fe | Na | Ca | Al | K | Total |
|---|---|---|---|---|---|---|---|---|---|---|---|---|
| Example 131 | 1.6 | 2.0 | 2.4 | 0.8 | 1.2 | 8.0 | 0.8 | 1.0 | 1.2 | 0.4 | 0.6 | 4.0 |
| Example 132 | 1.2 | 1.5 | 1.8 | 0.6 | 0.9 | 6.0 | 0.6 | 0.8 | 0.9 | 0.3 | 0.5 | 3.1 |
| Example 133 | 1.4 | 1.8 | 2.2 | 0.7 | 1.1 | 7.2 | 0.7 | 0.9 | 1.1 | 0.4 | 0.5 | 3.6 |
| Example 134 | 1.4 | 1.7 | 2.1 | 0.7 | 1.0 | 6.9 | 0.7 | 0.9 | 1.0 | 0.3 | 0.5 | 3.4 |
| Example 135 | 1.6 | 2.0 | 2.4 | 0.8 | 1.2 | 8.0 | 0.8 | 1.0 | 1.2 | 0.4 | 0.6 | 4.0 |
| Example 136 | 1.5 | 1.9 | 2.3 | 0.8 | 1.1 | 7.6 | 0.8 | 0.9 | 1.1 | 0.4 | 0.6 | 3.8 |

TABLE 28

| Table 2-1-4 | Elution test (increase in each component in test solvent before and after immersion) Result of elution test for second filter Organic impurities 1 Type | Content (mass ppm) | Metal ions (mass ppb) Fe | Na | Ca | Al | K | Total |
|---|---|---|---|---|---|---|---|---|
| Example 127 | 1 | 209 | 1.2 | 1.5 | 1.8 | 0.6 | 0.9 | 6.0 |
| Example 128 | 1 | 171 | 1.0 | 1.2 | 1.5 | 0.5 | 0.7 | 4.9 |
| Example 129 | 1 | 171 | 1.0 | 1.2 | 1.5 | 0.5 | 0.7 | 4.9 |
| Example 130 | 1 | 266 | 1.5 | 1.9 | 2.3 | 0.8 | 1.2 | 7.7 |
| Example 131 | 1 | 230 | 1.3 | 1.7 | 2.0 | 0.7 | 1.0 | 6.7 |
| Example 132 | 1 | 172 | 1.0 | 1.3 | 1.5 | 0.5 | 0.8 | 5.1 |
| Example 133 | 1 | 206 | 1.2 | 1.5 | 1.8 | 0.6 | 0.9 | 6.0 |
| Example 134 | 1 | 198 | 1.2 | 1.4 | 1.7 | 0.6 | 0.9 | 5.8 |
| Example 135 | 1 | 231 | 1.3 | 1.7 | 2.0 | 0.7 | 1.0 | 6.7 |
| Example 136 | 1 | 214 | 1.2 | 1.6 | 1.9 | 0.6 | 0.9 | 6.2 |

TABLE 29

| Table 2-1-5 | Elution test (increase in each component in test solvent before and after immersion) Result of elution test for second filter Metal particles (mass ppb) Fe | Na | Ca | Al | K | Total | Result of elution test for third filter Organic impurities 1 Type | Content (ppm) | Metal ions (mass ppb) Fe | Na | Ca | Al | K | Total |
|---|---|---|---|---|---|---|---|---|---|---|---|---|---|---|
| Example 127 | 0.6 | 0.7 | 0.9 | 0.3 | 0.4 | 2.9 | 1 | 199 | 1.0 | 1.3 | 1.5 | 0.5 | 0.8 | 5.1 |
| Example 128 | 0.5 | 0.6 | 0.7 | 0.2 | 0.4 | 2.4 | 1 | 162 | 0.8 | 1.0 | 1.2 | 0.4 | 0.6 | 4.0 |
| Example 129 | 0.5 | 0.6 | 0.7 | 0.2 | 0.4 | 2.4 | 1 | 162 | 0.8 | 1.0 | 1.2 | 0.4 | 0.6 | 4.0 |
| Example 130 | 0.7 | 0.9 | 1.1 | 0.4 | 0.6 | 3.7 | 1 | 253 | 1.3 | 1.6 | 1.9 | 0.6 | 1.0 | 6.4 |
| Example 131 | 0.6 | 0.8 | 1.0 | 0.3 | 0.5 | 3.2 | 1 | 218 | 1.1 | 1.4 | 1.7 | 0.6 | 0.8 | 5.6 |
| Example 132 | 0.5 | 0.6 | 0.7 | 0.2 | 0.4 | 2.4 | 1 | 163 | 0.8 | 1.0 | 1.2 | 0.4 | 0.6 | 4.0 |
| Example 133 | 0.6 | 0.7 | 0.9 | 0.3 | 0.4 | 2.9 | 1 | 196 | 1.0 | 1.2 | 1.5 | 0.5 | 0.7 | 4.9 |
| Example 134 | 0.5 | 0.7 | 0.8 | 0.3 | 0.4 | 2.7 | 1 | 188 | 1.0 | 1.2 | 1.4 | 0.5 | 0.7 | 4.8 |
| Example 135 | 0.6 | 0.8 | 1.0 | 0.3 | 0.5 | 3.2 | 1 | 219 | 1.1 | 1.4 | 1.7 | 0.6 | 0.8 | 5.6 |
| Example 136 | 0.6 | 0.7 | 0.9 | 0.3 | 0.4 | 2.9 | 1 | 203 | 1.0 | 1.3 | 1.6 | 0.5 | 0.8 | 5.2 |

TABLE 30

| Table 2-1-6 | Elution test (increase in each component in test solvent before and after immersion) Result of elution test for third filter Metal particles (mass ppb) Fe | Na | Ca | Al | K | Total | Result of elution test for fourth filter Organic impurities1 Type | Content (ppm) | Metal ions (mass ppb) Fe | Na | Ca | Al | K | Total |
|---|---|---|---|---|---|---|---|---|---|---|---|---|---|---|
| Example 127 | 0.5 | 0.6 | 0.7 | 0.2 | 0.3 | 2.3 | 1 | 189 | 1.3 | 1.5 | 0.5 | 0.8 | 0.6 | 4.7 |
| Example 128 | 0.4 | 0.5 | 0.6 | 0.2 | 0.3 | 2.0 | 1 | 154 | 1.0 | 1.2 | 0.4 | 0.6 | 0.5 | 3.7 |

TABLE 30-continued

| Table 2-1-6 | Elution test (increase in each component in test solvent before and after immersion) Result of elution test for third filter Metal particles (mass ppb) Fe | Na | Ca | Al | K | Total | Result of elution test for fourth filter Type | Organic impurities1 Content (ppm) | Metal ions (mass ppb) Fe | Na | Ca | Al | K | Total |
|---|---|---|---|---|---|---|---|---|---|---|---|---|---|---|
| Example 129 | 0.4 | 0.5 | 0.6 | 0.2 | 0.3 | 2.0 | 1 | 154 | 1.0 | 1.2 | 0.4 | 0.6 | 0.5 | 3.7 |
| Example 130 | 0.6 | 0.7 | 0.9 | 0.3 | 0.4 | 2.9 | 1 | 240 | 1.6 | 1.9 | 0.6 | 1.0 | 0.8 | 5.9 |
| Example 131 | 0.5 | 0.6 | 0.8 | 0.3 | 0.4 | 2.6 | 1 | 208 | 1.4 | 1.7 | 0.6 | 0.8 | 0.7 | 5.2 |
| Example 132 | 0.4 | 0.5 | 0.6 | 0.2 | 0.3 | 2.0 | 1 | 155 | 1.0 | 1.2 | 0.4 | 0.6 | 0.5 | 3.7 |
| Example 133 | 0.5 | 0.6 | 0.7 | 0.2 | 0.3 | 2.3 | 1 | 186 | 1.2 | 1.5 | 0.5 | 0.7 | 0.6 | 4.5 |
| Example 134 | 0.4 | 0.5 | 0.6 | 0.2 | 0.3 | 2.0 | 1 | 178 | 1.2 | 1.4 | 0.5 | 0.7 | 0.6 | 4.4 |
| Example 135 | 0.5 | 0.6 | 0.8 | 0.3 | 0.4 | 2.6 | 1 | 208 | 1.4 | 1.7 | 0.6 | 0.8 | 0.7 | 5.2 |
| Example 136 | 0.5 | 0.6 | 0.7 | 0.2 | 0.4 | 2.4 | 1 | 193 | 1.3 | 1.6 | 0.5 | 0.8 | 0.6 | 4.8 |

TABLE 31

| Table 2-1-7 | Elution test (increase in each component in test solvent before and after immersion) Result of elution test for fourth filter Metal particles (mass ppb) Fe | Na | Ca | Al | K | Total | Substance to be purified Organic solvent | Defect inhibition performance |
|---|---|---|---|---|---|---|---|---|
| Example 127 | 0.5 | 0.6 | 0.7 | 0.2 | 0.3 | 2.3 | PGMEA | AAA |
| Example 128 | 0.4 | 0.5 | 0.6 | 0.2 | 0.3 | 2.0 | nBA | AAA |
| Example 129 | 0.4 | 0.5 | 0.6 | 0.2 | 0.3 | 2.0 | CyHe | AAA |
| Example 130 | 0.6 | 0.7 | 0.9 | 0.3 | 0.4 | 2.9 | MIBC | AAA |
| Example 131 | 0.5 | 0.6 | 0.8 | 0.3 | 0.4 | 2.6 | IPA | AAA |
| Example 132 | 0.4 | 0.5 | 0.6 | 0.2 | 0.3 | 2.0 | PGME | AAA |
| Example 133 | 0.5 | 0.6 | 0.7 | 0.2 | 0.3 | 2.3 | nBA | AAA |
| Example 134 | 0.4 | 0.5 | 0.6 | 0.2 | 0.3 | 2.0 | CyHe | AAA |
| Example 135 | 0.5 | 0.6 | 0.8 | 0.3 | 0.4 | 2.6 | MIBC | AAA |
| Example 136 | 0.5 | 0.6 | 0.7 | 0.2 | 0.4 | 2.4 | IPA | AAA |

EXPLANATION OF REFERENCES

10, 50, 60, 90: purification device
11: manufacturing tank
12(*a*), 12(*b*), 12(*c*), 51(*a*), 51(*b*), 61: filter unit
13: filling device
15(*a*), 15(*b*): adjusting valve
20: filter cartridge
21: filter
22: core
23: cap
24: liquid inlet
31, 71(*a*), 71(*b*): body
32, 72: lid
34, 73: liquid inlet
35, 74: liquid outlet
41, 42, 81, 82: internal pipe line
16, 52, 62, 91: filtering device

What is claimed is:

1. A chemical liquid purification method comprising:

obtaining a chemical liquid by filtering a substance to be purified containing an organic solvent by using three or more kinds of filters having different pore sizes, wherein a supply pressure $P_1$ of the substance to be purified supplied to a filter $F_{max}$ having a maximum pore size $X_1$ among the three or more kinds of filters and a supply pressure $P_2$ of the substance to be purified supplied to a filter $F_{min}$ having a minimum pore size $X_2$ among the three or more kinds of filters satisfy $P_1>P_2$, and wherein a size relationship among the pore sizes of the three or more kinds of filters coincides with a magnitude relationship among the supply pressures of the substance to be purified supplied to each of the three or more kinds of filters.

2. The chemical liquid purification method according to claim 1, wherein the pore size $X_1$ is 110% to 20,000% of the pore size $X_2$.

3. The chemical liquid purification method according to claim 1, wherein the pore size $X_2$ is 1.0 to 15 nm.

4. The chemical liquid purification method according to claim 1, wherein the pore size $X_1$ is 10 to 200 nm.

5. The chemical liquid purification method according to claim 1, wherein a pressure ratio of the supply pressure $P_1$ to the supply pressure $P_2$ is 5.0% to 1,000% of a pore size ratio of the pore size $X_1$ to the pore size $X_2$.

6. The chemical liquid purification method according to claim 1, wherein the supply pressure $P_2$ is 0.0010 to 0.050 MPa.

7. The chemical liquid purification method according to claim 1, wherein among the three or more kinds of filters, the filter $F_{min}$ is a filter that is finally used.

8. The chemical liquid purification method according to claim 1, wherein each of the three or more kinds of filters is used once.

9. The chemical liquid purification method according to claim 1, wherein at least one of the three or more kinds of filters contains polyfluorocarbon.

10. The chemical liquid purification method according to claim 1, wherein at least one of the three or more kinds of filters is a filter having an ion exchange group.

11. The chemical liquid purification method according to claim 1, wherein at least one of the three or more kinds of filters is a filter having a pore size equal to or smaller than 5 nm.

12. The chemical liquid purification method according to claim 1, wherein the filter $F_{min}$ contains at least one kind of material selected from the group consisting of polyolefin, polyamide, polyimide, polyamide imide, polyester, polysulfone, cellulose, polyfluorocarbon, and derivatives of these.

13. The chemical liquid purification method according to claim 1, wherein the filter $F_{min}$ contains fluorine atoms.

14. The chemical liquid purification method according to claim 1, wherein a primary storage tank is disposed between the filter $F_{min}$ and the filter $F_{max}$.

15. The chemical liquid purification method according to claim 1, wherein the substance to be purified is filtered using a filtering device having a pipe line through which the substance to be purified is supplied and the three or more kinds of filters which are disposed in the pipe line and have different pore sizes, and at least one kind of filter among the three or more kinds of filters in the filtering device includes three or more filters that are arranged in parallel.

16. The chemical liquid purification method according to claim 15, wherein the filtering device includes three or more filters arranged in parallel as the filter $F_{min}$.

17. The chemical liquid purification method according to claim 1, wherein at least one of the three or more kinds of filters satisfies a condition 1 or a condition 2 in the following test, test: under a condition that a mass ratio of a mass of the filter to a mass of a test solvent containing the organic solvent in an amount equal to or greater than 99.9% by mass becomes 1.0 in a case where a liquid temperature of the test solvent is 25° C., the filter is immersed for 48 hours in the test solvent having a liquid temperature of 25° C., condition 1: in a case where the test solvent having been used for immersion contains one kind of organic impurities selected from the group consisting of the following Formulae (1) to (7), an increase in a content of one kind of the organic impurities in the test solvent before and after the immersion is equal to or smaller than 400 mass ppm, condition 2: in a case where the test solvent having been used for immersion contains two or more kinds of organic impurities selected from the group consisting of the following Formulae (1) to (7), an increase in a content of each of two or more kinds of the organic impurities in the test solvent before and after the immersion is equal to or smaller than 400 mass ppm (1)

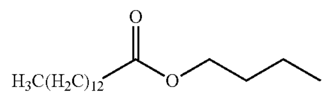

(2)

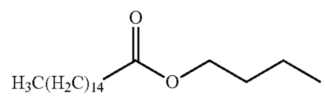

(3)

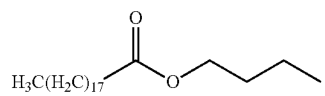

(4)

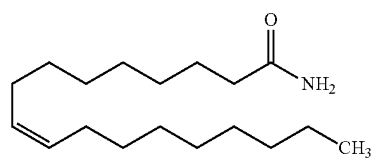

(5)

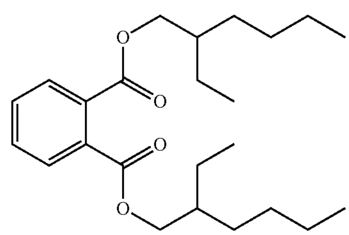

(6)

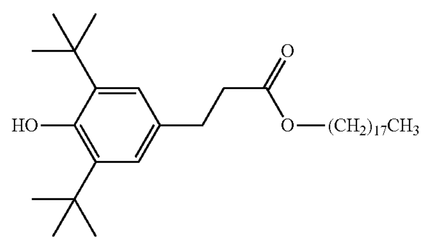

(7)

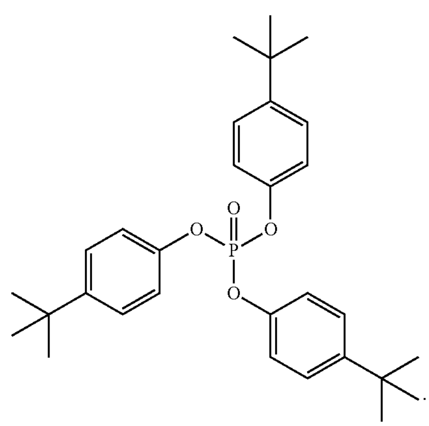

18. The chemical liquid purification method according to claim 1, wherein at least one of the three or more kinds of filters satisfies a condition 3 or a condition 4 in the following test, test: under a condition that a mass ratio of a mass of the filter to a mass of a test solvent containing the organic solvent in an amount equal to or greater than 99.99% by mass becomes 1.0 in a case where a liquid temperature of the test solvent is 25° C., the filter is immersed for 48 hours in the test solvent having a liquid temperature of 25° C., condition 3: in a case where the test solvent having been used for immersion contains metal ions of one kind of metal selected from the group consisting of Fe, Na, Ca, Al, and K, an increase in a content of one kind of the metal ions in the test solvent before and after the immersion is equal to or smaller than 10 mass ppb, condition 4: in a case where the test solvent having been used for immersion contains metal ions of two or more kinds of metals selected from the group consisting of Fe, Na, Ca, Al, and K, an increase in a content of each of two or more kinds of the metal ions in the test solvent before and after the immersion is equal to or smaller than 10 mass ppb.

19. The chemical liquid purification method according to claim 1, wherein a least one of the three or more kinds of filters satisfies a condition 5 or a condition 6 in the following test, test: under a condition that a mass ratio of a mass of the filter to a mass of a test solvent containing the organic solvent in an amount equal to or greater than 99.99% by mass becomes 1.0 in a case where a liquid temperature of the test solvent is 25° C., the filter is immersed for 48 hours in the test solvent having a liquid temperature of 25° C., condition 5: in a case where the test solvent having been used for immersion contains metal particles of one kind of metal selected from the group consisting of Fe, Na, Ca, Al, and K, an increase in a content of one kind of the metal particles in the test solvent before and after the immersion is equal to or smaller than 10 mass ppb, condition 6: in a case where the test solvent having been used for immersion contains metal particles of two or more kinds of metals selected from the group consisting of Fe, Na, Ca, Al, and K, an increase in a content of each of two or more kinds of the metal particles in the test solvent before and after the immersion is equal to or smaller than 10 mass ppb.

20. The chemical liquid purification method according to claim 1, further comprising:

washing at least one of the three or more kinds of filters by using a washing solution before the chemical liquid is obtained by filtering the substance to be purified by using the three or more kinds of filters.

21. A chemical liquid purification method comprising:

obtaining a chemical liquid by filtering a substance to be purified containing an organic solvent by using three or more kinds of filters having different pore sizes, wherein a supply pressure $P_1$ of the substance to be purified supplied to a filter $F_{max}$ having a maximum pore size $X_1$ among the three or more kinds of filters and a supply pressure $P_2$ of the substance to be purified supplied to a filter $F_{min}$ having a minimum pore size $X_2$ among the three or more kinds of filters satisfy $P_1>P_2$, and wherein the pore size of the three or more kinds of filters decreases from the primary side.

22. The chemical liquid purification method according to claim 21, wherein the pore size $X_2$ is 1.0 to 15 nm.

23. The chemical liquid purification method according to claim 21, wherein at least one of the three or more kinds of filters is a filter having an ion exchange group.

24. The chemical liquid purification method according to claim 21, wherein at least one of the three or more kinds of filters is a filter having a pore size equal to or smaller than 5 nm.

25. The chemical liquid purification method according to claim 21, wherein the filter $F_{min}$ contains fluorine atoms.

26. The chemical liquid purification method according to claim 21, wherein at least one of the three or more kinds of filters satisfies a condition 1 or a condition 2 in the following test, test: under a condition that a mass ratio of a mass of the filter to a mass of a test solvent containing the organic solvent in an amount equal to or greater than 99.9% by mass becomes 1.0 in a case where a liquid temperature of the test solvent is 25° C., the filter is immersed for 48 hours in the test solvent having a liquid temperature of 25° C., condition 1: in a case where the test solvent having been used for immersion contains one kind of organic impurities selected from the group consisting of the following Formulae (1) to (7), an increase in a content of one kind of the organic impurities in the test solvent before and after the immersion is equal to or smaller than 400 mass ppm, condition 2: in a case where the test solvent having been used for immersion contains two or more kinds of organic impurities selected from the group consisting of the following Formulae (1) to (7), an increase in a content of each of two or more kinds of the organic impurities in the test solvent before and after the immersion is equal to or smaller than 400 mass ppm (1)

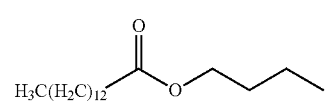

(2)

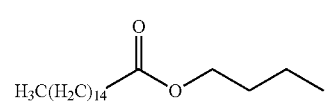

(3)

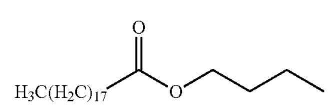

(4)

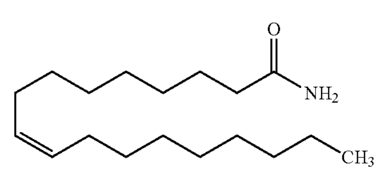

-continued (5)

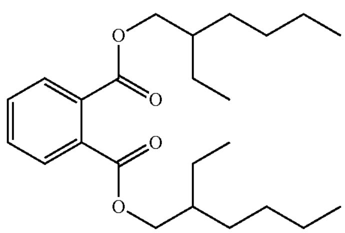

(6)

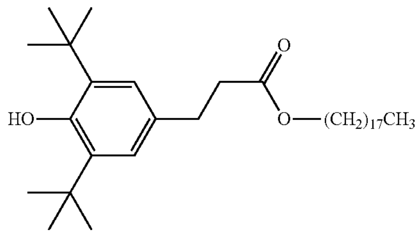

(7)

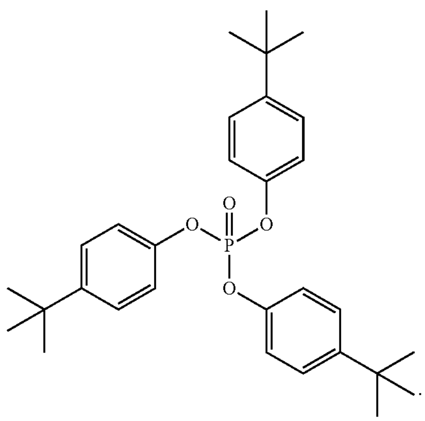

27. The chemical liquid purification method according to claim 21, wherein at least one of the three or more kinds of filters satisfies a condition 3 or a condition 4 in the following test, test: under a condition that a mass ratio of a mass of the filter to a mass of a test solvent containing the organic solvent in an amount equal to or greater than 99.99% by mass becomes 1.0 in a case where a liquid temperature of the test solvent is 25° C., the filter is immersed for 48 hours in the test solvent having a liquid temperature of 25° C., condition 3: in a case where the test solvent having been used for immersion contains metal ions of one kind of metal selected from the group consisting of Fe, Na, Ca, Al, and K, an increase in a content of one kind of the metal ions in the test solvent before and after the immersion is equal to or smaller than 10 mass ppb, condition 4: in a case where the test solvent having been used for immersion contains metal ions of two or more kinds of metals selected from the group consisting of Fe, Na, Ca, Al, and K, an increase in a content of each of two or more kinds of the metal ions in the test solvent before and after the immersion is equal to or smaller than 10 mass ppb.

28. The chemical liquid purification method according to claim 21, wherein a least one of the three or more kinds of filters satisfies a condition 5 or a condition 6 in the following test, test: under a condition that a mass ratio of a mass of the filter to a mass of a test solvent containing the organic solvent in an amount equal to or greater than 99.99% by mass becomes 1.0 in a case where a liquid temperature of the test solvent is 25° C., the filter is immersed for 48 hours in the test solvent having a liquid temperature of 25° C., condition 5: in a case where the test solvent having been used for immersion contains metal particles of one kind of metal selected from the group consisting of Fe, Na, Ca, Al, and K, an increase in a content of one kind of the metal particles in the test solvent before and after the immersion is equal to or smaller than 10 mass ppb, condition 6: in a case where the test solvent having been used for immersion contains metal particles of two or more kinds of metals selected from the group consisting of Fe, Na, Ca, Al, and K, an increase in a content of each of two or more kinds of the metal particles in the test solvent before and after the immersion is equal to or smaller than 10 mass ppb.

29. The chemical liquid purification method according to claim 21, further comprising:

washing at least one of the three or more kinds of filters by using a washing solution before the chemical liquid is obtained by filtering the substance to be purified by using the three or more kinds of filters.

30. A chemical liquid purification method comprising:

obtaining a chemical liquid by filtering a substance to be purified containing an organic solvent by using two or more kinds of filters having different pore sizes, wherein a supply pressure $P_1$ of the substance to be purified supplied to a filter $F_{max}$ having a maximum pore size $X_1$ among the two or more kinds of filters and a supply pressure $P_2$ of the substance to be purified supplied to a filter $F_{min}$ having a minimum pore size $X_2$ among the two or more kinds of filters satisfy $P_1>P_2$, wherein the content of the organic solvent in the substance to be purified is equal to or greater than 99.0% by mass with respect to the total mass of the chemical liquid, and wherein the two or more kinds of filters consist of one kind of material selected from the group consisting of polyolefin, polyamide, polyimide, polyamide imide, polyester, polysulfone, cellulose, polyfluorocarbon, and derivatives of these.

31. The chemical liquid purification method according to claim 30, wherein the pore size $X_2$ is 1.0 to 15 nm.

32. The chemical liquid purification method according to claim 30, wherein at least one of the two or more kinds of filters is a filter having an ion exchange group.

33. The chemical liquid purification method according to claim 30, wherein at least one of the two or more kinds of filters is a filter having a pore size equal to or smaller than 5 nm.

34. The chemical liquid purification method according to claim 30, wherein the filter $F_{min}$ contains fluorine atoms.

35. The chemical liquid purification method according to claim 30, wherein at least one of the two or more kinds of filters satisfies a condition 1 or a condition 2 in the following test, test: under a condition that a mass ratio of a mass of the filter to a mass of a test solvent containing the organic solvent in an amount equal to or greater than 99.9% by mass becomes 1.0 in a case where a liquid temperature of the test solvent is 25° C., the filter is immersed for 48 hours in the test solvent having a liquid temperature of 25° C., condition 1: in a case where the test solvent having been used for immersion contains one kind of organic impurities selected from the group consisting of the following Formulae (1) to (7), an increase in a content of one kind of the organic impurities in the test solvent before and after the immersion is equal to or smaller than 400 mass ppm, condition 2: in a case where the test solvent having been used for immersion contains two or more kinds of organic impurities selected from the group consisting of the following Formulae (1) to (7), an increase in a content of each of two or more kinds of the organic impurities in the test solvent before and after the immersion is equal to or smaller than 400 mass ppm (1)

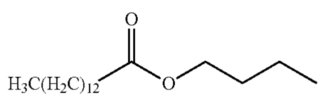

(2)

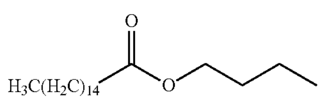

(3)

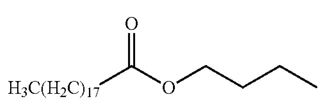

(4)

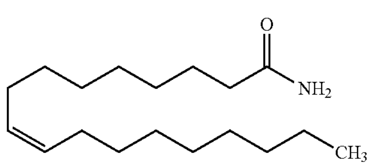

(5)

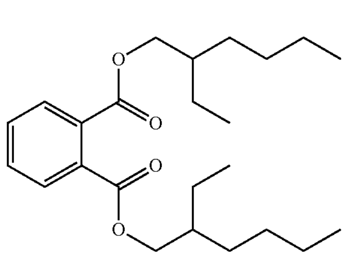

(6)

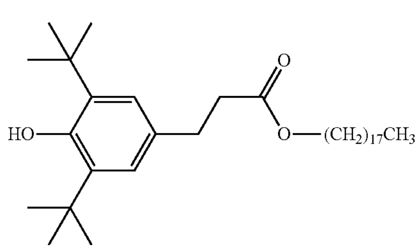

-continued (7)

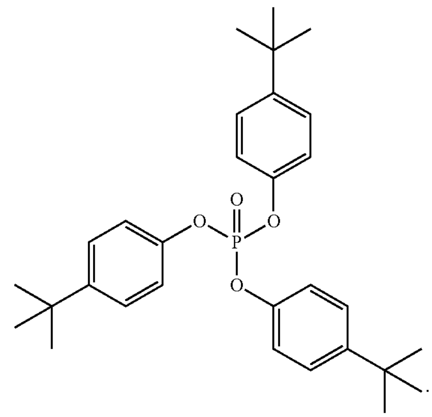

36. The chemical liquid purification method according to claim 30, wherein at least one of the two or more kinds of filters satisfies a condition 3 or a condition 4 in the following test, test: under a condition that a mass ratio of a mass of the filter to a mass of a test solvent containing the organic solvent in an amount equal to or greater than 99.99% by mass becomes 1.0 in a case where a liquid temperature of the test solvent is 25° C., the filter is immersed for 48 hours in the test solvent having a liquid temperature of 25° C., condition 3: in a case where the test solvent having been used for immersion contains metal ions of one kind of metal selected from the group consisting of Fe, Na, Ca, Al, and K, an increase in a content of one kind of the metal ions in the test solvent before and after the immersion is equal to or smaller than 10 mass ppb, condition 4: in a case where the test solvent having been used for immersion contains metal ions of two or more kinds of metals selected from the group consisting of Fe, Na, Ca, Al, and K, an increase in a content of each of two or more kinds of the metal ions in the test solvent before and after the immersion is equal to or smaller than 10 mass ppb.

37. The chemical liquid purification method according to claim 30, wherein a least one of the two or more kinds of filters satisfies a condition 5 or a condition 6 in the following test, test: under a condition that a mass ratio of a mass of the filter to a mass of a test solvent containing the organic solvent in an amount equal to or greater than 99.99% by mass becomes 1.0 in a case where a liquid temperature of the test solvent is 25° C., the filter is immersed for 48 hours in the test solvent having a liquid temperature of 25° C., condition 5: in a case where the test solvent having been used for immersion contains metal particles of one kind of metal selected from the group consisting of Fe, Na, Ca, Al, and K, an increase in a content of one kind of the metal particles in the test solvent before and after the immersion is equal to or smaller than 10 mass ppb, condition 6: in a case where the test solvent having been used for immersion contains metal particles of two or more kinds of metals selected from the group consisting of Fe, Na, Ca, Al, and K, an increase in a content of each of two or more kinds of the metal particles in the test solvent before and after the immersion is equal to or smaller than 10 mass ppb.

38. The chemical liquid purification method according to claim 30, further comprising:

washing at least one of the two or more kinds of filters by using a washing solution before the chemical liquid is obtained by filtering the substance to be purified by using the two or more kinds of filters.

* * * * *